United States Patent
Masuda et al.

(10) Patent No.: US 7,864,095 B2
(45) Date of Patent: Jan. 4, 2011

(54) WAVE ABSORBER AND MANUFACTURING METHOD OF WAVE ABSORBER

(75) Inventors: Yoshiyuki Masuda, Tokyo (JP); Noboru Otani, Tokyo (JP); Hisamatsu Nakano, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 980 days.

(21) Appl. No.: 10/598,345

(22) PCT Filed: Feb. 25, 2005

(86) PCT No.: PCT/JP2005/003194

§ 371 (c)(1),
(2), (4) Date: Aug. 24, 2006

(87) PCT Pub. No.: WO2005/084097

PCT Pub. Date: Sep. 9, 2005

(65) Prior Publication Data

US 2008/0212304 A1    Sep. 4, 2008

(30) Foreign Application Priority Data

Feb. 27, 2004 (JP) .............................. 2004-055051
Sep. 13, 2004 (JP) .............................. 2004-265233
Dec. 22, 2004 (JP) .............................. 2004-371225

(51) Int. Cl.
*H01Q 17/00* (2006.01)

(52) U.S. Cl. .......................................... 342/1

(58) Field of Classification Search .................. 342/1–4
See application file for complete search history.

(56) References Cited

U.S. PATENT DOCUMENTS 4,621,012 A * 11/1986 Pusch .......................... 442/228

(Continued)

FOREIGN PATENT DOCUMENTS

GB    2336472 A    10/1999

(Continued)

OTHER PUBLICATIONS

International Searching Authority/Japan, Search Report and and Written Opinion in Application No. PCT/JP2005/003194, May 24, 2005, 15 pages.

(Continued)

*Primary Examiner*—Thomas H Tarcza
*Assistant Examiner*—Timothy A Brainard
(74) *Attorney, Agent, or Firm*—Wood, Herron & Evans, LLP

(57) ABSTRACT

The problem of the present invention is to offer a wave absorber that has reflection attenuation capability sufficient to enable prevention of communication disturbances due to reflection and the like of EM waves, that enables greater thinness and lighter weight, and that has wide-band attenuation properties, as well as a manufacturing method of the wave absorber. The wave absorber of the present invention has a structure which sequentially laminates a grid-like conductor layer composed of an electric conductor, a first dielectric layer, a high-resistance conductor layer having a surface resistivity within a prescribed range, a second dielectric layer, and a pattern layer having multiple patterns composed of an electric conductor, wherein each pattern in said pattern layer differs in either or both of size and form relative to another adjacent pattern.

48 Claims, 31 Drawing Sheets

U.S. PATENT DOCUMENTS

| | | | | |
|---|---|---|---|---|
| 4,726,980 | A * | 2/1988 | Ishikawa et al. | 428/212 |
| 4,948,922 | A | 8/1990 | Varadan et al. | |
| 5,214,432 | A * | 5/1993 | Kasevich et al. | 342/3 |
| 5,358,787 | A | 10/1994 | Fontana et al. | |
| 5,455,116 | A | 10/1995 | Nagano et al. | |
| 5,561,428 | A | 10/1996 | Czaja et al. | |
| 5,576,710 | A * | 11/1996 | Broderick et al. | 342/1 |
| 5,812,080 | A * | 9/1998 | Takahashi | 342/4 |
| 5,961,893 | A * | 10/1999 | Honda et al. | 252/587 |
| 6,207,003 | B1 | 3/2001 | McClure et al. | |
| 6,657,005 | B1 * | 12/2003 | Nishihata et al. | 525/64 |
| 2003/0011306 | A1 * | 1/2003 | Bechtel et al. | 313/509 |
| 2003/0044623 | A1 * | 3/2003 | Sakurai et al. | 428/447 |
| 2003/0107025 | A1 * | 6/2003 | Okayama et al. | 252/500 |
| 2004/0021597 | A1 * | 2/2004 | Dvorak et al. | 342/1 |
| 2004/0094750 | A1 * | 5/2004 | Widagdo et al. | 252/500 |
| 2004/0160486 | A1 * | 8/2004 | Kim | 347/58 |
| 2004/0189612 | A1 * | 9/2004 | Bottari et al. | 345/173 |
| 2005/0001780 | A1 | 1/2005 | Aisenbrey | |
| 2007/0183066 | A1 * | 8/2007 | Varaprasad et al. | 359/844 |

FOREIGN PATENT DOCUMENTS

| | | |
|---|---|---|
| JP | 05335832 | 12/1993 |
| JP | 06045782 | 2/1994 |
| JP | 6085532 | 3/1994 |
| JP | 06-244583 | 9/1994 |
| JP | 10051180 | 2/1998 |
| JP | 11-163585 | 6/1999 |
| JP | 11-330775 | 11/1999 |
| JP | 2000-68677 | 3/2000 |
| JP | 2001308584 | 11/2001 |
| JP | 2001-339192 | 12/2001 |
| JP | 2001352191 | 12/2001 |
| JP | 2002076670 | 3/2002 |
| JP | 2002-246786 | 8/2002 |
| JP | 2002314284 | 10/2002 |
| JP | 2002-368479 | 12/2002 |
| JP | 2003069278 | 3/2003 |
| JP | 2003209388 | 7/2003 |
| JP | 2003243876 | 8/2003 |
| JP | 2003258483 | 9/2003 |
| JP | 2004-063719 | 2/2004 |
| JP | 2004-356325 | 12/2004 |
| JP | 2005-079247 | 3/2005 |
| WO | 94/24724 A1 | 10/1994 |
| WO | 98/31072 A1 | 7/1998 |
| WO | 2004009352 A1 | 1/2004 |

OTHER PUBLICATIONS

European Patent Office, Supplementary European Search Report in Application No. PCT/JP2005/003194 dated Sep. 4, 2007.

European Patent Office, European Search Report in corresponding EP Application Serial No. 09157555.5-1248 issued Sep. 23, 2009 10 pages.

Japanese Patent Office, Office Action in counterpart JP Application Serial No. 2004-258182 issued on Jul. 14, 2009, 9 pages.

European Patent Office, Partial European Search Report in Application No. PCT/JP2005/015865 dated Aug. 29, 2007.

International Searching Authority Search Report in Application No. PCT/JP05/015865 dated Nov. 30, 2005.

U.S. Patent and Trademark Office, Non-Final Office Action received in related U.S. Appl. No. 11/574,701 dated Oct. 16, 2008, 19 pages.

U.S. Patent and Trademark Office, Final Office Action received in related U.S. Appl. No. 11/574,701 dated Apr. 8, 2009, 9 pages.

U.S. Patent and Trademark Office, Non-Final Office Action received in related U.S. Appl. No. 11/574,701 dated Jul. 24, 2009, 19 pages.

Japanese Patent Office, Office Action in counterpart JP Application Serial No. 2004-265233 issued on Jul. 14, 2009, 12 pages.

Japanese Patent Office, Notice of Allowance in counterpart JP Application Serial No. 2004-371225 issued on Aug. 18, 2009, 6 pages.

Chinese Patent Office, Chinese Office Action in counterpart CN Application Serial No. 200580005924.X issued Jan. 8, 2010, 12 pages.

* cited by examiner

WAVE ABSORBER AND MANUFACTURING METHOD OF WAVE ABSORBER

BACKGROUND OF THE INVENTION

1. Field of the Invention

The present invention relates to a wave absorber and a wave absorber manufacturing method. In addition, the present invention relates to a wave absorber that enables prevention of communication disturbances from reflection and the like of electromagnetic (EM) waves and that enables a thinner and more lightweight product, and to a wave absorber manufacturing method.

This application claims priority from Japanese Patent Application No. 2004-55051 filed on Feb. 27, 2004, Japanese Patent Application No. 2004-265233 filed on Sep. 13, 2004, and Japanese Patent Application No. 2004-371225 filed on Dec. 22, 2004, the contents of which are incorporated herein by reference.

2. Description of Related Art

Due to the development of cell phones, wireless LAN (Local Area Networks), ITS (Intelligent Transport Systems) and the like in recent years, it has become necessary to protect communicated information and to prevent crosstalk and misdirected communications. In the case where protection of communicated information is the primary objective, interception of indoor and outdoor waves is conducted by EM-wave shielding material in order to shield incoming waves and to shield waves emitted from the communications equipment itself. In this case, however, the waves emitted from the communications equipment itself remain in the room due to reflection, causing deterioration in the quality of communication due to the interference of reflected waves with the desired waves for communication. In order to prevent such deterioration in communication quality as well as communication disturbances such as crosstalk and misdirected communications, wave absorbers that absorb waves and convert them to heat are used.

Such wave absorbers use material that is generally capable of converting wave energy to heat and consuming it, and this may be material capable of magnetic loss, dielectric loss and ohm loss. As a wave absorber, a product has been conceived where magnetic powder such as ferrite or soft magnetic metal is mixed and dispersed in an insulating matrix such as rubber or plastic, and molded and processed into sheet form or block form (e.g., see Patent Literature 1).

In addition, as a wave absorber, a product has been conceived where polyurethane foam or the like is impregnated with dielectric loss powder such as carbon black, and processed into pyramid form or wedge form (e.g., see Patent Literature 2).

In addition, as a wave absorber, a product referred to as the λ/4 type has been conceived where resistance film approximately equal to 377Ω, which is the characteristic impedance of free space, is installed at a position that is distant by λ/4 (λ: wavelength of waves at a specific frequency) from a reflector (e.g., see Patent Literature 3).

In addition, wave absorbers have also been conceived where greater thinness and lighter weight are sought by forming periodic conductive patterns on an absorber surface (e.g., see Patent Literature 4), and further where greater thinness, lighter weight and improved absorption properties from oblique directions are sought by forming periodic conducting loops on an absorber surface (e.g., see Patent Literature 5).

Patent Literature 1: Japanese Unexamined Patent Application, First Publication No. 2001-308584

Patent Literature 2: Japanese Unexamined Patent Application, First Publication No. H10-051180

Patent Literature 3: Japanese Unexamined Patent Application, First Publication No. H05-335832

Patent Literature 4: Japanese Patent, Publication No. 3209453

Patent Literature 5: Japanese Unexamined Patent Application, First Publication No. 2001-352191

SUMMARY OF THE INVENTION

However, with respect to wave absorbers where magnetic powder such as ferrite or soft magnetic metal is mixed and dispersed in an insulating matrix such as rubber or plastic, and molded and processed as recorded in Patent Literature 1, it is possible to form a relatively thin absorber, but there are the drawbacks that a more thickness is necessary when high-performance wave absorption is required, and that weight increases due to use of material of high specific gravity.

Next, with respect to wave absorbers where polyurethane foam or the like is impregnated with dielectric loss powder such as carbon black, and processed as recorded in Patent Literature 2, there is the drawback that it is necessary to have arrangement in pyramid form or wedge form, or to have considerable thickness in the absorption direction in order to obtain the desired performance, because absorption performance is basically dependent on thickness.

In addition, with respect to wave absorbers referred to as λ/4 type where resistance film with a value close to 377Ω, which is the characteristic impedance of free space, is installed at a position that is distant by λ/4 from the reflector as recorded in Patent Literature 3, it is possible to manufacture a transparent wave absorber by using optically transparent resistance film. However, with the wave absorber recorded in Patent Literature 3, there are the drawbacks that a thickness of λ/4 at a specific frequency is in principle required, and that absorption properties fluctuate depending on the incident angle of the waves.

Furthermore, as a lighter and thinner wave absorber than these conventional ones, Patent Literature 4 records a wave absorber that is composed of periodic conducting loops, as well as an intermediate resin layer containing loss material and conductive reflection layer. However, with the wave absorber recorded in Patent Literature 4, as with the λ/4 type, there is the drawback that absorption properties (frequency) fluctuate depending on the incident angle of the waves.

Furthermore, as a lighter and thinner wave absorber than these conventional ones, Patent Literature 5 records a wave absorber that is composed of periodic conducting loops, an intermediate resin layer and a conductive reflection layer, and that has a thickness that is 0.027 times or more the wavelength of the waves to be absorbed. However, with respect to wave absorbers with a structure where patterns of a single size are periodically arranged as recorded in Patent Literature 5, while fluctuation in the absorption properties (frequency) depending on the incident angle of the waves is suppressed, there is the drawback that the frequency band is limited, that the properties pertain to an extremely narrow band, and that properties fluctuate at the time of manufacture.

The present invention was made in order to solve these problems of the conventional technology, and its object is to offer a wave absorber that has reflection attenuation capability sufficient to enable prevention of communication disturbances due to reflection and the like of EM waves, that enables greater thinness and lighter weight, and that has little fluctuation of properties depending on the incident angle of the waves, as well as a manufacturing method of the wave absorber.

In order to solve the aforementioned problems, the wave absorber of the present invention has a structure that sequentially laminates a conductor layer (11), a first dielectric layer (12), a high-resistance conductor layer (13) having a surface resistivity (sheet resistivity) within a prescribed range, a second dielectric layer (14, 15), and a pattern layer (16) composed of multiple conducting (loop) patterns, wherein each pattern in said pattern layer (16) differs in either or both of size and form relative to another adjacent pattern.

According to the wave absorber of the present invention, as the patterns of the pattern layer (16) function as antenna, and as each pattern differs in size or shape, waves can be received in a wide band. Leakage of EM waves to the dielectric layers (12, 14 and 15) occurs during reception, and the EM waves can be converted to heat and consumed by the high-resistance conductor layer (13), which is a resistance loss layer, provided between the first dielectric layer (12) and the second dielectric layer (14, 15). Accordingly, the wave absorber of the present invention is able to obtain heretofore non-existent wide-band reflection attenuation performance while being lightweight and thin.

In addition, with the wave absorber of the present invention, the patterns in said pattern layer (16) consist of loop patterns given a loop form; said loop patterns consist of conductors with a shape having a line width that is 5 percent to 25 percent relative to the center line length (C1, C2, C3) which is the length of the center line of the pertinent loop pattern; the center line lengths (C1, C2, C3) of said loop patterns are lengths that are from 60 percent to 140 percent of the effective wavelength ($\lambda$g. see Formula 1) of the EM waves that are the object of absorption; and any one loop pattern in said pattern layer (16) and another loop pattern adjacent to the pertinent loop pattern differ in said center line lengths (C1, C2, C3).

According to the wave absorber of the present invention, the frequency band of the waves received by the loop patterns can be conformed to the waves that are the object of absorption, and wide-band reflection attenuation properties can be obtained. Accordingly, according to the wave absorber of the present invention, communication disturbances and the like due to reflection of EM waves can be effectively prevented.

$$\lambda g = \lambda_0 \times \sqrt{(2/(\epsilon_r+1))} \quad \text{Formula 1}$$

($\lambda_0$: Free Space Wavelength, $\epsilon_r$: Relative Dielectric Constant of Substrate)

In addition, with the wave absorber of the present invention, the center line lengths (C1, C2, C3) of said loop patterns are lengths that are from 60 percent to 140 percent of the effective wavelength ($\lambda$g) of the EM waves that are the object of absorption; and any one loop pattern in said pattern layer (16) and another loop pattern adjacent to the pertinent loop pattern differ in form.

According to the wave absorber of the present invention, by means of a configuration that forms loop pattern aggregates of differing size or shape, it is possible to obtain wide-band reflection attenuation properties with a lightweight and thin structure. Here, each loop pattern may be a closed loop, or it may be an open loop with an excised part. With respect to the form of each loop pattern, a form of one's choice may be applied such as circular, square or polygonal shapes.

In addition, with the wave absorber of the present invention, at least one of said loop patterns in said pattern layer (16) has a form where an open stub (e.g., a linear pattern) is provided on a portion of the lines in loop form.

According to the wave absorber of the present invention, by adjusting the size, form, or disposition of said p open stub (e.g., linear pattern), a frequency (wavelength) and bandwidth with high reflection attenuation properties can be conveniently adjusted, and a high-performance wave absorber capable of effectively absorbing the EM waves that are the object of absorption can be conveniently offered.

In addition, with the wave absorber of the present invention, the loop patterns in said pattern layer (16) are such that an aggregate of multiple loop patterns of differing form or size constitutes one unit, and the space between the pertinent units is disposed at a prescribed interval.

According to the wave absorber of the present invention, it is possible to conveniently realize a large size wave absorber that enables obtainment of wideband reflection attenuation properties and that is lightweight and thin.

In addition, the wave absorber of the present invention has a configuration where a protective layer (17) is laminated onto at least one of the surface sides of said conductor layer (11) and pattern layer (16).

According to the wave absorber of the present invention, the protective layer (17) can prevent conductivity variation (e.g., oxidation) of the conductor (e.g., metal) in the conductor layer (11) or pattern layer (16). Accordingly, it is possible to offer a wave absorber with a long life.

In addition, with the wave absorber of the present invention, the surface resistivity of said high-resistance conductor layer (13) is in a range from 100 $\Omega/\square$ to 100 k$\Omega/\square$.

According to the wave absorber of the present invention, it is possible to increase the action of converting EM waves to heat and consuming them, and to increase reflection attenuation ability while pursuing lower weight and greater thinness.

In addition, with the wave absorber of the present invention, the ratio of the thicknesses of said first dielectric layer (12) and second dielectric layer (14, 15) is in a range from 0.1 to 10.

According to the wave absorber of the present invention, it is possible to increase the action of converting EM waves to heat and consuming them, and to increase reflection attenuation ability while pursuing lower weight and greater thinness.

In addition, with the wave absorber of the present invention, said conductor layer (11) is a low-resistance conductor layer with a surface resistivity (sheet resistivity) of 10 $\Omega/\square$ or less. As the material of said low-resistance conductor, conductive oxides such as ITO (indium tin oxide) may be used, and it may be formed from conductive paste containing metallic micro-particles.

In addition, with the wave absorber of the present invention, said conductor layer (11) is a grid-like conductor layer configured from a grid-like pattern. Here, it is preferable that the line width of said grid-like conductor layer be 100 μm, and that the line center interval be 1/16 or less of the effective wavelength ($\lambda$g) of the EM waves that are the object of absorption.

In addition, with the wave absorber of the present invention, the conductors used in said conductor layer (11), high-resistance conductor layer (13) and pattern layer (16) are composed of optically transparent conductive material (such as conductive oxide or conductive organic compounds), and said first and second dielectric layer and protective layer are composed of optically transparent dielectric material. Here, with respect to said conductor layer (11), a transparent conductive oxide such as ITO (indium tin oxide) may be used, and an opaque conductor (such as metal) may be used in the case where a grid-like conductor layer is used where line width is 100 μm or less, and the line center interval is 1/16 or less of the effective wavelength (λg) of the EM waves that are the object of absorption.

According to the wave absorber of the present invention, it is possible to offer a transparent wave absorber that is thinner than the conventional λ/4 type transparent wave absorbers.

In addition, with the wave absorber of the present invention, at least one layer among said high-resistance conductor layer (13), first dielectric layer (12) and second dielectric layer (14, 15) is composed of dielectric material containing conductive oxide. Here, as said conductive oxide, it is preferable to have dielectric material containing ATO (antimony tin oxide) which less expensive than ITO (indium tin oxide). According to the wave absorber of the present invention, reflection attenuation performance can be raised higher than with conventional λ/4 type transparent wave absorbers while also increasing thinness.

In addition, with the wave absorber of the present invention, at least one layer among said high-resistance conductor layer (13), first dielectric layer (12) and second dielectric layer (14, 15) is composed of dielectric material containing conductive carbon powder.

According to the wave absorber of the present invention, dielectric material containing conductive carbon powder can more effectively function as loss material with respect to EM waves received by the pattern layer (5), and it is possible to increase the amount of reflection attenuation more inexpensively than with conductive oxide, and to realize lower weight by increasing thinness.

In addition, with the wave absorber of the present invention, at least one layer among said high-resistance conductor layer (13), first dielectric layer (12) and second dielectric layer (14, 15) is composed of dielectric foam material containing conductive carbon powder. Here, it is possible to apply dielectric foam material only to said high-resistance conductor layer (13), and to use the first dielectric layer (13) and second dielectric layer (14, 15) as support layers. According to the wave absorber of the present invention, it is possible to increase the amount of reflection attenuation, and to realize even lower weight.

In addition, with the wave absorber of the present invention, at least one layer among said high-resistance conductor layer (13), first dielectric layer (12) and second dielectric layer (14, 15) is composed of dielectric material containing conductive carbon powder, where carbon powder content differs among the pertinent high-resistance conductor layer (13), first dielectric layer (12) and second dielectric layer (14, 15). According to the wave absorber of the present invention, it is possible to increase the amount of reflection attenuation, and to realize lower weight by further increasing thinness.

In order to solve the aforementioned problems, the wave absorber of the present invention includes at least a conductor layer (2011), a first dielectric layer (2012) composed of dielectric material in one layer or multiple layers, a linear pattern resistance layer (2013) having linear patterns composed of a high-resistance conductor which is a conductor having a higher resistivity than said conductor layer, a second dielectric layer (2014, 2015) composed of dielectric material in one layer or multiple layers, and a pattern layer (2016) having multiple patterns composed of a conductor.

According to the wave absorber of the present invention, the patterns of the pattern layer function as antenna to receive EM waves, and leakage of EM waves to the second dielectric layer occurs during reception. These leaked EM waves are converted to heat and consumed by the linear pattern resistance layer, which is composed of a high-resistance conductor provided between the first dielectric layer and the second dielectric layer. In addition, even if EM waves have once passed through the pattern layer, EM waves that transit the pattern layer, second dielectric layer, linear pattern resistance layer and first dielectric layer are thereafter fully reflected by the conductor layer, received by the pattern layer, and converted to heat and consumed by the linear pattern resistance layer. By these means, the wave absorber of the present invention is able to absorb and consume waves. Accordingly, the present invention is able to offer a wave absorber that possesses reflection attenuation capability sufficient to enable prevention of communication disturbances due to reflection and the like of EM waves, that enables greater thinness and lower weight, and that has little fluctuation in properties depending on the incident angle of the waves.

In addition, with the wave absorber of the present invention, said conductor layer (2011), said first dielectric layer (2012), said linear pattern resistance layer (2013), said second dielectric layer (2014, 2015), and said pattern layer (2016) are laminated in the pertinent order.

According to the wave absorber of the present invention, it is possible to satisfactorily receive EM waves by the pattern layer, which is the outermost layer. As the pattern layer contacts the second dielectric layer, it is possible to magnify the leakage to the second dielectric layer of EM waves received by the pattern layer. Moreover, as the second dielectric layer contacts the linear pattern layer, it is possible for the EM waves leaked to the second dielectric layer to be efficiently converted to heat by the linear pattern layer. Accordingly, as the wave absorber of the present invention can efficiently absorb EM waves, it is able to offer a wave absorber that possesses reflection attenuation capability sufficient to enable prevention of communication disturbances due to reflection and the like of EM waves, that enables greater thinness and lower weight, and that has little fluctuation in properties depending on the incident angle of the waves.

In addition, with the wave absorber of the present invention, said conductor layer (2031), said first dielectric layer (2032, 2033), said pattern layer (2034), said second dielectric layer (2035), and said linear pattern resistance layer (2036) are laminated in the pertinent order.

According to the wave absorber of the present invention, the patterns of the pattern layer function as antenna to receive EM waves, and, during reception thereof, the linear pattern resistance layer that contacts the pattern layer via the second dielectric layer is able to convert to heat and consume the EM waves.

In addition, the wave absorber of the present invention has a structure where at least a grid-like conductor layer (2041) formed into a grid by patterns composed of a conductor, a first dielectric layer (2042) composed of dielectric material in one layer or multiple layers, a linear pattern resistance layer (2043) having linear patterns composed of a high-resistance conductor which is a conductor with a higher resistivity than the conductor that forms said grid-like conductor layer, a second dielectric layer (2044) composed of dielectric material in one layer or multiple layers, and a pattern layer (2045) having multiple patterns composed of a conductor are laminated in the pertinent order.

According to the wave absorber of the present invention, the waves can be entirely reflected or the like at the grid-like conductor layer. Thereupon, even if there are EM waves that could not be received by the pattern layer, EM waves that transit the pattern layer, second dielectric layer, linear pattern resistance layer and first dielectric layer are thereafter fully reflected by the grid-like conductor layer, received by the pattern layer, and converted to heat and consumed by the linear pattern resistance layer. By these means, the wave absorber of the present invention is able to absorb and consume EM waves. Accordingly, the present invention is able to offer a wave absorber that possesses reflection attenuation capability sufficient to enable prevention of communication disturbances due to reflection and the like of EM waves, and that enables greater thinness and lower weight.

In addition, with the wave absorber of the present invention, said linear pattern resistance layer is configured either by having linear patterns composed of a high-resistance conductor intersect, or by forming said linear patterns into a hexagonal honeycomb shape.

According to the present invention, a linear pattern resistance layer can be configured by, for example, having linear patterns composed of a high-resistance conductor intersect to form a grid. In addition, according to the present invention, it is possible to configure a linear pattern resistance layer composed, for example, of patterns whose planar shape is a honeycomb shape, that is, patterns having hexagonal eyes that are flatly spread in a network. The present invention is thereby able to offer a wave absorber provided with a linear pattern resistance layer capable of efficiently converting EM waves to heat.

In addition, with the wave absorber of the present invention, the high-resistance conductor constituting said linear pattern resistance layer has a volume resistivity that is $1.0\text{E}-4$ $\Omega$cm or more and $1.0\text{E}-1$ $\Omega$cm or less.

According to the wave absorber of the present invention, the high-resistance conductor of the linear pattern resistance layer can convert EM waves, which are received by the pattern layer and leaked to the dielectric layers, to heat in a highly efficient manner. Accordingly, the present invention is able to offer a wave absorber endowed with high attenuation properties relative to EM waves.

In addition, with the wave absorber of the present invention, at least one among said conductor layer, pattern layer, linear pattern resistance layer and grid-like conductor layer has multiple linear patterns, where the line center interval which is the center interval of said linear patterns that are adjacent is 1/16 or less of the wavelength of the EM waves that are the object of absorption.

According to the wave absorber of the present invention, it is possible to offer a wave absorber that possesses reflection attenuation ability sufficient to enable prevention of communication disturbances with respect to EM waves of the desired wavelength, and that enables greater thinness and lower weight.

In addition, with the wave absorber of the present invention, the line width which is the width of said linear pattern resistance layer is 100 μm or less.

According to the present invention, it is possible to offer a high-performance wave absorber that is also transparent at a distance.

In addition, with the wave absorber of the present invention, each pattern of said pattern layer differs in at least one or the other of size and form relative to another adjacent pattern.

According to the wave absorber of the present invention, it is possible to offer a wave absorber that can be provided with wideband reflection attenuation properties, and that has little fluctuation in properties depending on the incident angle of the waves.

In addition, with the wave absorber of the present invention, each pattern of said pattern layer is configured to have at least one or the other of a form that is any one of circular, rectangular, polygonal or a loop form having these forms as its external form, and a form that adds an open stub to the pertinent one of these forms.

According to the wave absorber of the present invention, by setting the form of each pattern of the pattern layer according to the wavelength, bandwidth and the like of the waves that are the object of absorption, it is possible to conduct highly efficient absorption with respect to the waves of the desired wavelength and desired bandwidth. Thus, according to the wave absorber of the present invention, communication disturbances due to reflection and the like of EM waves can be effectively prevented.

In addition, the wave absorber of the present invention includes a protective layer laminated onto at least one or the other of the front face and rear face of the laminate structure.

According to the wave absorber of the present invention, it is possible to have a structure where a protective layer is disposed on the front face or rear face of the wave absorber. By laminating a protective layer onto at least one surface side of a wave reflection layer such as a conductor layer and grid-like conductor layer, a linear pattern resistance layer, a pattern layer or a second dielectric layer, it is possible to prevent conductivity variation (e.g., oxidation) of the conductor (e.g., metal) in each layer. Moreover, by means of a protective layer, one can add functions such as hard coat or UV cuts. Thus, according to the present invention, it is possible to offer a wave absorber with a long product life.

In addition, with the wave absorber of the present invention, all of said component layers are made transparent or semi-transparent.

According to the present invention, it is possible to offer, for example, a wave absorber that is transparent at a distance. In this regard, the conductor layer, pattern layer or linear pattern resistance layer, etc. may use transparent conductive oxide such as ITO (indium tin oxide) or ATO (antimony tin oxide). Moreover, the conductor layer, pattern layer or linear pattern resistance layer, etc. may be configured using thin-line material that is grid-shaped or honeycomb-shaped. Furthermore, transparent material is used in the first dielectric layer, second dielectric layer and protective layer, etc. By these means, it is possible to configure a wave absorber that is transparent or semi-transparent.

Moreover, in the case where the conductor layer, pattern layer or linear pattern resistance layer, etc. are configured using thin-line material, it is preferable that the line center interval of the thin-line material be 1/16 or less of the wavelength of the EM waves that are the object of absorption. Considered in terms of visibility, it is preferable that the line width of the thin-line material be 100 μm or less. By means of this configuration, it is possible to realize a wave absorber that is transparent at a distance, and to realize a wave absorber that is provided with layers functioning as an in-plane conductor or in-plane resistor relative to EM waves, and that has excellent EM wave absorption properties.

In addition, the wave absorber of the present invention includes a wave reflection layer for reflecting EM waves, an antenna layer serving as an antenna for receiving EM waves of the wavelength that is the object of absorption, a dielectric layer disposed at least on the upper side or underside of said antenna layer, and a resistance layer for converting to heat and consuming the EM waves that are leaked to said dielectric layer when said antenna layer receives EM waves.

Here, as the wave reflection layer, one may apply said conductor layer (2011, 2021, 2031), grid-like conductor layer (2041) or the like. As the antenna layer, one may apply said pattern layer (2016, 2027, 2034, 2045) or the like. As the dielectric layer, one may apply said first dielectric layer (2012, 2023, 2024, 2032, 2033, 2042) or second dielectric layer (2014, 2015, 2026, 2035, 2044) or the like. As the resistance layer, one may apply said linear pattern resistance layer (2013, 2025, 2036, 2043) or the like.

According to the wave absorber of the present invention, EM waves that are the object of absorption can be efficiently received by the antenna layer, and EM waves that leak to the dielectric layer during reception can be efficiently converted to heat by the resistance layer. Moreover, EM waves that have once passed through the antenna layer are reflected by the wave reflection layer, and the reflected EM waves are then received by the antenna layer, and can be converted to heat by the resistance layer. By these means, the present invention is able to offer a wave absorber that possesses reflection attenuation capability sufficient to enable prevention of communication disturbances, that enables greater thinness and lower weight, and that has little fluctuation of properties depending on the incident angle of the waves.

The manufacturing method of the wave absorber of the present invention includes: a process of laminating a wave reflection layer (2011) composed of a conductor that reflects EM waves, a first dielectric layer (2012) composed of dielectric material in one layer or multiple layers, a linear pattern resistance layer (2013) having linear patterns composed of a high-resistance conductor which is a conductor with a higher resistivity than said wave reflection layer, a second dielectric layer (2014, 2015) composed of dielectric material in one layer or multiple layers, and a pattern layer (2016) having multiple patterns composed of a conductor; and a process of forming the linear patterns of said linear pattern resistance layer using the screen printing method.

According to the present invention, it is possible to form the linear pattern resistance layer inexpensively without use of a vacuum apparatus. Moreover, by adjusting the line width and line interval of the linear patterns of the linear pattern resistance layer, it is possible to form a resistance layer (linear pattern resistance layer) with a surface resistance of one's choice. In addition, by using material with stable resistivity, it is possible to form a resistance layer with a surface resistance accuracy corresponding to processing accuracy.

The manufacturing method of the wave absorber of the present invention includes: a process of laminating a wave reflection layer (2011) composed of a conductor that reflects EM waves, a first dielectric layer (2012) composed of dielectric material in one layer or multiple layers, a linear pattern resistance layer (2013) having linear patterns composed of a high-resistance conductor which is a conductor with a higher resistivity than said wave reflection layer, a second dielectric layer (2014, 2015) composed of dielectric material in one layer or multiple layers, and a pattern layer (2016) having multiple patterns composed of a conductor; and a process of forming the linear patterns of said linear pattern resistance layer using the ink jet method.

According to the present invention, it is possible to form the linear pattern resistance layer inexpensively without use of a vacuum apparatus. Moreover, when forming the linear pattern resistance layer by the ink jet method, liquid material constituting the high-resistance conductor is applied only to the region to be used for the linear patterns, with the result that etching or the like is rendered unnecessary. Accordingly, it is possible to eliminate wastage of the high-resistance conductor due to etching or the like, and it is possible to further mitigate manufacturing cost. In addition, design and manufacture of mask patterns and the like for purposes of forming the linear pattern resistance layer are also rendered unnecessary, with the result that manufacturing costs can be further mitigated.

In order to solve the aforementioned problems, the wave absorber of the present invention includes at least a conductor layer (3011) composed of a conductor, a first dielectric layer (3012) composed of dielectric material in one layer or multiple layers, a planar resistance layer (3013) composed of dielectric material containing conductive powder, a second dielectric layer (3014) composed of dielectric material in one layer or multiple layers, and a pattern layer (3015) having multiple patterns composed of a conductor. It is preferable that the wave absorber of the present invention be laminated in the pertinent order.

According to the wave absorber of the present invention, the patterns of the pattern layer function as antennae to receive EM waves, and leakage of EM waves to the first or second dielectric layers occurs during reception. These leaked EM waves are converted to heat and consumed by the planar resistance layer. In addition, even EM waves that are not received by the pattern layer are subsequently fully reflected or the like by the conductor layer, received by the pattern layer, and converted to heat and consumed by the planar resistance layer. By these means, the wave absorber of the present invention is able to absorb and consume EM waves. Accordingly, the present invention is able to offer a wave absorber that possesses reflection attenuation capability sufficient to enable prevention of communication disturbances due to reflection and the like of EM waves, that enables greater thinness and lower weight, and that has little fluctuation in properties depending on the incident angle of the waves.

According to the wave absorber of the present invention, it is possible to have a structure where the first dielectric layer and second dielectric layer bond due to the planar resistance layer. In addition, when EM waves are received by the pattern layer, and when leakage of EM waves to the second dielectric layer occurs, it is possible for the planar resistance layer to convert the leaked EM waves to heat and consume them. By these means, the present invention is able to offer a wave absorber that can be easily manufactured and that has high performance.

In addition, with the wave absorber of the present invention, said planar resistance layer (3013) is composed of material where glass cloth is impregnated with epoxy resin in which conductive powder such as carbon, silver, nickel or the like has been dispersed.

According to the wave absorber of the present invention, it is possible for the planar resistance layer to jointly possess the function of a planar resistor that converts EM waves to heat, and the function of a bonding layer that bonds the first dielectric layer, second dielectric layer and so on. Thus, the present invention is able to offer a wave absorber that can be easily manufactured with facilitation of reduced manufacturing costs, and that has high performance.

In addition, with the wave absorber of the present invention, each pattern of said pattern layer differs at least in one or the other of size and form relative to another adjacent pattern.

According to the wave absorber of the present invention, it is possible to offer a wave absorber that can be provided with wideband reflection attenuation properties, and that has little fluctuation in properties depending on the incident angle of the desired waves.

In addition, with the wave absorber of the present invention, each pattern of said pattern layer is configured to have at least one or the other of a form that is any one of circular, rectangular, polygonal or a loop form having one of these forms as its external form, and a form that adds an open stub to the pertinent one of these forms.

According to the wave absorber of the present invention, by setting the form of each pattern of the pattern layer according to the wavelength, bandwidth and the like of the EM waves that are the object of absorption, it is possible to conduct highly efficient absorption with respect to the EM waves of the desired wavelength and desired bandwidth. Thus, according to the wave absorber of the present invention, communication disturbances due to reflection and the like of EM waves can be effectively prevented.

In addition, the wave absorber of the present invention includes a protective layer laminated onto at least one or the other of the front face and rear face of the laminate structure.

According to the wave absorber of the present invention, it is possible to have a structure where a protective layer is disposed on the front face or rear face of the wave absorber. By laminating a protective layer onto at least one exposed face side of the laminate structure constituting the wave absorber of the present invention, it is possible to prevent conductivity variation (e.g., oxidation) of the conductor (e.g., metal) in each layer. Moreover, by means of a protective layer, one can add functions such as hard coat or UV cuts. Thus, according to the present invention, it is possible to offer a wave absorber with a long product life.

The manufacturing method of the wave absorber of the present invention includes a process of laminating a conductor layer (3011) composed of a conductor, a first dielectric layer (3012) composed of dielectric material in one layer or multiple layers, a planar resistance layer (3013) composed of dielectric material containing conductive powder, a second dielectric layer (3014) composed of dielectric material in one layer or multiple layers, and a pattern layer (3015) having multiple patterns composed of a conductor, as well as a process of forming a prepreg wherein, with respect to said planar resistance layer (3013), said first dielectric layer (3012) and said second dielectric layer (3014) are bonded with interposition of the pertinent planar resistance layer (3013).

According to the present invention, when forming the first and second dielectric layers with, for example, two glass epoxy substrates, it is possible to bond the mated glass epoxy substrates by a planar resistance layer constituting a prepreg of resin impregnated with conductive powder or the like. The prepreg is a sheet wherein glass cloth is impregnated with epoxy resin, and hardened midway. The prepreg is material that is able to realize lighter weight, higher strength and higher rigidity than metal. Accordingly, by forming a planar resistance layer, one can execute almost simultaneously the process of forming a layer for converting EM waves to heat and the process of bonding the first dielectric layer, second dielectric layer and other layers. Thus, according to the manufacturing method of the present invention, it is possible to facilitate reduction of manufacturing costs, and to manufacture a high-performance wave absorber.

In addition, the manufacturing method of the wave absorber of the present invention forms said planar resistance layer (3013) by using at least a process where glass cloth is impregnated with epoxy resin in which conductive powder such as carbon, silver and nickel has been dispersed.

According to the present invention, it is possible to form a planar resistance layer that jointly possesses a function as a layer for converting EM waves to heat, a function as layer for bonding the first dielectric layer, second dielectric layer and other layers, and a function as a prepreg for realizing lighter weight, high strength, high rigidity and the like. Thus, according to the manufacturing method of the present invention, it is possible to facilitate reduction of manufacturing costs, and to manufacture a high-performance wave absorber.

In order to solve the aforementioned problems, the wave absorber of the present invention has a structure wherein there is sequential lamination of at least a conductor layer (11, 21), a first dielectric layer (12, 22) composed of dielectric material in one layer or multiple layers, a high-resistance conductor layer (13, 23) having a surface resistivity (sheet resistivity) within a prescribed range, a second dielectric layer (14, 15, 24, 25) composed of dielectric material in one layer or multiple layers, and a pattern layer (16, 26) having multiple (loop) patterns composed of a conductor.

In addition, it is preferable that the wave absorber of the present invention have a configuration wherein a protective layer (10, 20) is laminated onto at least one surface side of said conductor layer (11, 21) and pattern layer (16, 26).

In addition, it is preferable that the wave absorber of the present invention adopt a structure wherein each pattern of said pattern layer (16, 26) differs in either or both of size and shape relative to another adjacent pattern.

According to the wave absorber of the present invention, the patterns of the pattern layer (16, 26) function as an antenna to receive EM waves. During reception, leakage of EM waves to the pertinent dielectric layers (12, 14, 15, 22, 24, 25) occurs. At this point, the EM waves can be converted to heat and consumed by the high-resistance conductor layer, which is a resistance loss layer disposed between the pertinent dielectric layers (12 and 14, or 22 and 24). In addition, EM waves can be received over a wide band by adopting a structure where each pattern differs in size or form. Accordingly, the wave absorber of the present invention is able to obtain wideband reflection attenuation properties with a lightweight and thin configuration.

In addition, it is preferable that the surface resistivity of the high-resistance conductor layer (13, 23) of the present invention be in a range from 100 Ω/□ to 100 kΩ/□.

In addition, as the resistance loss material configuring the high-resistance conductor layer (13, 23) of the present invention, one may use conductive material containing carbon, as well as ITO (indium tin oxide), ATO (antimony tin oxide), or the like.

In addition, with the wave absorber of the present invention, it is preferable to have a structure where each pattern of the pattern layer (16, 26) differs in at least one or the other of size and form relative to another pattern that is adjacent. In this structure, as the form of each pattern, one may apply the form of one's choice such as circular, square and polygonal forms.

In addition, with the wave absorber of the present invention, it is possible to provide an open stub (e.g., a linear pattern) on a portion of the aforementioned patterns. By adjusting the size, form, or disposition of said open stub (e.g., linear pattern), the wave absorber of the present invention is able to conduct adjustment to a frequency (wavelength) and bandwidth with high reflection attenuation properties.

Accordingly, the present invention is able to offer a wave absorber capable of effectively absorbing the EM waves that are the object of absorption.

According to the present invention, it is possible to offer a wave absorber and a manufacturing method of a wave absorber that has reflection attenuation performance sufficient to enable prevention of communication disturbances due to reflection and the like of EM waves, that enables greater thinness and lighter weight than conventional wave absorbers, and that has attenuation properties over a wideband with little fluctuation of properties depending on the incident angle of the waves.

Figure 1:
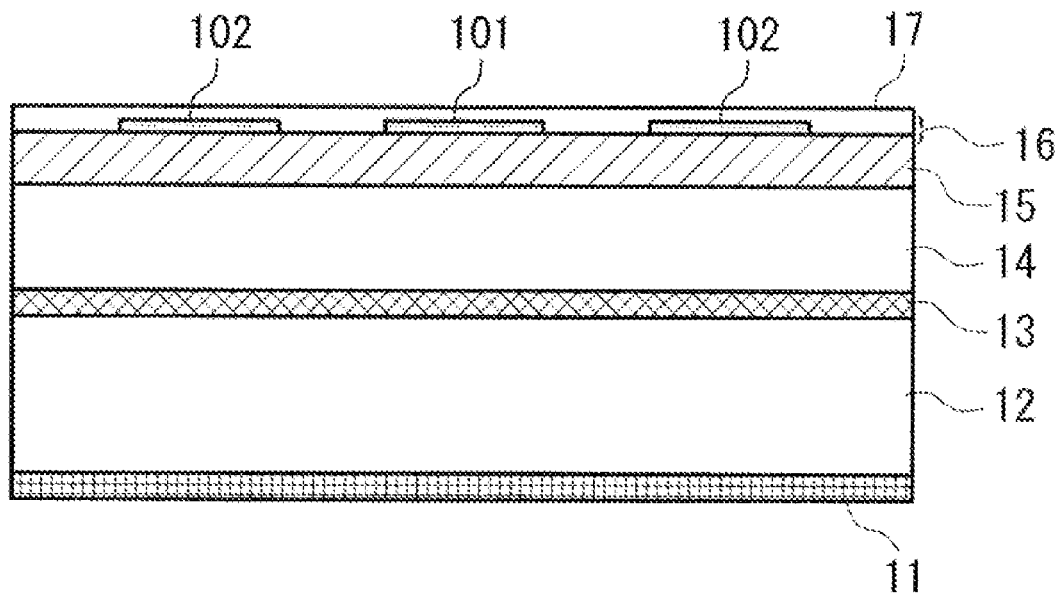
FIG. 1 is a sectional view of a wave absorber which is a first embodiment of the present invention.

In the foregoing figures, reference numeral
10, 20: BT substrate (protective layer);
11: grid-like conductor layer;
12, 12A: polycarbonate substrate (first dielectric layer);
12B: BT substrate (second dielectric layer);
13: high-resistance conductor layer;
14, 14A: polycarbonate substrate (second dielectric layer);
15: BT substrate (second dielectric layer);
16: pattern layer;
21: grid-like conductor layer;
22: polycarbonate substrate (first dielectric layer);
23: high-resistance conductor layer;
24: polycarbonate substrate (second dielectric layer);
25: BT substrate (second dielectric layer);
26: pattern layer;
31: conductor layer;
32: polycarbonate substrate (first dielectric layer);
33: dielectric loss layer;
34: polycarbonate substrate (second dielectric layer);
35: BT substrate (second dielectric layer);
36: pattern layer;
41: grid-like conductor layer;
42: polycarbonate substrate (first dielectric layer);
43: high-resistance conductor layer;
44: polycarbonate substrate (second dielectric layer);
45: BT substrate (second dielectric layer);

46: pattern layer;
51: conductor layer;
52: EPT (ethylene-propylene rubber) layer (first dielectric layer);
53: ferrite magnetic loss layer;
54: EPT (ethylene-propylene rubber) layer (second dielectric layer);
55: pattern layer;
61: low-resistance ITO layer;
62: dielectric layer;
63: high-resistance ITO layer;
70, 80: BT substrate (protective layer);
71, 81: grid-like conductor layer;
72, 82: polycarbonate substrate (first dielectric layer A);
73, 83: polycarbonate substrate (first dielectric layer B);
74, 84: BT substrate (first dielectric layer C);
75, 85: pattern layer;
101, 102, 103, 201, 202, 203, 301, 302, 303, 401, 402, 403, 601, 701, 702, 703: loop pattern;
501: circular patch pattern;
103a, 203a, 303a: open stub;
2010, 2030, 2060: BT substrate (protective layer);
2040, 2046: PET substrate (protective layer);
2047: PC substrate (protective layer);
2011, 2021, 2031, 2061, 2071: conductor layer;
2041: grid-like conductor layer;
2012, 2023, 2024, 2032, 2042, 2062, 2073, 2074: PC substrate (first dielectric layer);
2022, 2033: BT substrate (first dielectric layer);
2013, 2025, 2036, 2043: linear pattern resistance layer;
2014, 2035, 2044, 2063: PC substrate (second dielectric layer);
2015, 2026, 2064, 2075: BT substrate (second dielectric layer);
2016, 2027, 2034, 2045, 2065, 2076: pattern layer;
2101, 2102, 2103, 2201, 2202, 2203, 2301, 2302, 2303, 2401, 2402, 2403: loop pattern;
2203a, 2203b, 2303a, 2403a: open stub;
3010, 3020: GE substrate (protective layer);
3011, 3021: conductor layer;
3012, 3022: GE substrate (first dielectric layer);
3013: planar resistance layer;
3014, 3023: GE substrate (second dielectric layer);
3015, 3024: pattern layer;
3101, 3102, 3103: loop pattern; and
3103a, 3103b: open stub.

DETAILED DESCRIPTION OF THE INVENTION

Below, preferred embodiments of the present invention are described with reference to drawings.

The wave absorber of these embodiments is suitable, for example, as a wave absorber that prevents communication disturbances in an ETC (Electronic Toll Collection) system. An ETC system uses a 5.8 GHz wave, utilizing radio communication between roadside antennas and on-board equipment in automobiles realizes automatic toll transaction without need to stop at the toll gate. The wave absorber of these embodiments suitably serves to absorb waves that are unnecessary for the ETC system, and to avoid malfunctioning of the pertinent system. For example, it is preferable to install the wave absorber of these embodiments on the ceiling (underside of ceiling) of the toll gate or side wall face of the toll gate provided with an ETC system. Furthermore, it is also preferable to install it between the ETC lanes in the transparent material recorded in these embodiments.

First Embodiment

FIG. 1 is a sectional drawing showing the schematic configuration of a wave absorber which is a first embodiment of the present invention. The wave absorber of the present embodiment is configured by sequential lamination of a grid-like conductor layer 11 formed by copper foil (i.e. an electric conductor) of 12 μm thickness, a polycarbonate substrate 12 of 1.7 mm thickness constituting a first dielectric layer, a high-resistance conductor layer 13 having a surface resistance value (sheet resistance value) of 400 Ω/□, a laminate of a polycarbonate substrate 14 of 1.3 mm thickness constituting a second dielectric layer A and a BT (bismaleimide-triazine) substrate 15 of 0.3 mm thickness constituting a second dielectric layer B, a pattern layer 16 where multiple loop patterns of differing shape formed by copper foil of 12 μm thickness are cyclically disposed, and PET (polyethylene terephthalate) 17 with of 0.1 mm thickness that serves as a protective layer. Here, the grid-like conductor layer 11 is formed with a light width of 50 μm and a line center interval of 1.4 mm, and has the function of fully reflecting the radio waves. With respect to the line center interval, an interval that is sufficient to allow full reflection of the radio waves is acceptable, and it will preferably be 1/16 or less of the wavelength of the EM waves that are the object of absorption. Or instead of a grid-like conductor layer, a conduct layer may be used. The high-resistance conductor layer 13 is composed from an ITO (indium tin oxide) sheet, and the surface resistance value may be in a range from 100 Ω/□ to 100 kΩ/□.

Figure 2:
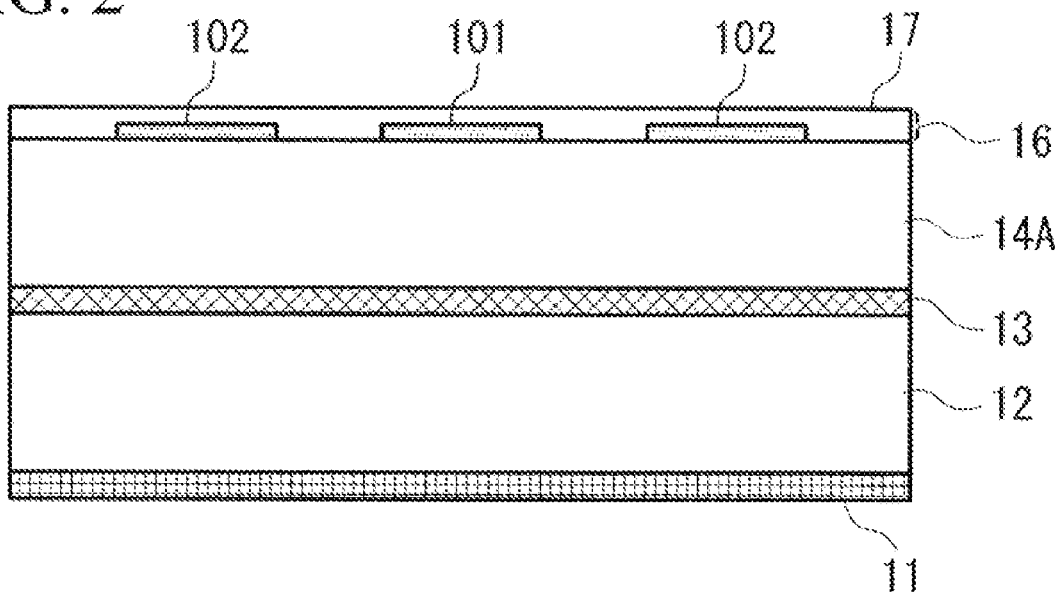
FIG. 2 is a sectional view of a wave absorber which is a second example of the first embodiment of the present invention.
Figure 3:
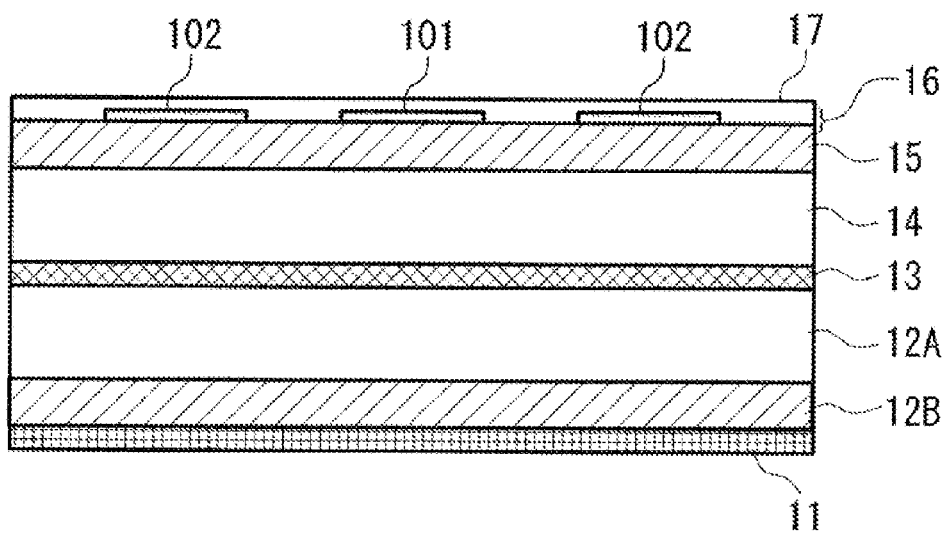
FIG. 3 is a sectional view of a wave absorber which is a third example of the first embodiment of the present invention.

In the present embodiment, a laminate of two different dielectric materials is provided as the second dielectric layer, but as shown in FIG. 2, it is possible to configure the second dielectric layer with one type of dielectric material (a polycarbonate substrate 14A). Moreover, as shown in FIG. 3, it is also possible to configure the first dielectric layer from a laminate of two or more different dielectric materials (a polycarbonate substrate 12A and a BT substrate 12B).

Figure 4:
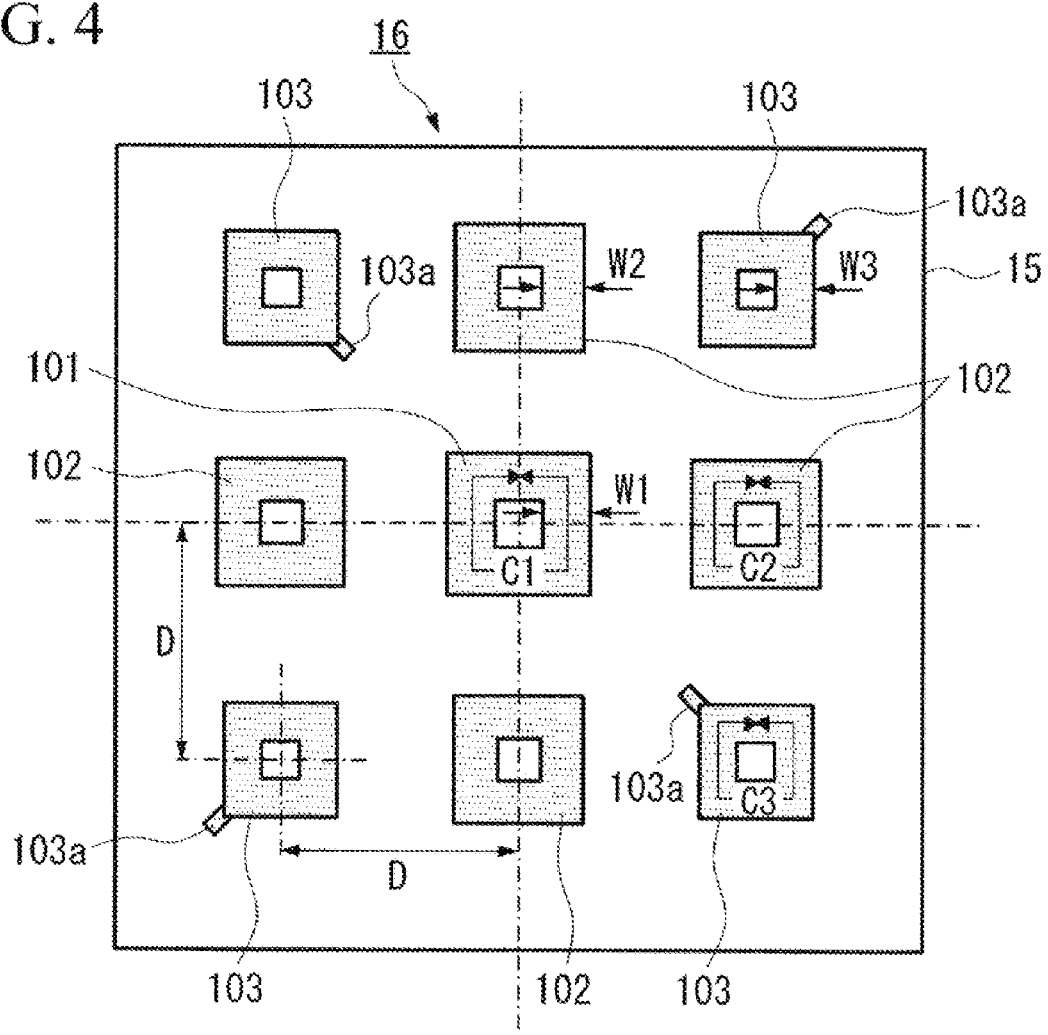
FIG. 4 is a plane view showing details of the pattern layer in a wave absorber which is the same as the above.

FIG. 4 is a plan view of the wave absorber shown in FIG. 1, and is a drawing that shows the detailed configuration of the pattern layer 16. The pattern layer 16 is configured from multiple loop patterns 101, 102, 103 formed on the top face of the BT substrate 15. The respective loop patterns 101, 102, 103 are composed of copper foil with a thickness of 12 μm, and are cyclically (i.e., regularly at mutually fixed intervals) disposed on the top face of the BT substrate 15. As shown in FIG. 4, loop patterns 101, 102, 103 have respectively different forms, and are square loops with center loop lengths C1, C2, C3 and line widths W1, W2, W3. Here, the center loop length signifies the length of the center axis in the lengthwise direction of the lines constituted by loop patterns 101, 102, 103 (hereinafter the same). The mated center points of the adjacent loop patterns 101, 102, 103 are disposed at positions separated to the extent of the center interval D.

Furthermore, as shown in FIG. 4, the loop patterns 103 are configured with affixation of a projecting linear pattern (open stub) 103a to the loop-shaped line. This open stub 103a is affixed to the apex of one part of the square loop, and is a rectangle with a line width of 2.0 mm and a length of 2.1 mm, where the lengthwise direction of the rectangle is at a 45-degree angle relative to one side of the square loop.

The pattern layer 16 having these loop patterns 101, 102, 103 may be patterned and formed by etching that uses a photo resist mask and ferric chloride—in a manner similar to the normal patterning of a print wiring board—with respect to the BT substrate formed with copper foil on its surface. The dimensions of the respective parts of the loop patterns 101, 102, 103 are shown in Table 1.

With respect to the loop patterns 101, 102, 103, it is preferable that the respective line widths W1, W2, W3 be values that are from 5 to 25 percent of the center loop lengths C1, C2, C3. Moreover, it is preferable the line widths W1, W2, W3 of loop patterns 101, 102, 103 have lengths that are from 60 percent to 140 percent of the effective wavelength ($\lambda$g) of the EM waves that are the object of absorption of the substrate pattern face.

Next, a description is given of the method of measurement of the radio wave absorption properties possessed by the wave absorber of the present embodiment configured in the aforementioned manner. First, pyramid-cone-shaped wave absorbers with a reflection amount of −40 dB or less relative to radio waves of the prescribed frequency that are the object of measurement (the object of absorption) are installed on the walls, floor and to the side of the measurement plane inside the measurement chamber. A transmitting horn antenna is then disposed so that the angle of incidence of radio waves relative to the measurement sample (this wave absorber) is at the prescribed angle (e.g., 20 degrees from the front face), and a receiving horn antenna is installed in a direction facing the EM waves emitted from the transmitting horn antenna that have been reflected by the measurement sample (the direction of optical reflection). Here, the transmitting horn antenna uses a right-handed polarized wave horn antenna, and the receiving horn antenna uses a left-handed polarized wave horn antenna.

As a result of this configuration, the radio waves emitted from the transmitting horn antenna are fully reflected by the metal plate, changing their rotational direction, and are received by the receiving horn antenna. Subsequently, these transmitting and receiving horn antennae are connected to a vector network analyzer (Agilent 8722ES), and the S parameter (S21) is measured by isolating only the incoming radio waves reflected from the measurement sample (the wave absorber) using the free-space time domain method.

First, a metal reflecting plate (Cu plate) is installed at a position which is approximately 100 cm distant from the respective antennae, radio waves of the prescribed frequency and prescribed intensity are emitted from the transmitting horn antenna, and the receiving level of the receiving antenna is measured. Next, in place of the metal reflecting plate (Cu plate), a measurement sample (wave absorber) of identical size is installed at the same position as the aforementioned metal reflecting plate (Cu plate), radio waves identical to the radio waves emitted to said metal reflecting plate (Cu plate) are emitted from the transmitting horn antenna, and the receiving level of the receiving antenna at this time is measured.

Figure 5:
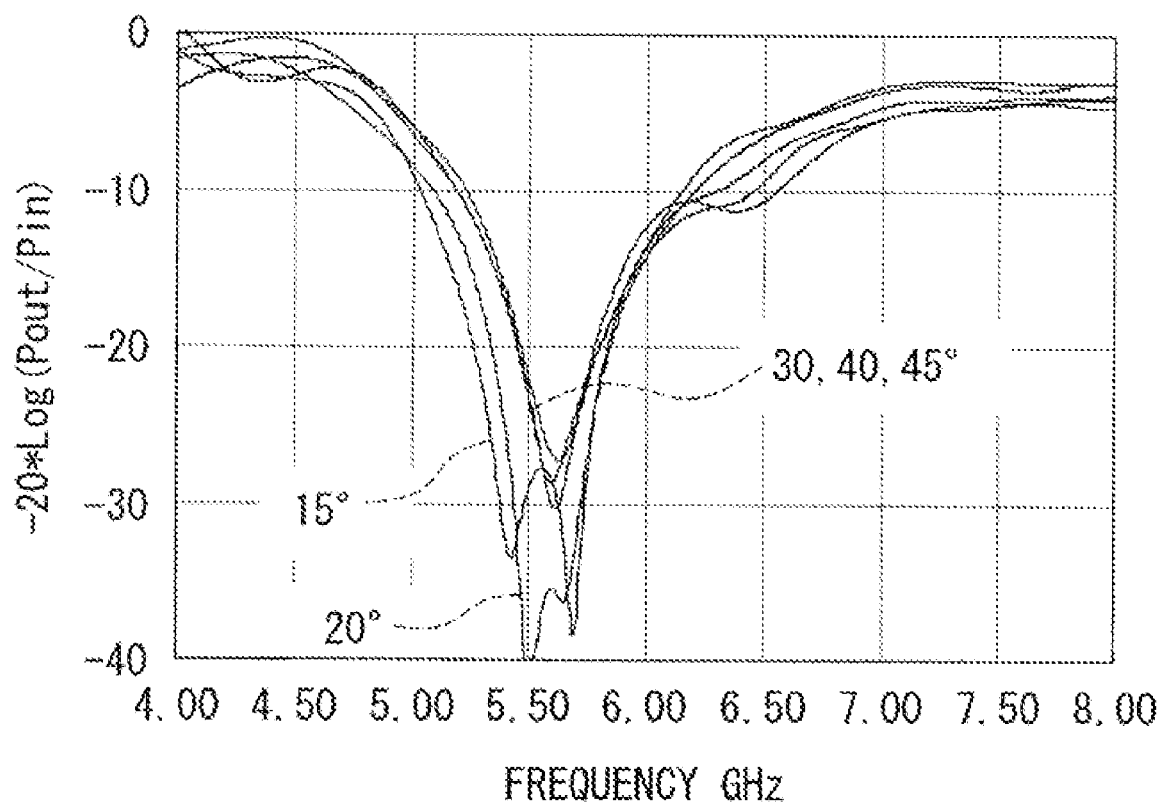
FIG. 5 is a figure showing the absorption properties in a wave absorber which is the same as the above.

The difference (power ratio) of the receiving level of the metal reflecting plate (Cu plate) and the receiving level of the wave absorber measured in this manner was evaluated as the reflection attenuation amount. An example of these results is shown in FIG. 5. From FIG. 5, it is clear that wide-band attenuation properties having an effective absorption band of 300 MHz are exhibited due to the small amount of fluctuation in properties relative to the angle of incidence, in the case where the effective absorption band is defined as a frequency bandwidth having attenuation properties of 20 dB or more even when the angle of incidence changes.

Second Embodiment

Figure 6:
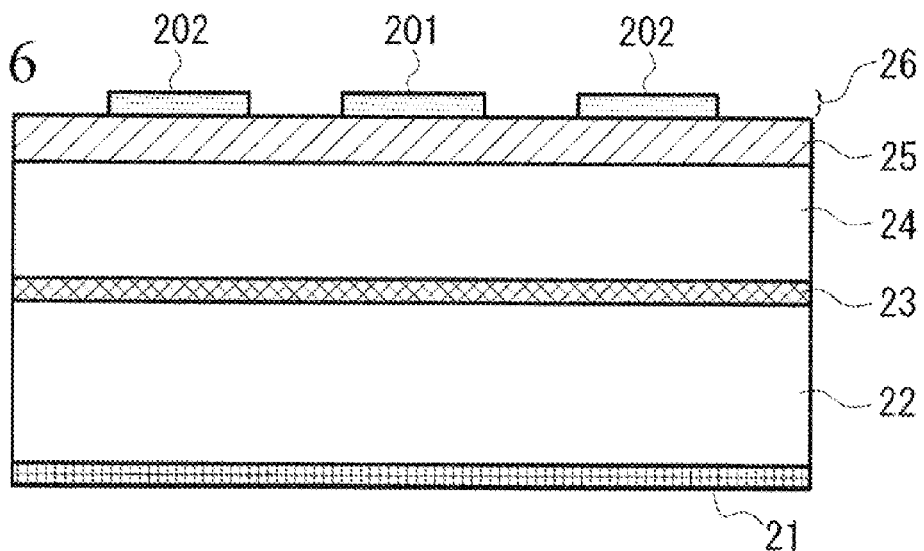
FIG. 6 is a sectional view of a wave absorber which is a second embodiment of the present invention.

FIG. 6 is a sectional view showing the schematic configuration of a wave absorber, which is a second embodiment of the present invention. The wave absorber of the present embodiment is configured by sequential lamination of a grid-like conductor layer 21 formed by copper foil (i.e. an electric conductor) of 12 μm thickness, a polycarbonate substrate 22 of 1.5 mm thickness constituting a first dielectric layer, a high-resistance conductor layer 23 having a surface resistance value (sheet resistance value) of 400 Ω/□, a laminate of a polycarbonate substrate 24 of 1.1 mm thickness constituting a second dielectric layer A and a BT (bismaleimide-triazine) substrate 25 of 0.3 mm thickness constituting a second dielectric layer B, and a pattern layer 26 where multiple loop patterns of differing shape formed by copper foil of 12 μm thickness are cyclically disposed. Here, the grid-like conductor layer 21 and the high-resistance conductor layer 23 are identical to the grid-like conductor layer 11 and high-resistance conductor layer 13 of the first embodiment.

Figure 7:
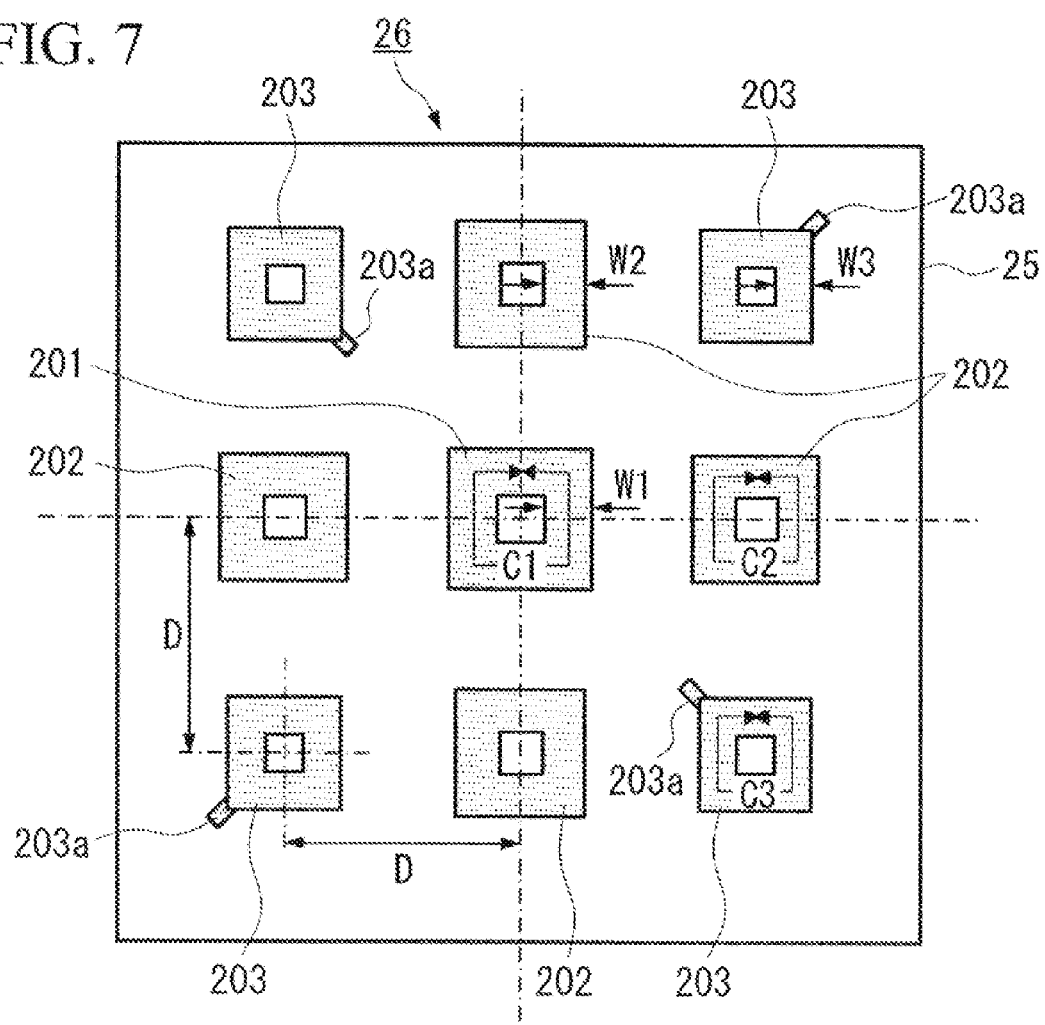
FIG. 7 is a plane view showing details of the pattern layer in a wave absorber which is the same as the above.

FIG. 7 is a plan view of the wave absorber shown in FIG. 6, and is a drawing that shows the detailed configuration of the pattern layer 26. The pattern layer 26 is configured to have multiple loop patterns 201, 202, 203 formed on the top face of the BT substrate 25. The respective loop patterns 201, 202, 203 are composed of copper foil with a thickness of 12 μm, and are cyclically (i.e., regularly at mutually fixed intervals) disposed on the top face of the BT substrate 25. As shown in FIG. 7, loop patterns 201, 202, 203 have respectively different forms, and are square loops with center loop lengths C1, C2, C3 and line widths W1, W2, W3. The mated center points of the adjacent loop patterns 201, 202, 203 are disposed at positions separated to the extent of the center interval D.

Furthermore, as shown in FIG. 7, the loop patterns 203 are configured with affixation of a projecting linear pattern (open stub) 203a to the loop-shaped line. This open stub 203a is affixed to the apex of one part of the square loop, and is a rectangle with a line width of 2.0 mm and a length of 2.4 mm, where the lengthwise direction of the rectangle is at a 45-degree angle relative to one side of the square loop. The dimensions of the respective parts of the loop patterns 201, 202, 203 are shown in Table 1.

Figure 8:
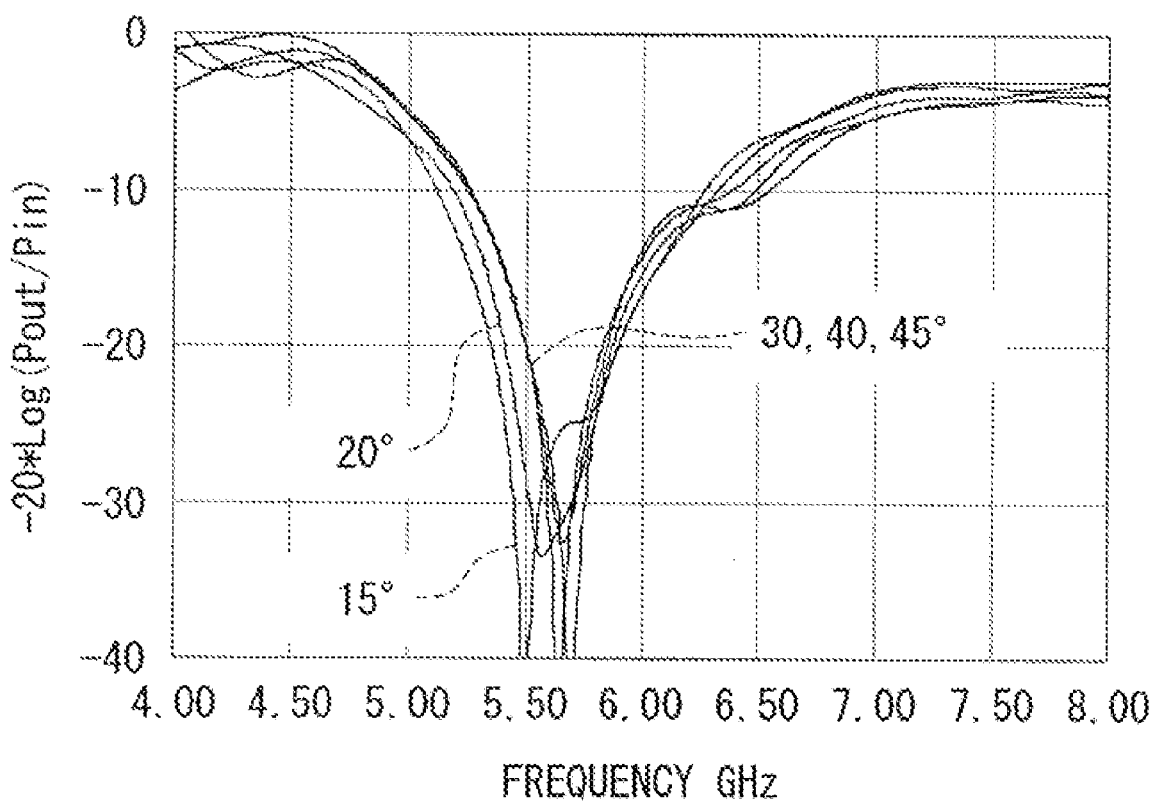
FIG. 8 is a figure showing the absorption properties in a wave absorber which is the same as the above.

With respect to the manufacturing method of the wave absorber of the present embodiment and the method of measuring its properties, the techniques of the first embodiment were used. The results of this measurement of reflection attenuation amounts are shown in FIG. 8. From FIG. 8, it is clear that the wave absorber of the present embodiment exhibits wide-band attenuation properties having an effective absorption band of 300 MHz due to the small amount of fluctuation in properties relative to the angle of incidence, in the case where the effective absorption band is defined as a frequency bandwidth having attenuation properties of 20 dB or more even when the angle of incidence changes.

Third Embodiment

Figure 9:
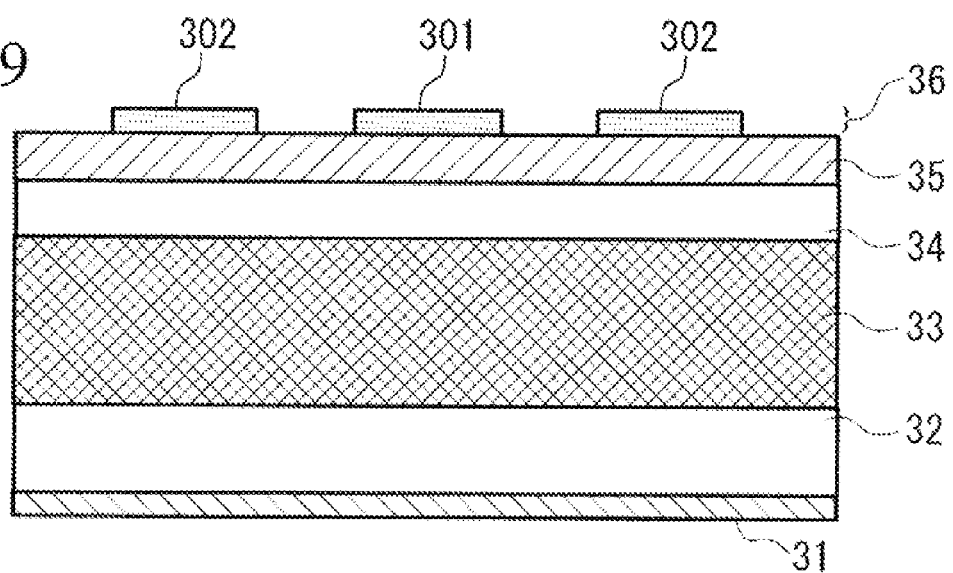
FIG. 9 is a sectional view of a wave absorber which is a third embodiment of the present invention.

FIG. 9 is a sectional view showing the schematic configuration of a wave absorber, which is a third embodiment of the present invention. The wave absorber of the present embodiment is configured by sequential lamination of a conduct layer 31 formed by copper foil (i.e. an electric conductor) of 12 μm thickness, a polycarbonate substrate 32 of 0.7 mm thickness constituting a first dielectric layer, a polypropylene substrate 33 of 1.3 mm thickness where 20 weight parts of carbon powder constituting a dielectric loss layer are dispersed, and made to foam 3.8-fold, a laminate of a polycarbonate substrate 34 of 0.4 mm thickness constituting a second dielectric layer A and a BT (bismaleimide-triazine) substrate 35 of 0.3 mm thickness constituting a second dielectric layer B, and a pattern layer 36 where multiple loop patterns of differing shape formed by copper foil of 12 μm thickness are cyclically disposed. Here, as a carbon-dispersed foam substrate is used as the dielectric loss layer, the weight per unit area (1 m$^2$) is 3.2 kg, which is less than half the weight of the weight per unit area (1 m$^2$) of 7.4 kg of the below-mentioned reference example, thereby facilitating lighter weight. As dispersant other than carbon, one may also use conductive oxide or the like.

Figure 10:
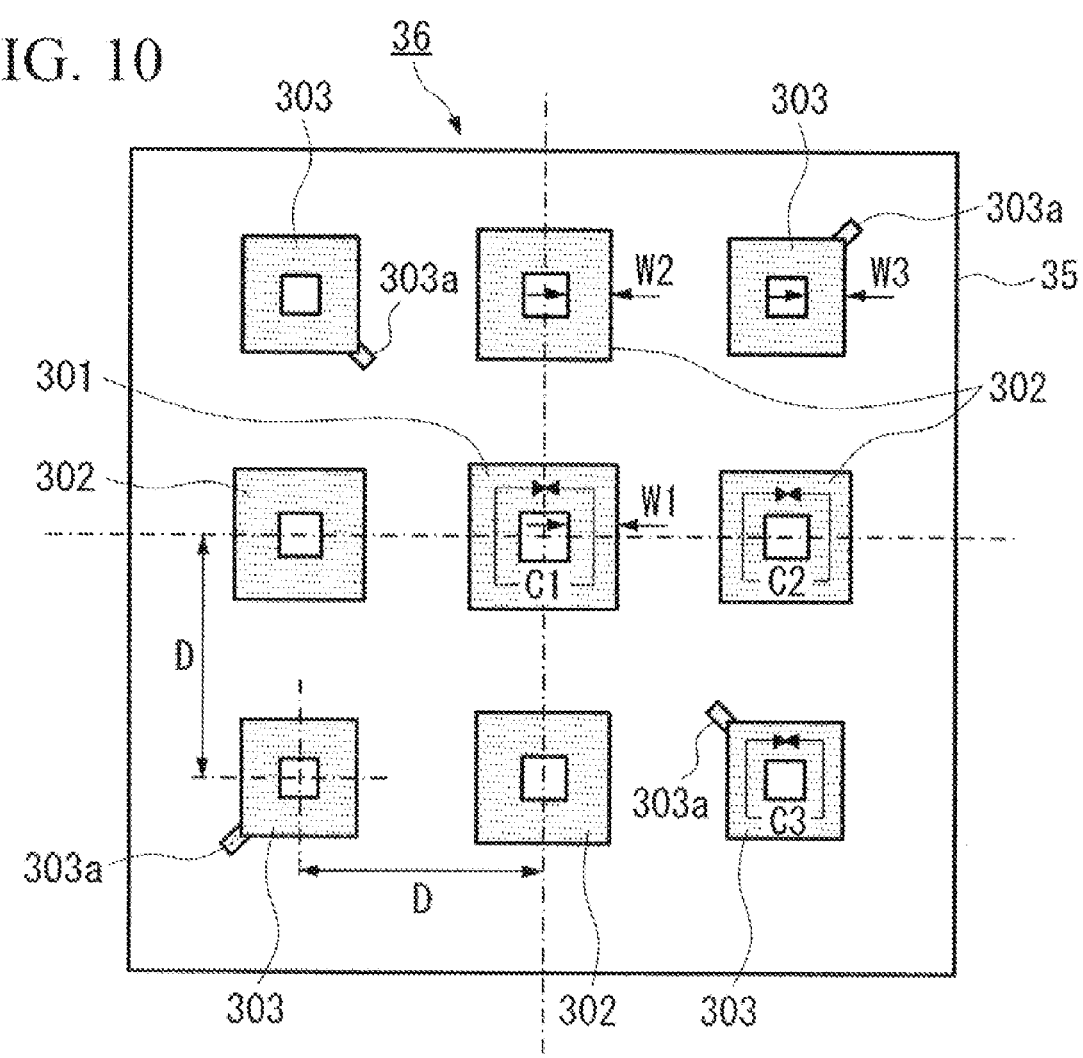
FIG. 10 is a plane view showing details of the pattern layer in a wave absorber which is the same as the above.

FIG. 10 is a plan view of the wave absorber shown in FIG. 9, and is a drawing that shows the detailed configuration of the pattern layer 36. The pattern layer 36 is configured to have multiple loop patterns 301, 302, 303 formed on the top face of the BT substrate 35. The respective loop patterns 301, 302, 303 are composed of copper foil with a thickness of 12 μm, and are cyclically (i.e., regularly at mutually fixed intervals) disposed on the top face of the BT substrate 35. As shown in FIG. 10, loop patterns 301, 302, 303 have respectively different forms, and are square loops with center loop lengths C1, C2, C3 and line widths W1, W2, W3. The mated center points of the adjacent loop patterns 301, 302, 303 are disposed at positions separated to the extent of the center interval D.

Furthermore, as shown in FIG. 10, the loop patterns 303 are configured with affixation of a projecting linear pattern (open stub) 303a to the loop-shaped line. This open stub 303a is affixed to the apex of one part of the square loop, and is a rectangle with a line width of 2.0 mm and a length of 2.9 mm, where the lengthwise direction of the rectangle is at a 45-degree angle relative to one side of the square loop. The dimensions of the respective parts of the loop patterns 301, 302, 303 are shown in Table 1.

Figure 11:
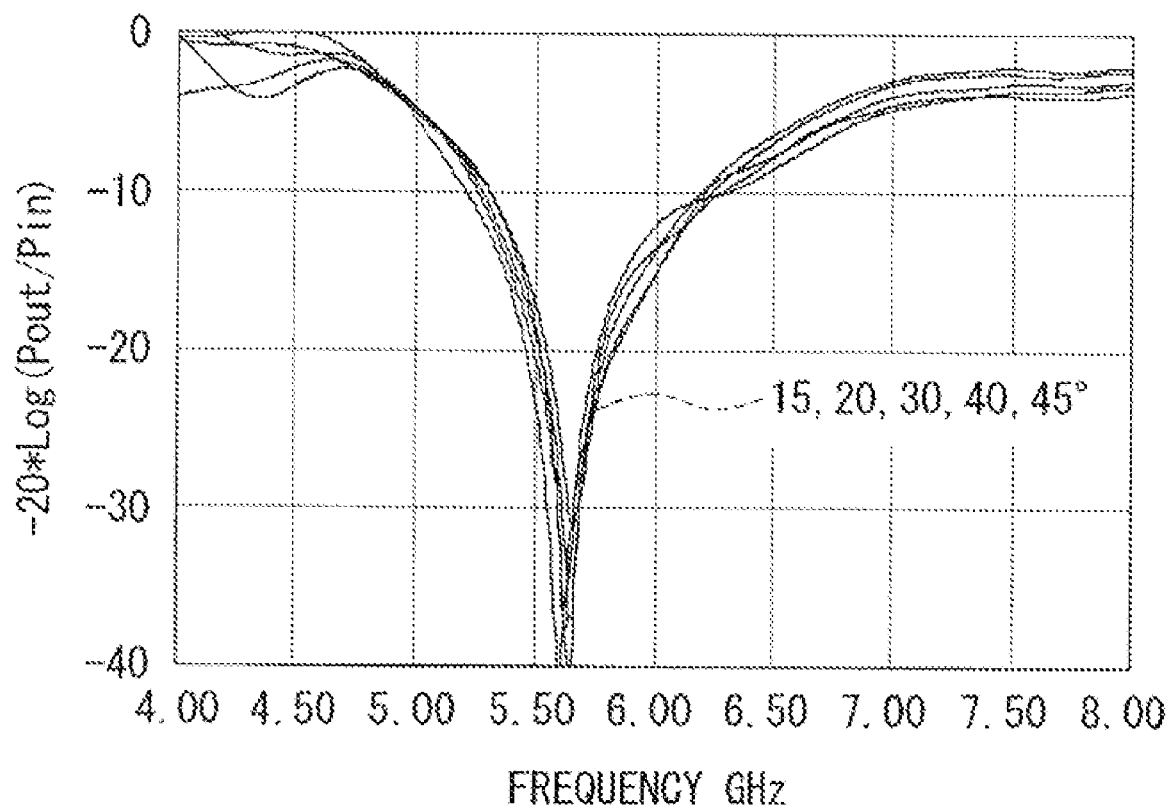
FIG. 11 is a figure showing the absorption properties in a wave absorber which is the same as the above.

With respect to the manufacturing method of the wave absorber of the present embodiment and the method of measuring its properties, the techniques of the first embodiment were used. The results of this measurement of reflection attenuation amounts are shown in FIG. 11. From FIG. 11, it is clear that the wave absorber of the present embodiment exhibits wide-band attenuation properties having an effective absorption band of 250 MHz due to the small amount of fluctuation in properties relative to the angle of incidence, in the case where the effective absorption band is defined as a frequency bandwidth having attenuation properties of 20 dB or more even when the angle of incidence changes.

Fourth Embodiment

Figure 12:
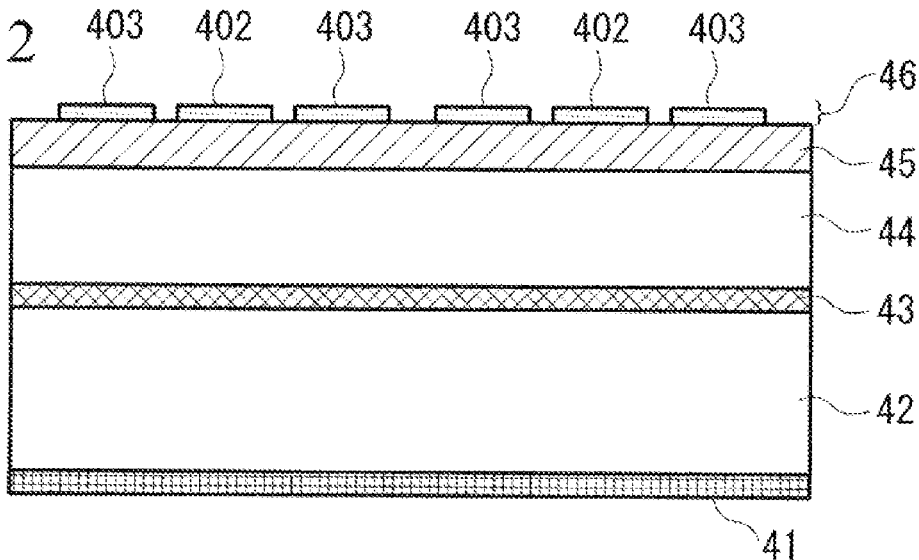
FIG. 12 is a sectional view of a wave absorber which is a fourth embodiment of the present invention.

FIG. 12 is a side view showing the schematic configuration of a wave absorber, which is a fourth embodiment of the present invention. The wave absorber of the present embodiment is identical to the second embodiment with respect to configuration in the thickness direction, and the loop patterns of the pattern layer 46 have a large-area structure, where an aggregate of multiple loop patterns of differing form constitutes one unit, and the space between the pertinent units is disposed at a prescribed interval D2.

Figure 13:
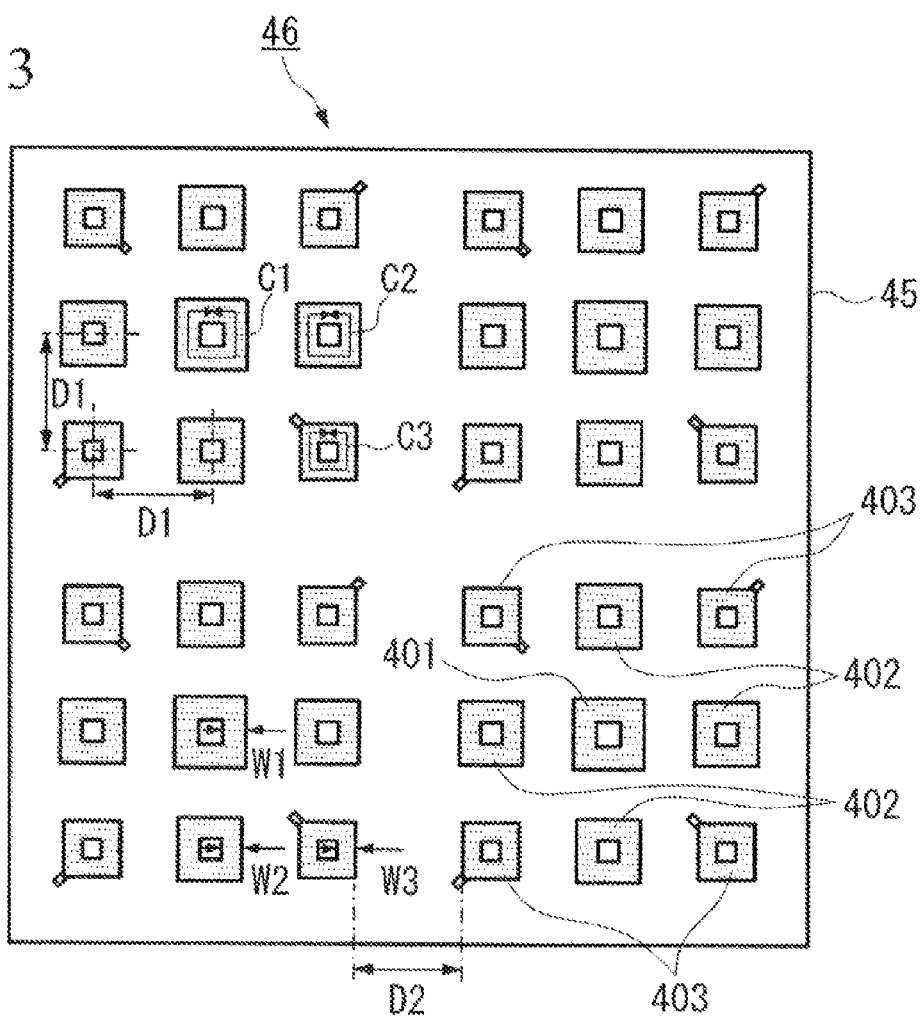
FIG. 13 is a plane view showing details of the pattern layer in a wave absorber which is the same as the above.

FIG. 13 is a plan view of the wave absorber shown in FIG. 12, and is a drawing that shows the detailed configuration of the pattern layer 46. The pattern layer 46 is configured by having multiple loop patterns 401, 402, 403 formed on the top face of the BT substrate 45 constituting the second dielectric layer B. The respective loop patterns 401, 402, 403 are identical to the loop patterns 201, 202, 203 of the second embodiment, an aggregate of these multiple loop patterns 401, 402, 403 constitutes one unit, and the space between the pertinent units is disposed at a prescribed interval D2 to facilitate creation of a larger area. The dimensions of each part are shown in Table 1.

Figure 14:
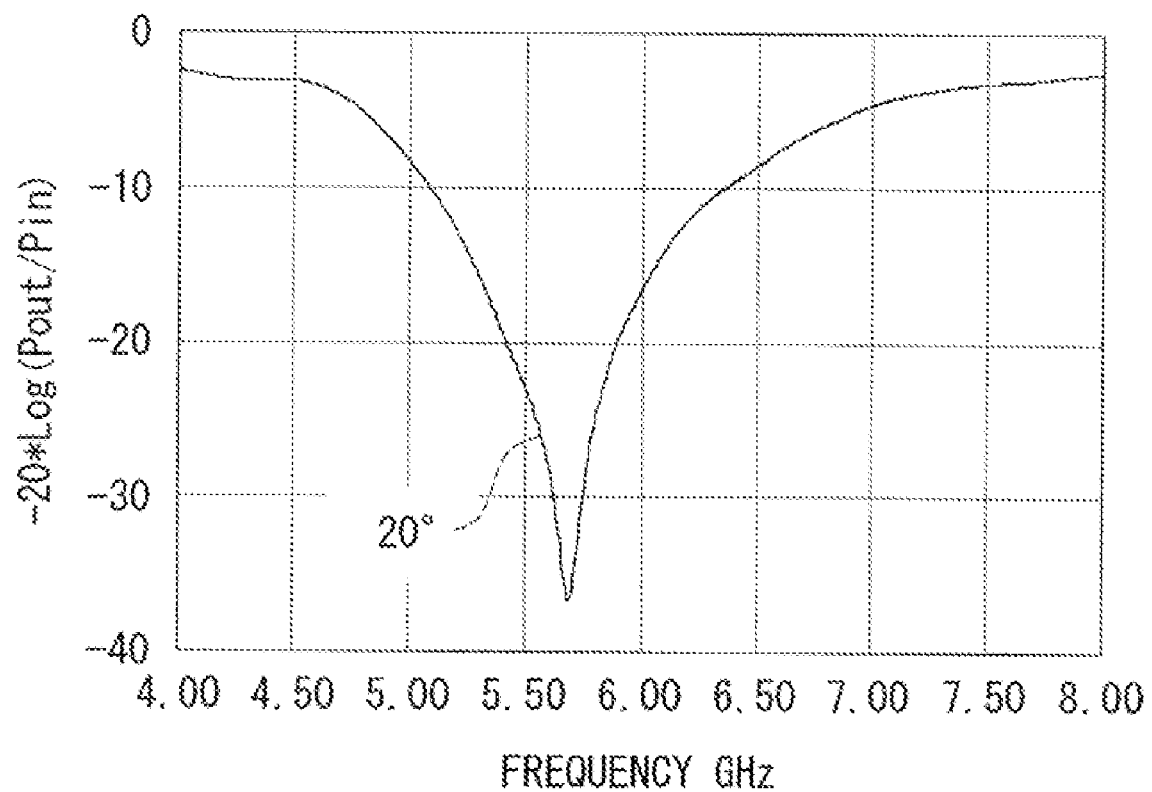
FIG. 14 is a figure showing the absorption properties in a wave absorber which is the same as the above.

With respect to the manufacturing method of the wave absorber of the present embodiment and the method of measuring its properties, the techniques of the first embodiment were used. The results of this measurement of reflection attenuation amounts are shown in FIG. 14. From FIG. 14, it is clear that the wave absorber of the present embodiment approximately matches the reflection attenuation properties of the second embodiment, and that it is possible to realize a larger area by this technique.

REFERENCE EXAMPLE 1

Figure 15:
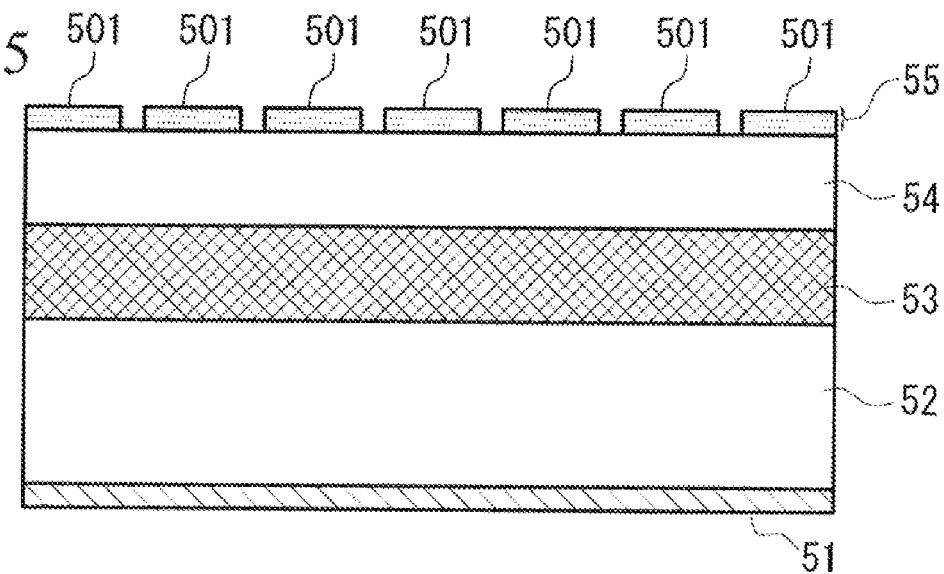
FIG. 15 is a sectional view of a conventional wave absorber (first reference example).
Figure 16:
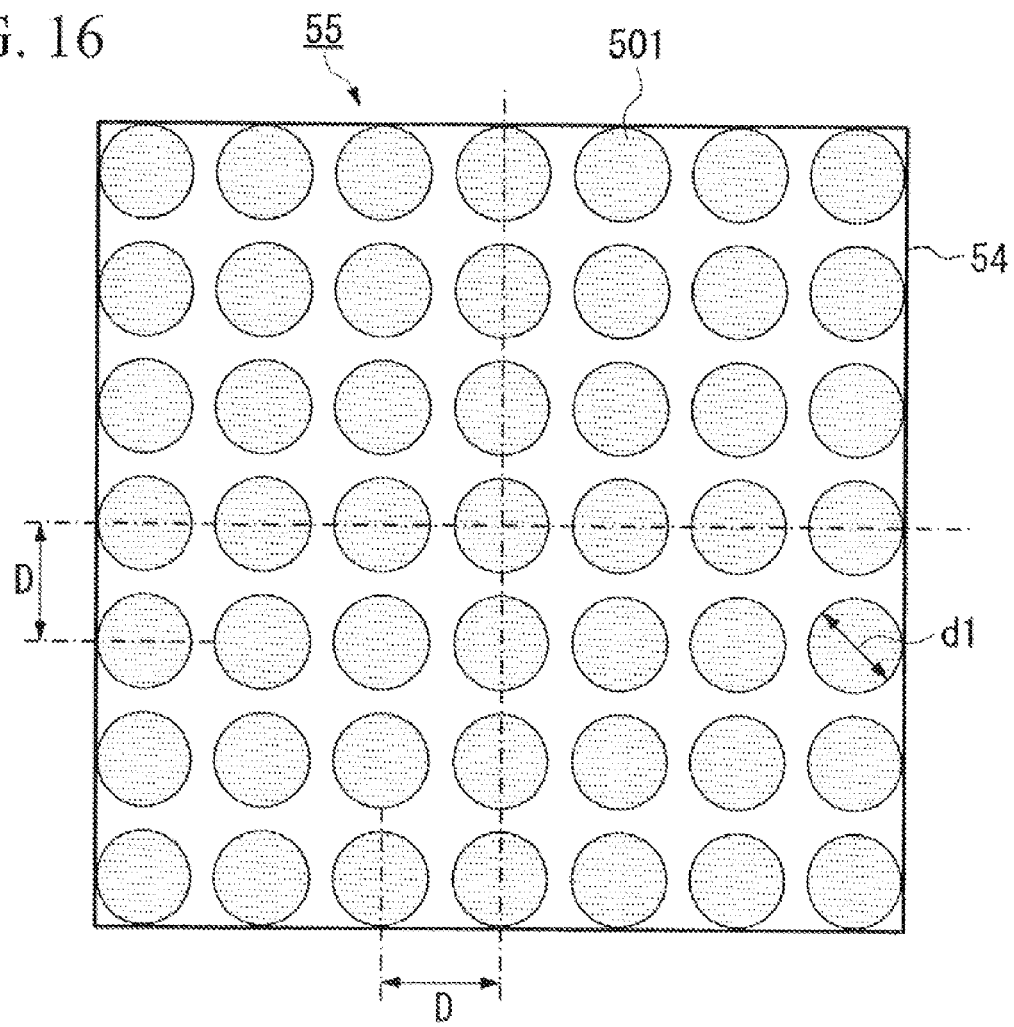
FIG. 16 is a plane view showing details of the pattern layer in a wave absorber which is the same as the above.
Figure 17:
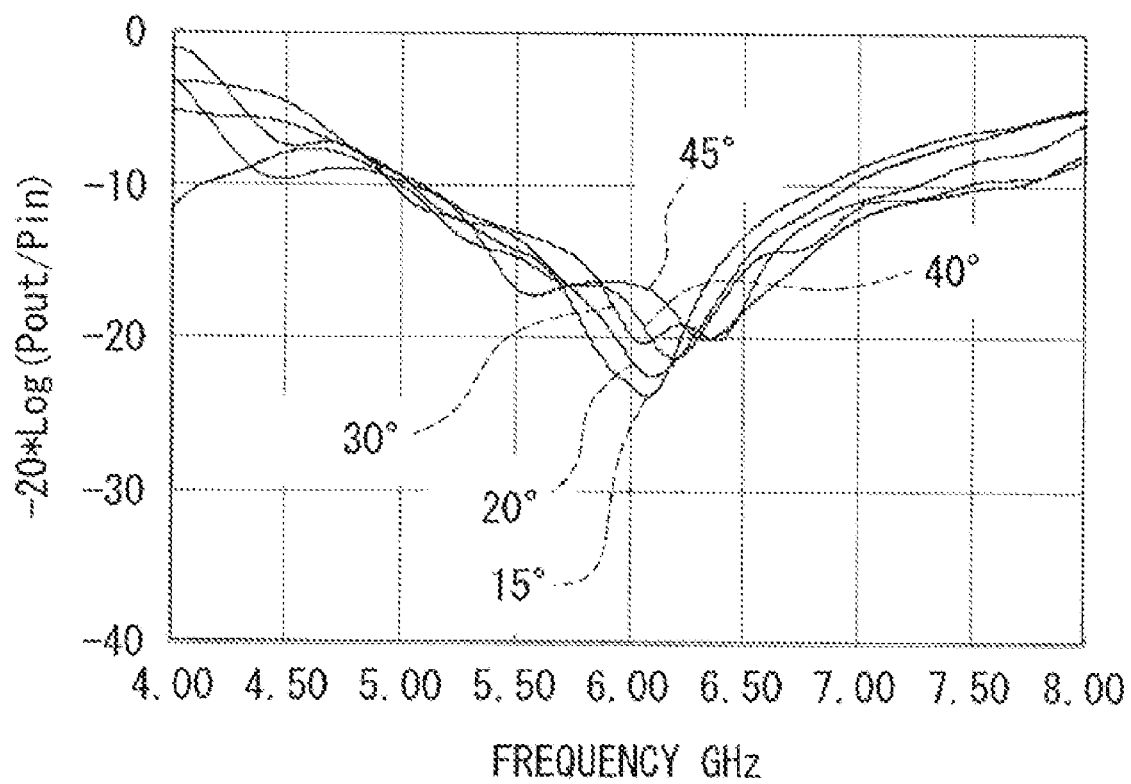
FIG. 17 is a figure showing the absorption properties in a wave absorber which is the same as the above.

Next, a description is given of the differences between a conventional wave absorber (reference example 1) and the wave absorbers of the first to the fourth embodiments of the present invention with reference to FIG. 15 to FIG. 17.

FIG. 15 is a sectional view showing the schematic configuration of a conventional wave absorber (reference example 1). This conventional wave absorber is configured by sequential lamination of a conduct layer 51 formed by copper foil of 18 μm thickness, an EPT (ethylene-propylene rubber) layer 52 of 0.9 mm thickness constituting a first dielectric layer, a ferrite-dispersed resin layer 53 of 0.9 mm thickness constituting a loss layer, an EPT layer 54 of 1.8 mm thickness constituting a second dielectric layer, and a pattern layer 55 composed of multiple circular patch patterns 501 formed by copper foil of 18 μm thickness that are cyclically disposed. That is, the conventional wave absorber has a configuration where EPT is used as the first dielectric layer and second dielectric layer of the wave absorber of the third embodiment, a resin substrate in which magnetic loss material of high specific gravity is dispersed is used as the loss layer, and further the various loop patterns 301, 302, 303 of the pattern layer 36 are replaced by circular patch patterns 501 of identical form and identical size.

FIG. 16 is a plan view of the conventional wave absorber shown in FIG. 15, and is a drawing that shows the detailed configuration of the pattern layer 55. The pattern layer 55 is configured by having multiple circular patch patterns 501 formed on the top face of the EPT layer 54 constituting the second dielectric layer. The respective circular patch patterns 501 have the same form and the same size. Specifically, the various circular patch patterns 501 are configured to be circular patch patterns of diameter d1 composed of copper foil of 18 μm thickness, and these circular patch patterns of identical size are respectively disposed at center interval D1. The dimensions of each of these parts are shown in Table 1. With respect to the manufacturing method of this conventional wave absorber and the method of measuring its properties, the techniques of the first embodiment were used. The results of this measurement of reflection attenuation amounts are shown in FIG. 17.

As shown in FIG. 17, it is clear that the conventional wave absorber exhibits a large fluctuation in properties relative to the angle of incidence, with the result that effective bandwidth is narrowed. In other words, compared to the conventional wave absorber, the wave absorbers of embodiments 1 to 4 of the present invention are wave absorbers that have little fluctuation in properties relative to the angle of incidence and that facilitate greater thinness and lighter weight, and can therefore provide adequate performance as wave absorbers used in ETC systems and the like.

REFERENCE EXAMPLE 2

Figure 18:
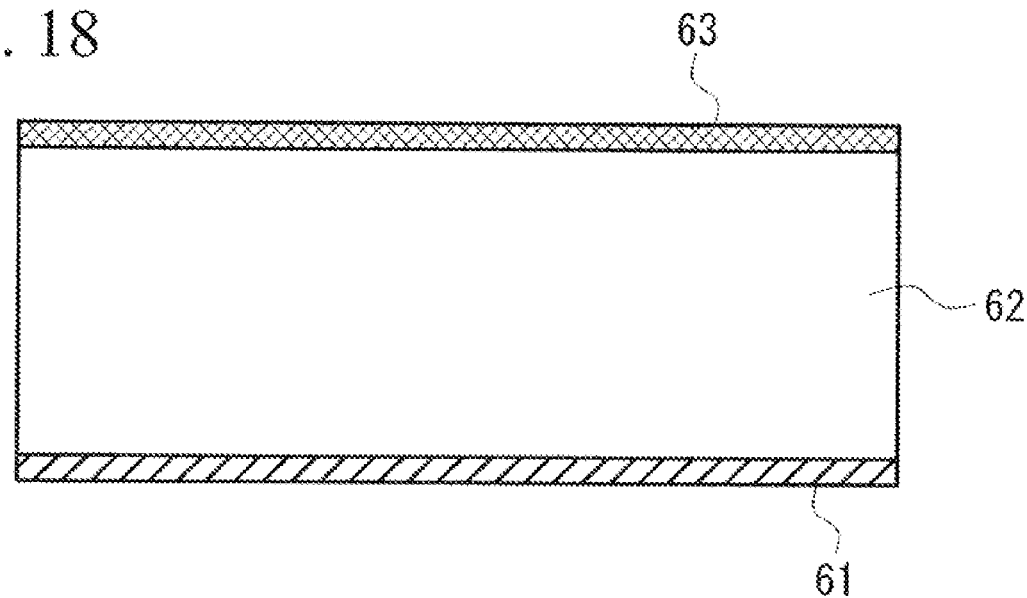
FIG. 18 is a sectional view of a conventional λ/4 type wave absorber (second reference example).
Figure 19:
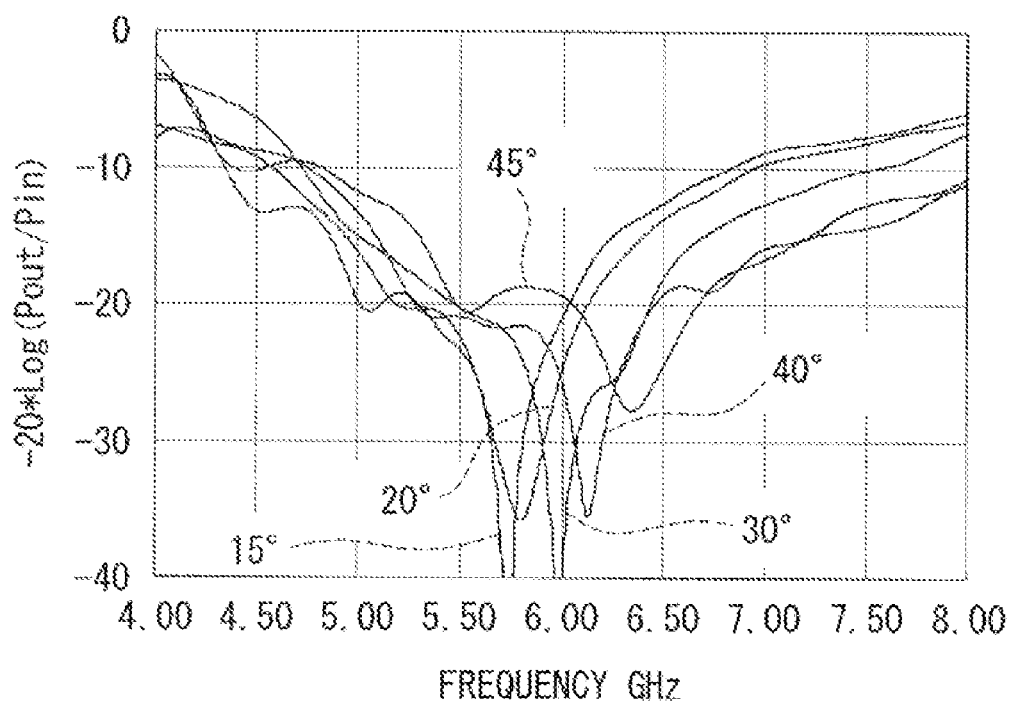
FIG. 19 is a figure showing the absorption properties in a wave absorber which is the same as the above.

Next, a description is given of the differences between a conventional λ/4 type wave absorber (reference example 2) and the wave absorbers of the first to the third embodiments of the present invention with reference to FIG. 18 and FIG. 19.

FIG. 18 is a sectional view showing the schematic configuration of a conventional λ/4 type wave absorber (reference example 2). This conventional wave absorber is configured by sequential lamination of a low-resistance ITO layer 61 with a surface resistivity (sheet resistance) of 10 Ω/□, a polycarbonate substrate 62 of 8.1 mm thickness as the dielectric layer, and a high-resistance ITO layer 63 with a surface resistivity (sheet resistance) of 370 Ω/□. That is, this conventional wave absorber is configured without a conductive pattern layer.

With respect to the method of measuring the properties of this conventional wave absorber, the technique of the first embodiment was used. The results of this measurement of reflection attenuation amounts are shown in FIG. 19.

As shown in FIG. 19, it is clear that this conventional λ/4 type wave absorber exhibits a large fluctuation in properties relative to the angle of incidence, with the result that effective bandwidth is narrowed. In other words, compared to the conventional wave absorber, the wave absorbers of embodiments 1 to 3 of the present invention are wave absorbers that have little fluctuation in properties relative to the angle of incidence and that facilitate greater thinness and lighter weight, and can therefore provide adequate performance as wave absorbers used in ETC systems and the like.

TABLE 1

| Length of each part | First embodiment | Second embodiment | Third embodiment | Fourth embodiment | Reference example 1 |
|---|---|---|---|---|---|
| D1 [mm] | 16.4 | 16.4 | 17.5 | 16.4 | 7.4 |
| D2 [mm] | — | — | — | 11.5 | — |
| C1 [mm] | 36.0 | 36.0 | 38.0 | 36.0 | — |
| C2 [mm] | 32.0 | 32.0 | 34.0 | 32.0 | — |
| C3 [mm] | 28.0 | 28.0 | 30.0 | 28.0 | — |
| W1 [mm] | 3.7 | 3.7 | 3.5 | 3.7 | — |
| W2 [mm] | 3.7 | 3.7 | 3.5 | 3.7 | — |
| W3 [mm] | 3.7 | 3.7 | 3.5 | 3.7 | — |
| d1 [mm] | — | — | — | — | 7.0 |

Fifth Embodiment

Figure 20:
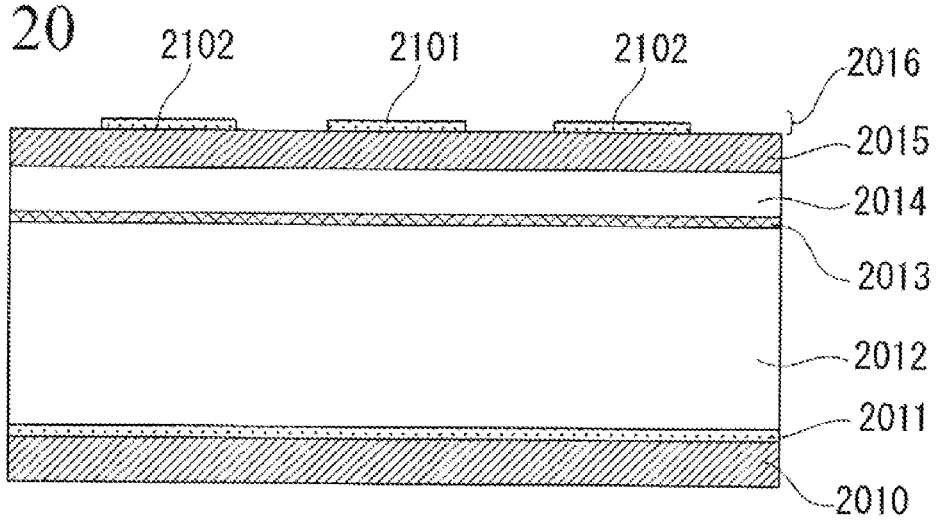
FIG. 20 is a partial sectional view of a wave absorber which is a fifth embodiment of the present invention.

FIG. 20 is a partial sectional view showing the schematic configuration of a wave absorber, which is a fifth embodiment of the present invention. The wave absorber of the present embodiment is configured by sequential lamination of a BT (bismaleimide-triazine) substrate 2010 that functions as a protective layer, a conduct layer 2011, a PC (polycarbonate) substrate 2012 constituting a first dielectric layer, a linear pattern resistance layer 2013, a PC substrate 2014 constituting a second dielectric layer A, a BT substrate 2015 constituting a second dielectric layer B, and a pattern layer 2016.

The BT substrate 2010 has, for example, a thickness of 0.3 mm. The conduct layer 2011 is disposed on the BT substrate 2010, and functions as a radio wave reflection layer. The conduct layer 2011 is, for example, composed from copper foil (i.e., an electric conductor) of 12 μm thickness. The PC substrate 2012 is disposed on the conduct layer 2011, and has, for example, a thickness of 3.0 mm. The linear pattern resistance layer 2013 is disposed on the PC substrate 2012. The PC substrate 2014 is disposed on the linear pattern resistance layer 2013, and has, for example, a thickness of 0.3 mm. The BT substrate 2015 is disposed on the PC substrate 2014, and has, for example, a thickness of 0.3 mm. The pattern layer 2016 is disposed on the BT substrate 2015. With respect to the pattern layer 2016, multiple loop patterns (2101, 2102, etc.; see FIG. 21) formed by copper foil of 12 μm thickness are cyclically disposed on the top face of the BT substrate.

Here, the linear pattern resistance layer 2013 is composed of linear patterns consisting of a high-resistance conductor. A high-resistance conductor signifies a conductor with a higher resistivity than the conduct layer 2011. Specifically, it constitutes a high-resistance conductor with a volume resistivity of 1.0 E-4 Ωcm or more and 1.0 E-1 Ωcm or less. For example, the linear pattern resistance layer 2013 is configured by creating a grid form where multiple linear patterns composed of a high-resistance conductor intersect. The linear patterns of the linear pattern resistance layer 2013 are set, for example, to a line width of 130 μm. Moreover, the line center interval which is the interval between the center axes of the respective linear patterns is set, for example, to 1.0 mm.

This linear pattern resistance layer 2013 can be formed by screen printing using carbon paste. That is, the wave absorber of the present embodiment can be manufactured by a process of laminating the BT substrate 2010, conduct layer 2011, PC substrate 2012, linear pattern resistance layer 2013, PC substrate 2014, BT substrate 2015 and pattern layer 2016, and a process of forming the linear pattern resistance layer 2013 made in this laminating process by the screen printing method.

Instead of screen printing, it is also acceptable to form the linear pattern resistance layer 2013 using the inkjet method. For example, an inkjet nozzle is used that has the same configuration as the one used in inkjet printers. Liquid material constituting said high-resistance conductor is discharged as droplets from the inkjet nozzle onto the specified region. The discharged liquid material becomes the high-resistance conductor by drying or annealing, and the linear pattern resistance layer 2013 is completed.

It is sufficient if said line center interval is an interval that allows the linear pattern resistance layer 2025 to function as a planar resistance layer, and it is preferable to set said line center interval at ¹⁄₁₆ or less of the wavelength of the EM waves that are the object of absorption. An interval that allows functioning as a planar resistance layer signifies an interval that allows functioning as resistance which converts the EM waves that are the object of absorption to heat.

Figure 21:
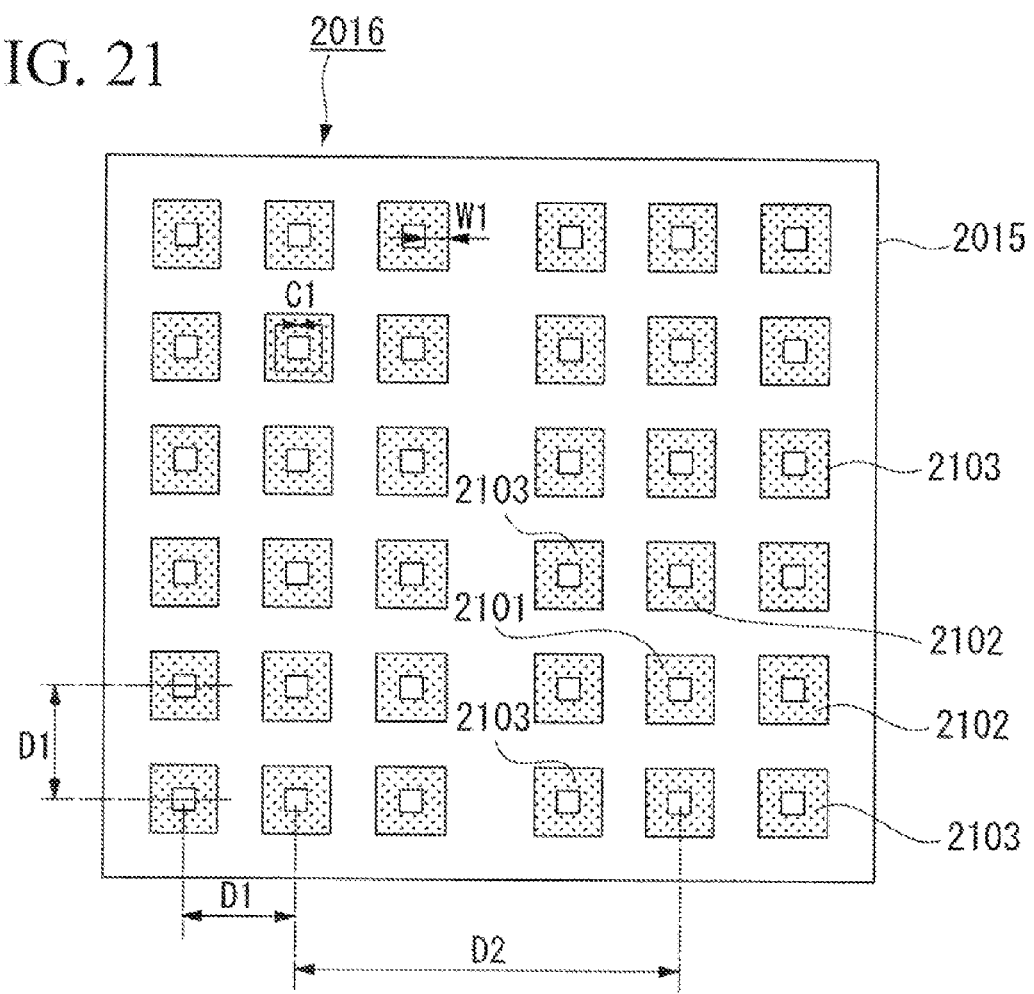
FIG. 21 is a partial plane view of the pattern layer in a wave absorber which is the same as the above.

FIG. 21 is a partial plan view of the pattern layer 2016 side of the wave absorber shown in FIG. 20. The pattern layer 2016 is composed of multiple loop patterns 2101, 2102, 2103 formed on the top face of the BT substrate 2015. The respective loop patterns 2101, 2102, 2103 are composed of copper foil with a thickness of 12 μm, and are regularly disposed at mutually fixed intervals on the top face of the BT substrate 2015. As shown in FIG. 21, loop patterns 2101, 2102, 2103 are square loop patterns of identical shape. Moreover, loop patterns 2101, 2102, 2103 are square loops with center loop length C1 and line width W1. Here, the center loop length signifies the length of the center axis in the lengthwise direction of the lines constituted by the loop patterns (hereinafter the same). The mated center points of the adjacent loop patterns are disposed at positions separated to the extent of the center interval D1. A larger area is facilitated by having an aggregate of these multiple loop patterns 2101, 2102, 2103 constitute one unit (set), and the space between the pertinent units is multiply disposed at a prescribed interval D2. The interval D2 signifies the interval between the center axes of adjacent units. The dimensions of each part are shown in Table 2.

As the method of forming the pattern layer 2016 having these loop patterns 2101, 2102, 2103, one may apply, for example, the following technique. That is, the loop patterns 2101, 2102, 2103 are patterned and formed by conducting etching in the same manner as patterning of ordinary print circuit boards with respect to the BT substrate on the surface of which copper foil is formed. In the etching, one uses, for example, a photo resist mask and ferric chloride.

With respect to loop patterns 2101, 2102, 2103, it is preferable that the respective line widths W1 be a value that is from 5 to 25 percent of the center loop length C1. Moreover, it is preferable that the line width W1 of the loop patterns 2101 have a length that is from 60 percent to 140 percent of the effective wavelength ($\lambda$g, see the below Formula 2) of the EM waves that are the object of absorption of the substrate pattern face.

$$\lambda_g = \lambda_0 \times \sqrt{(2/(\in_r + 1))} \qquad \text{Formula 2}$$

($\lambda_0$: free space wavelength, $\in_r$: relative dielectric constant of substrate)

Figure 22:
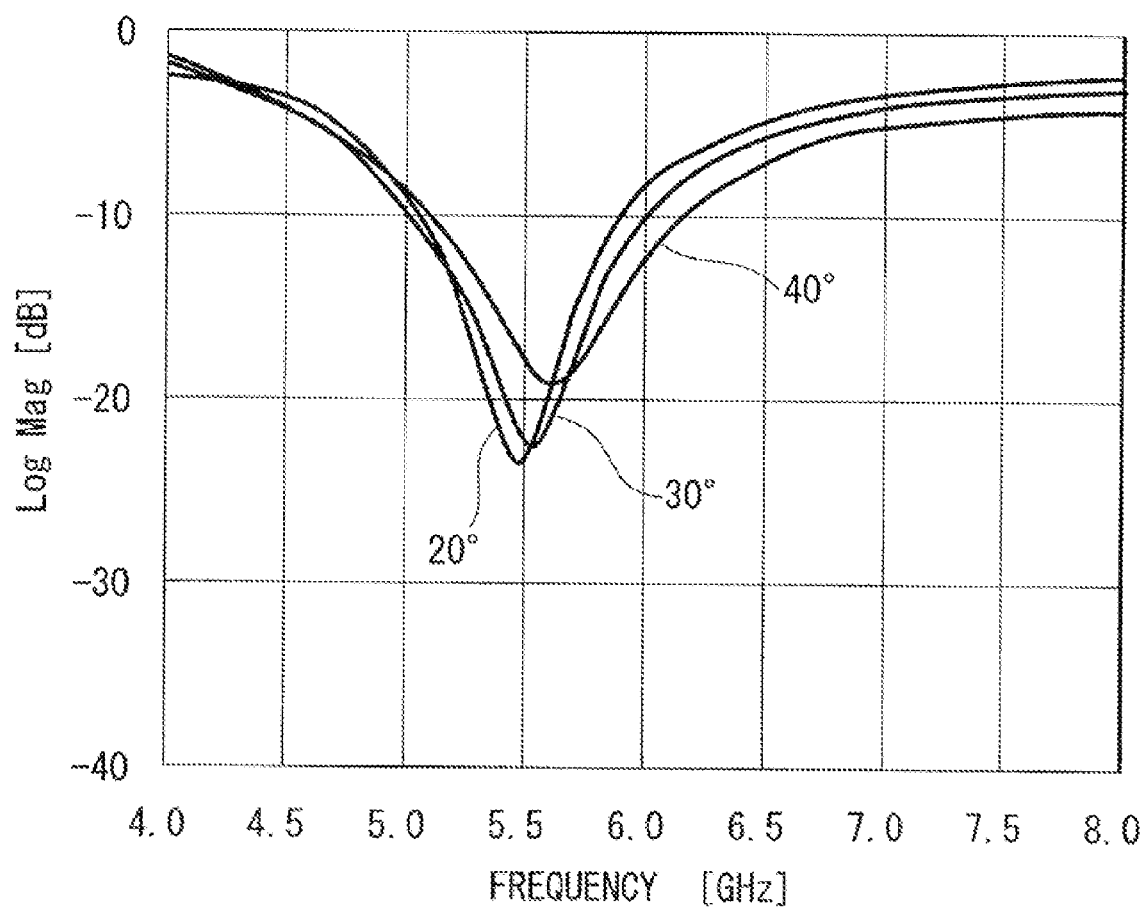
FIG. 22 is a figure showing the absorption properties in a wave absorber which is the same as the above.

Next, the wave absorber of the present embodiment configured in the aforementioned manner was measured by the measurement method for radio wave properties used in said first embodiment. The difference (power ratio) of the receiving level of the metal reflecting plate (Cu plate) and the receiving level of the wave absorber (measurement sample) measured in this manner was evaluated as the reflection attenuation amount. FIG. 22 shows the measurement results when the angle of incidence of the radio waves was set to 20 degree, 30 degrees and 40 degrees relative to the measurement sample. From FIG. 22, it is clear that an attenuation amount of approximately 24 dB is obtained as the maximum attenuation amount.

Sixth Embodiment

Figure 23:
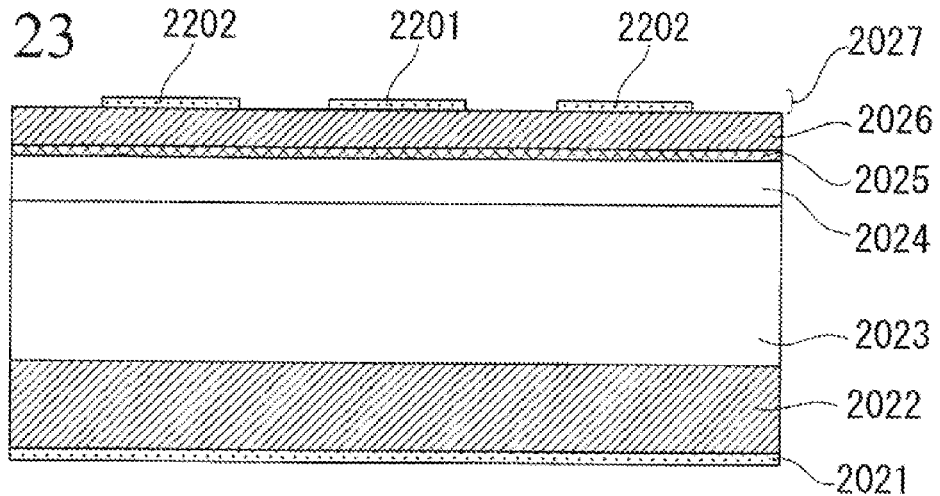
FIG. 23 is a partial sectional view of a wave absorber which is a sixth embodiment of the present invention.

FIG. 23 is a partial sectional view showing the schematic configuration of a wave absorber, which is a sixth embodiment of the present invention. The wave absorber of the present embodiment is configured by sequential lamination of a conduct layer 2021, BT substrate 2022 constituting a first dielectric layer A, PC substrate 2023 constituting a first dielectric layer B, PC substrate 2024 constituting a first dielectric layer C, linear pattern resistance layer 2025, BT substrate 2026 constituting a second dielectric layer, and pattern layer 2027.

The conduct layer 2021 is, for example, formed from copper foil of 12 µm thickness. The BT substrate 2022 is disposed on the conduct layer 2021, and has, for example, a thickness of 0.8 mm. The PC substrate 2023 is disposed on the BT substrate 2022, and has, for example, a thickness of 1.5 mm. The PC substrate 2024 is disposed on the PC substrate 2023, and has, for example, a thickness of 0.3 mm. The linear pattern resistance layer 2025 is disposed on the PC substrate 2024. The BT substrate 2026 is disposed on the linear pattern resistance layer 2025, and has, for example, a thickness of 0.3 mm. The pattern layer 2027 is disposed on the BT substrate 2026. With respect to the pattern layer 2027, multiple loop patterns of differing shape formed by copper foil of 12 µm thickness are cyclically disposed on the top face of the BT substrate 2026.

Here, the linear pattern resistance layer 2025 is composed of linear patterns consisting of a high-resistance conductor. A high-resistance conductor signifies a conductor with a higher resistivity than the conduct layer 2021. Specifically, it constitutes a high-resistance conductor with a volume resistivity of 1.0 E-4 $\Omega$cm or more and 1.0 E-1 $\Omega$cm or less. For example, the linear pattern resistance layer 2025 is configured by creating a grid form where multiple linear patterns composed of a high-resistance conductor intersect. The linear patterns of the linear pattern resistance layer 2025 are set, for example, to a line width of 130 µm. Moreover, the line center interval which is the interval between the center axes of the respective linear patterns is set, for example, to 1.4 mm. This linear pattern resistance layer 2025 can be formed by screen printing using carbon paste. It is sufficient if said line center interval is an interval that allows the linear pattern resistance layer 2025 to function as a planar resistance layer, and it is preferable to set said line center interval at 1/16 or less of the wavelength of the EM waves that are the object of absorption.

Figure 24:
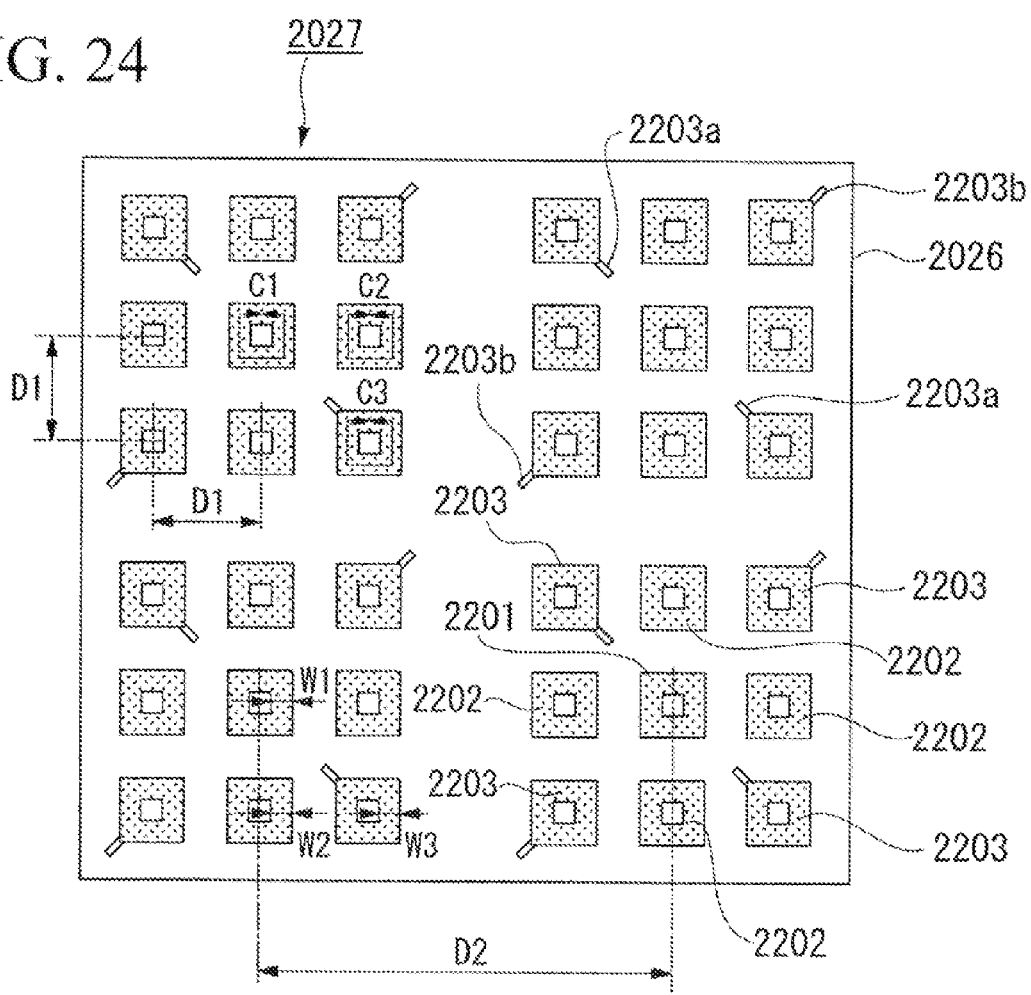
FIG. 24 is a partial plane view of the pattern layer in a wave absorber which is the same as the above.

FIG. 24 is a partial plan view of the pattern layer 2027 side of the wave absorber shown in FIG. 23. The pattern layer 2027 is composed of multiple loop patterns 2201, 2202, 2203 formed on the top face of the BT substrate 2026. The respective loop patterns 2201, 2202, 2203 are composed of copper foil with a thickness of 12 µm, and are regularly disposed at mutually fixed intervals on the top face of the BT substrate 2026. As shown in FIG. 24, loop patterns 2201, 2202, 2203 are square loops of respectively differing shape. The loop patterns 2201 have a center loop length C1 and line width W1. The loop patterns 2202 have a center loop length C2 and line width W2. The loop patterns 2203 have a center loop length C3 and line width W3. The mated center points of the adjacent loop patterns 2201, 2202, 2203 are disposed at positions separated to the extent of the center interval D1.

Furthermore, as shown in FIG. 24, the loop patterns 2203 are configured with affixation of projecting linear patterns (open stubs) 2203a and 2203b to the loop-shaped lines. These open stubs 2203a and 2203b are affixed to the apex of one part of the square loop. Open stub 2203a is a rectangle with a line width of 2.0 mm and a length of 2.1 mm, while open stub 2203b is a rectangle with a line width of 2.0 mm and a length of 4.1 mm. The lengthwise direction of the rectangle of open stubs 2203a and 2203b is at a 45-degree angle relative to one side of the square loop. Examples of dimensions of the respective parts of the loop patterns 2201, 2202, 2203 are shown in Table 2.

Figure 25:
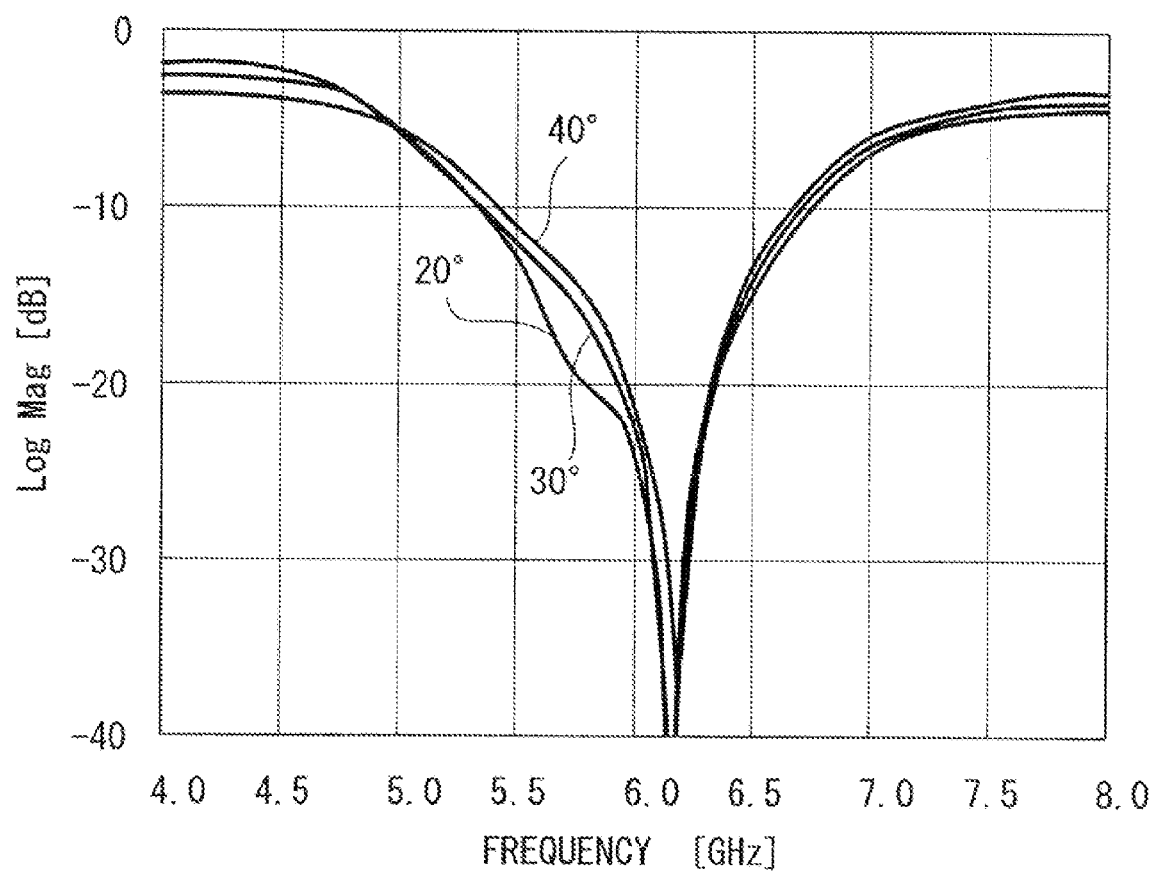
FIG. 25 is a figure showing the absorption properties in a wave absorber which is the same as the above.

With respect to the manufacturing method of the wave absorber of the present embodiment and the method of measuring its properties, the same technique as that of the fifth embodiment was used. The results of this measurement of reflection attenuation amounts are shown in FIG. 25. From FIG. 25, it is clear that the wave absorber of the present embodiment obtains a reflection attenuation amount of approximately 40 dB as its maximum attenuation amount. Moreover, it is clear that it exhibits wide-band attenuation properties having an effective absorption band of 320 MHz, in the case where the effective absorption band is defined as a frequency bandwidth having attenuation properties of 20 dB or more. In addition, from a comparison of this sixth embodiment with the fifth embodiment, it is clear that the optimal thickness value of the dielectric layers (2012, 2014, 2015, 2022, 2023, 2024, 2026) also changes due to the different forms of the patterns of the pattern layer 2016 and 2027. Furthermore, it is clear that wide-band attenuation properties are obtained by using forms such that each pattern differs in either or both of size and form relative to another adjacent pattern.

Seventh Embodiment

Figure 26:
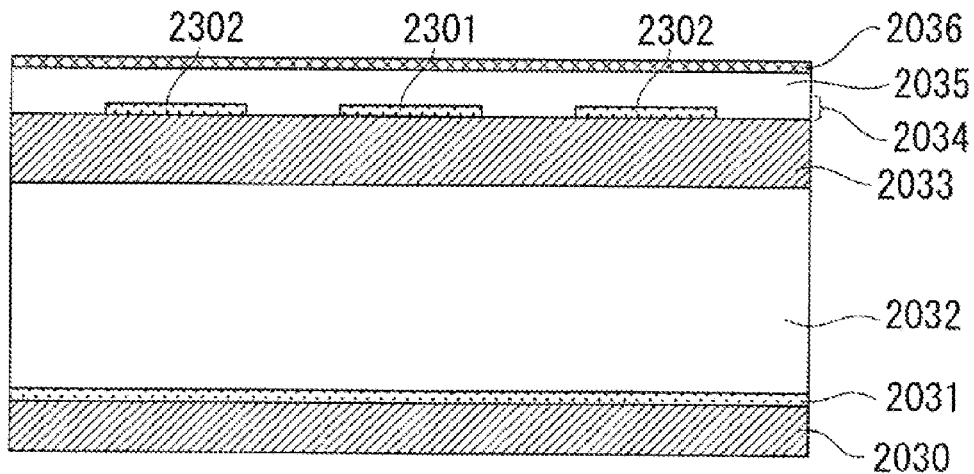
FIG. 26 is a partial sectional view of a wave absorber which is a seventh embodiment of the present invention.

FIG. 26 is a partial sectional view showing the schematic configuration of a wave absorber, which is a seventh embodiment of the present invention. The wave absorber of the present embodiment is configured by sequential lamination of a BT substrate 2030 constituting a protective layer, a conduct layer 2031, a PC substrate 2032 constituting a first dielectric layer A, a BT substrate 2033 constituting a first dielectric layer B, a pattern layer 2034, and a linear pattern resistance layer 2036.

The BT substrate 2030 has, for example, a thickness of 0.3 mm. The conduct layer 2031 is, for example, formed from copper foil of 12 μm thickness, and is disposed on the BT substrate 2030. The PC substrate 2032 is disposed on the conduct layer 2031, and has, for example, a thickness of 3.1 mm. The BT substrate 2033 is disposed on the PC substrate 2032, and has, for example, a thickness of 0.6 mm. The pattern layer 2034 is disposed on the BT substrate 2033. With respect to the pattern layer 2034, multiple loop patterns of differing shape formed by copper foil of 12 μm thickness are cyclically disposed on the top face of the BT substrate 2033. The linear pattern resistance layer 2036 is disposed on the PC substrate 2035.

Here, the linear pattern resistance layer 2036 is composed of linear patterns consisting of a high-resistance conductor. A high-resistance conductor signifies a conductor with a higher resistivity than the conduct layer 2031. Specifically, it constitutes a high-resistance conductor with a volume resistivity of 1.0 E-4 Ωcm or more and 1.0 E-1 Ωcm or less. For example, the linear pattern resistance layer 2036 is configured by creating a grid form where multiple linear patterns composed of a high-resistance conductor intersect. The linear patterns of the linear pattern resistance layer 2036 are set, for example, to a line width of 180 μm. Moreover, the line center interval which is the interval between the center axes of the respective linear patterns is set, for example, to 1.0 mm. This linear pattern resistance layer 2036 can be formed by screen printing using carbon paste. It is sufficient if said line center interval is an interval that allows the linear pattern resistance layer 2036 to function as a planar resistance layer, and it is preferable to set said line center interval at 1/16 or less of the wavelength of the EM waves that are the object of absorption.

Figure 27:
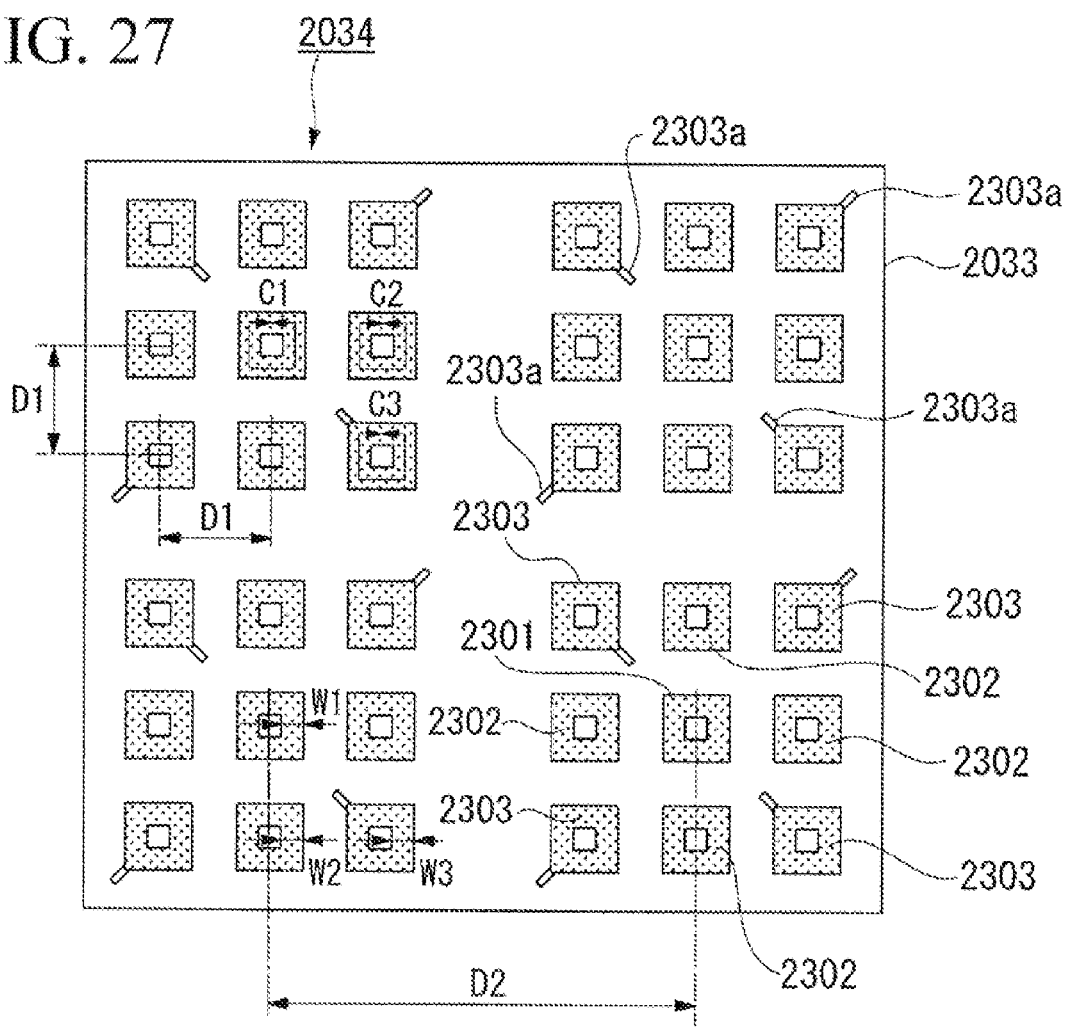
FIG. 27 is a partial plane view of the pattern layer in a wave absorber which is the same as the above.

FIG. 27 is a partial plan view of the pattern layer 2034 side of the wave absorber shown in FIG. 26. The pattern layer 2034 is composed of multiple loop patterns 2301, 2302, 2303 formed on the top face of the BT substrate 2033. The respective loop patterns 2301, 2302, 2303 are composed of copper foil with a thickness of 12 μm, and are regularly disposed at mutually fixed intervals on the top face of the BT substrate 2033. As shown in FIG. 27, loop patterns 2301, 2302, 2303 are square loops of respectively differing shape. The loop patterns 2301 have a center loop length C1 and line width W1. The loop patterns 2302 have a center loop length C2 and line width W2. The loop patterns 2303 have a center loop length C3 and line width W3. The mated center points of the adjacent loop patterns 2301, 2302, 2303 are disposed at positions separated to the extent of the center interval D1.

Furthermore, as shown in FIG. 27, the loop patterns 2303 are configured with affixation of projecting linear patterns (open stubs) 2303a to the loop-shaped lines. These open stubs 2303a are affixed to the apex of one part of the square loop. Open stub 2303a is a rectangle with a line width of 2.0 mm and a length of 3.5 mm, and the lengthwise direction of its rectangle is at a 45-degree angle relative to one side of the square loop. The dimensions of the respective parts of the loop patterns 2301, 2302, 2303 are shown in Table 2.

Figure 28:
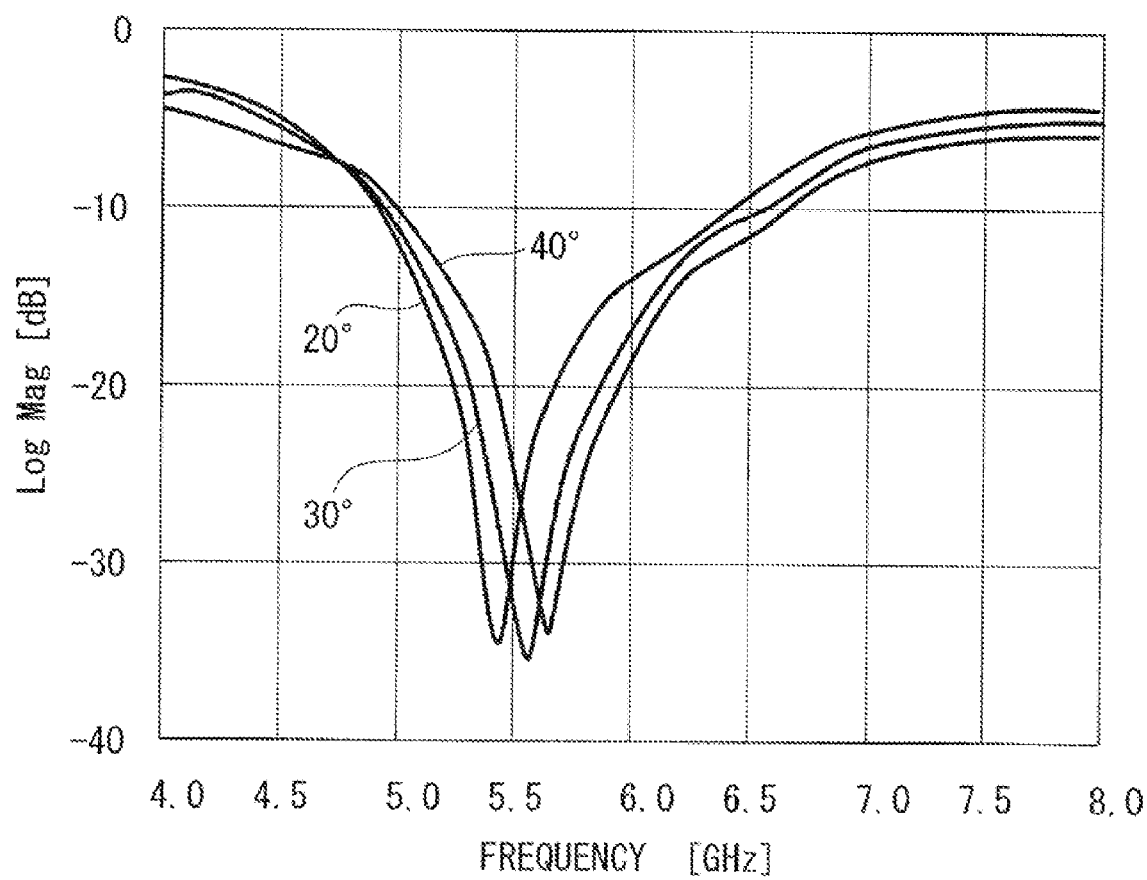
FIG. 28 is a figure showing the absorption properties in a wave absorber which is the same as the above.

With respect to the manufacturing method of the wave absorber of the present embodiment and the method of measuring its properties, the same technique as that of the fifth embodiment was used. The results of this measurement of reflection attenuation amounts are shown in FIG. 28. From FIG. 28, it is clear that the wave absorber of the present embodiment obtains an attenuation amount of approximately 35 dB as its maximum attenuation amount. Moreover, one finds that it has an effective absorption band of approximately 200 MHz, in the case where the effective absorption band is defined as a frequency bandwidth having attenuation properties of 20 dB or more. In addition, from a comparison of this seventh embodiment with the sixth embodiment, it is clear that the properties and the optimal thickness value of the dielectric layers change due to the different position of the linear pattern resistance layer composed of a high resistance conductor. Furthermore, it is clear that the fluctuation in properties relative to the angle of incidence is smaller in the sixth embodiment where the linear pattern resistance layer 2025 is disposed "between" the radio wave reflection layer (conduct layer 2021) and the pattern layer 2027 than in the seventh embodiment where the linear pattern resistance layer 2036 is disposed outside this "between" area.

Eighth Embodiment

Figure 29:
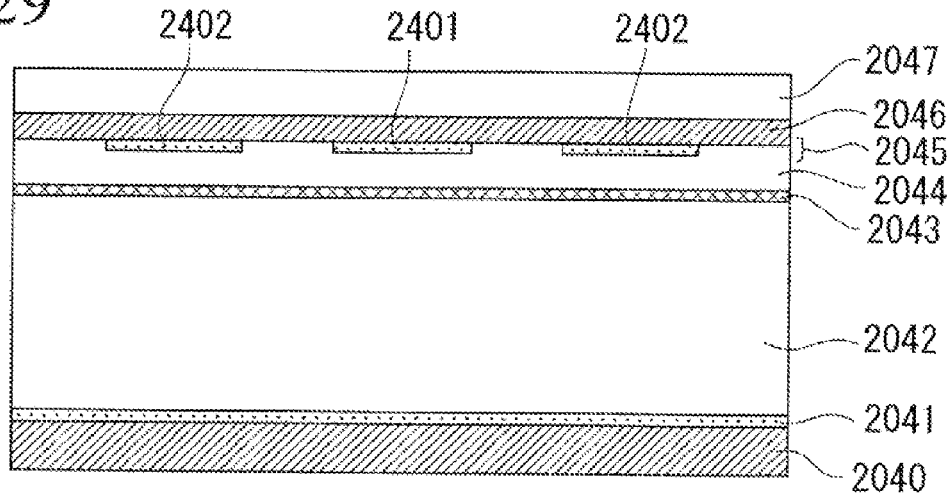
FIG. 29 is a partial sectional view of a wave absorber which is an eighth embodiment of the present invention.

FIG. 29 is a partial sectional view showing the schematic configuration of a wave absorber, which is an eighth embodiment of the present invention. The present embodiment configures a wave absorber that is transparent at a distance. The wave absorber of the present embodiment is configured by sequential lamination of a PET (polyethylene-terephthalate) substrate 2040 constituting a protective layer, a grid-like conductor layer 2041, a PC substrate 2042 constituting a first dielectric layer A, a linear pattern resistance layer 2043, a PC substrate 2044 constituting a second dielectric layer, a pattern layer 2045, a PET substrate 2046 constituting a protective layer, and a PC substrate 2047 constituting a protective layer.

The PET substrate 2040 has, for example, a thickness of 0.175 mm. The grid-like conductor layer 2041 is composed of a thin-lined conductor arranged in grid form, is disposed on the PET substrate 2040, and is formed from copper foil of 12 μm thickness. The PC substrate 2042 is disposed on the grid-like conductor layer 2041, and has, for example, a thickness of 3.0 mm. The linear pattern resistance layer 2043 is disposed on the PC substrate 2042. The PC substrate 2044 is disposed on the linear pattern resistance layer 2043, and has, for example, a thickness of 0.3 mm. The pattern layer 2045 is disposed on the PC substrate 2044. With respect to the pattern layer 2045, multiple loop patterns of differing shape formed by grid-like thin-lined copper foil of 12 μm thickness are cyclically disposed. The PET substrate 2046 is disposed on the pattern layer 2045, and has, for example, a thickness of 0.175 mm. The PC substrate 2047 is disposed on the PET substrate 2046, and has, for example, a thickness of 0.3 mm.

Here, the linear pattern resistance layer 2043 is composed of linear patterns consisting of a high-resistance conductor. A high-resistance conductor signifies a conductor with a higher resistivity than the grid-like conductor layer 2041. Specifically, it constitutes a high-resistance conductor with a volume resistivity of 1.0 E-4 Ωcm or more and 1.0 E-1 cm or less. For example, the linear pattern resistance layer 2043 is configured by creating a grid form where multiple linear patterns composed of a high-resistance conductor intersect. The linear patterns of the linear pattern resistance layer 2043 are set, for example, to a line width of 130 μm. Moreover, the line center interval which is the interval between the center axes of the respective linear patterns is set, for example, to 1.0 mm. This linear pattern resistance layer 2043 can be formed by screen printing using carbon paste. It is sufficient if said line center interval is an interval that allows the linear pattern resistance layer 2043 to function as a planar resistance layer, and it is preferable to set said line center interval at $\frac{1}{16}$ or less of the wavelength of the EM waves that are the object of absorption.

The grid-like conductor layer 2041 constitutes a grid form where multiple thin-lined patterns composed of a high-resistance conductor intersect. The linear patterns of the grid-like conductor layer 2041 are set, for example, to a line width of 10 μm. Moreover, the line center interval which is the interval between the center axes of the respective linear patterns is set, for example, to 0.3 mm. The grid-like conductor layer 2041 has the function of fully reflecting radio waves. It is sufficient if said line center interval is an interval that allows the radio waves to be fully reflected, and it is preferable to set said line center interval at $\frac{1}{16}$ or less of the wavelength of the EM waves that are the object of absorption. Or, instead of the grid-like conductor layer 241, it is also acceptable to use a conduct layer such as transparent ITO (indium tin oxide).

Figure 30:
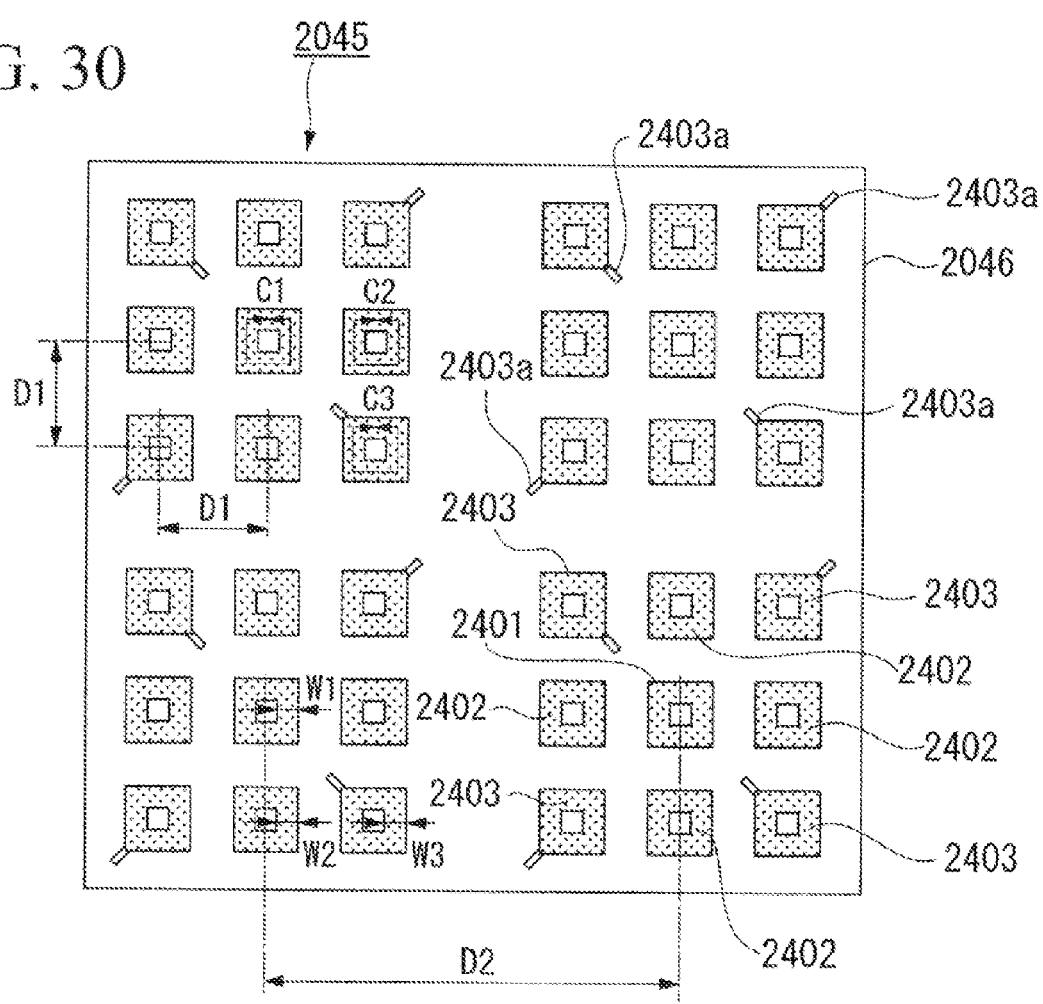
FIG. 30 is a partial plane view of the pattern layer in a wave absorber which is the same as the above.

FIG. 30 is a partial plan view of the pattern layer 2045 side of the wave absorber shown in FIG. 29. The pattern layer 2045 is composed of multiple loop patterns 2401, 2402, 2403 formed on the top face of the PET substrate 2045. The respective loop patterns 2401, 2402, 2403 are composed of grid-like thin-lined copper foil with a thickness of 12 μm, and are regularly disposed at mutually fixed intervals on the underside of the PET substrate 2046. As shown in FIG. 30, loop patterns 2401, 2402, 2403 are square loops of respectively differing shape. The loop patterns 2401 have a center loop length C1 and line width W1. The loop patterns 2402 have a center loop length C2 and line width W2. The loop patterns 2403 have a center loop length C3 and line width W3. The mated center points of the adjacent loop patterns 2401, 2402, 2403 are disposed at positions separated to the extent of the center interval D1.

Furthermore, as shown in FIG. 30, the loop patterns 2403 are configured with affixation of projecting linear patterns (open stubs) 2403a to the loop-shaped lines. These open stubs 2403a are affixed to the apex of one part of the square loop. Open stub 2403a is a rectangle with a line width of 2.0 mm and a length of 3.0 mm, and the lengthwise direction of its rectangle is at a 45-degree angle relative to one side of the square loop. The dimensions of the respective parts of the loop patterns 2401, 2402, 2403 are shown in Table 2.

Figure 31:
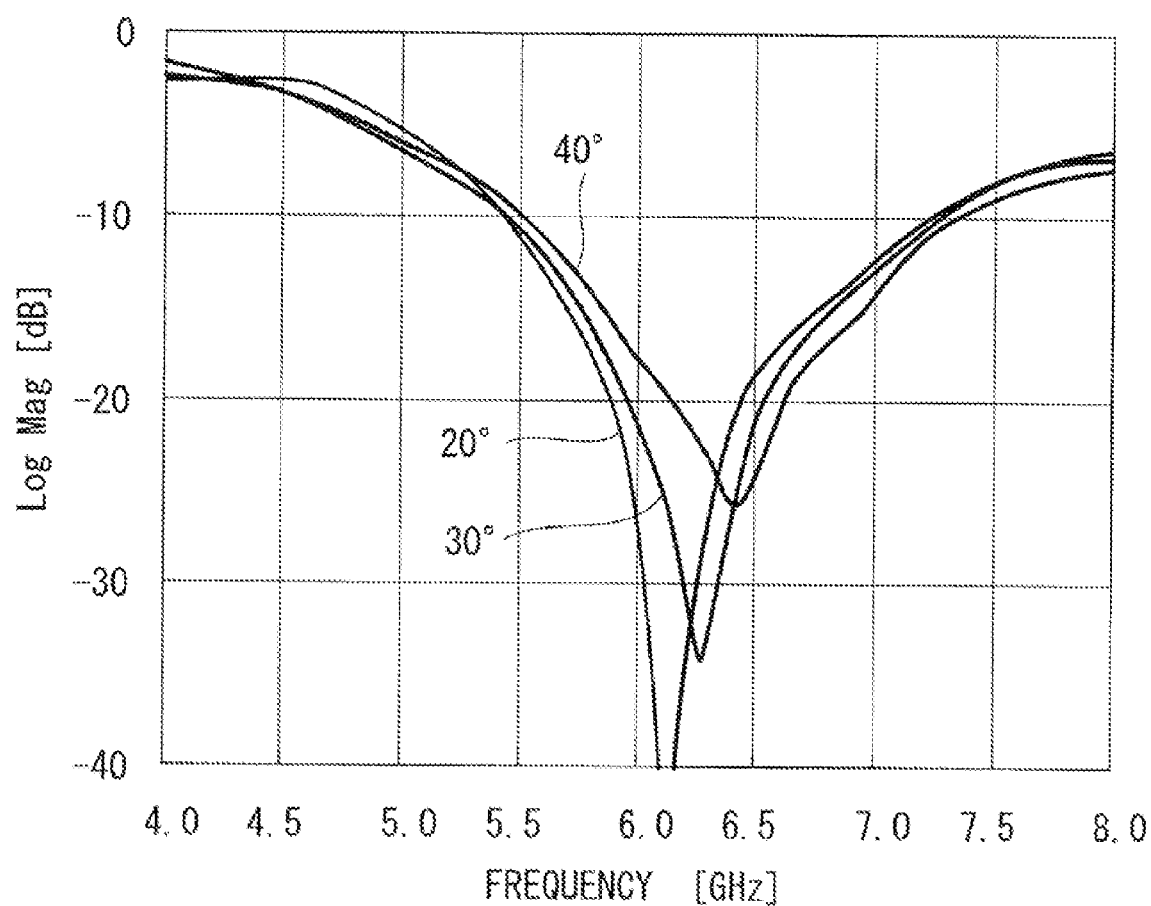
FIG. 31 is a figure showing the absorption properties in a wave absorber which is the same as the above.

With respect to the manufacturing method of the wave absorber of the present embodiment and the method of measuring its properties, the same technique as that of the fifth embodiment was used. The results of this measurement of reflection attenuation amounts are shown in FIG. 31. From FIG. 31, it is clear that the wave absorber of the present embodiment obtains an attenuation amount of approximately 40 dB as its maximum attenuation amount. Moreover, it has wide-band attenuation properties having an effective absorption band of approximately 300 MHz, in the case where the effective absorption band is defined as a frequency bandwidth having attenuation properties of 20 dB or more. Furthermore, the wave absorber of the present embodiment is a wave absorber that is transparent at a distance. Accordingly, according to the present embodiment, it is possible to offer a high-performance wave absorber that can avoid blockage and the like of the visual field.

REFERENCE EXAMPLE 3

Next, a reference example is cited and described in order to demonstrate the effects of the linear pattern resistance layer and the like in the wave absorber of the present embodiments.

Figure 32:
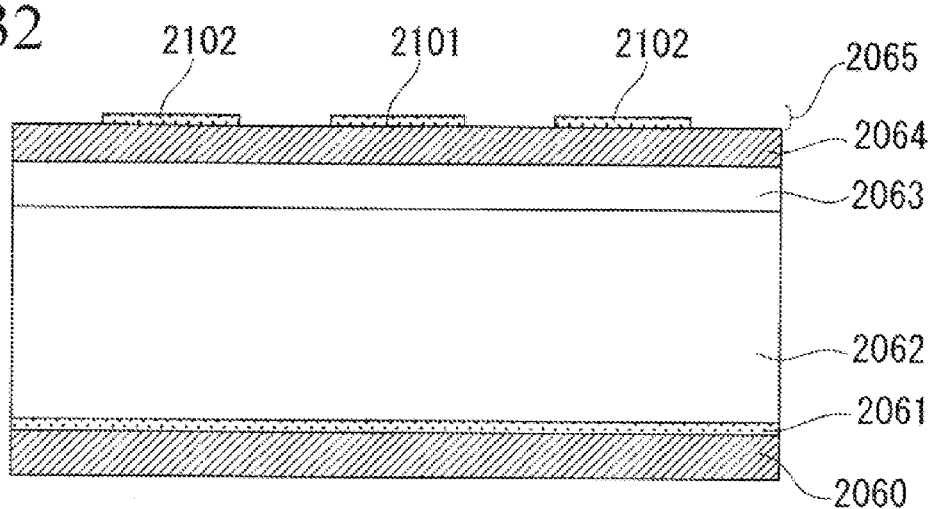
FIG. 32 is a partial sectional view of a wave absorber which is a third reference example relative to the embodiments of the present invention.

FIG. 32 is a partial sectional view showing the schematic configuration of a wave absorber, which is a third reference example relative to the present embodiments. The wave absorber of this reference example 3 has a structure where only the linear pattern resistance layer 2013 is removed from the structure of the fifth embodiment. Specifically, it is configured by sequential lamination of a BT substrate 2060 that functions as a protective layer, a conduct layer 2061, a PC substrate 2062 constituting a first dielectric layer, a PC substrate 2063 constituting a second dielectric layer A, a BT substrate 2064 constituting a second dielectric layer B, and a pattern layer 2065.

The BT substrate 2060 has, for example, a thickness of 0.3 mm. The conduct layer 2061 is disposed on the BT substrate 2060, and functions as a radio wave reflection layer. The conduct layer 2061 is configured with copper foil of 12 μm thickness. The PC substrate 2062 is disposed on the conduct layer 2061, and has a thickness of 3.0 mm. The PC substrate 2063 is disposed on the PC substrate 2062, and has a thickness of 0.3 mm. The BT substrate 2064 is disposed on the PC substrate 2063, and has a thickness of 0.3 mm. The pattern layer 2065 is disposed on the BT substrate 2064. With respect to the pattern layer 2065, as with the pattern layer 2016 of the fifth embodiment, multiple loop patterns formed by copper foil of 12 μm thickness are cyclically disposed on the top face of the BT substrate.

Figure 33:
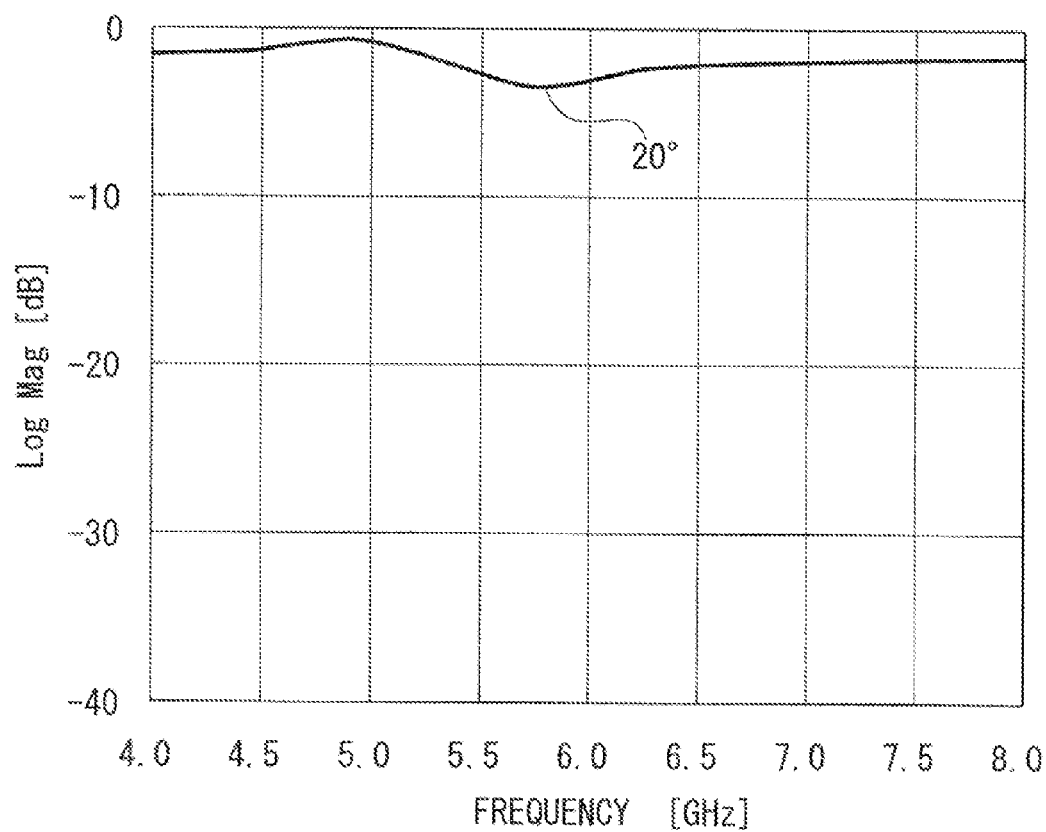
FIG. 33 is a figure showing the absorption properties in the wave absorber of a third reference example which is the same as the above.

With respect to the manufacturing method of the wave absorber of reference example 3 and the method of measuring its properties, the same technique as that of the fifth embodiment was used. The results of this measurement of reflection attenuation amounts are shown in FIG. 33. As shown by FIG. 33, it is clear that the wave absorber of reference example 3 only obtains an attenuation amount of approximately 3.4 dB as its maximum attenuation amount.

REFERENCE EXAMPLE 4

Next, another reference example is cited and described in order to demonstrate the effects of the linear pattern resistance layer and the like in the wave absorber of the present embodiments.

Figure 34:
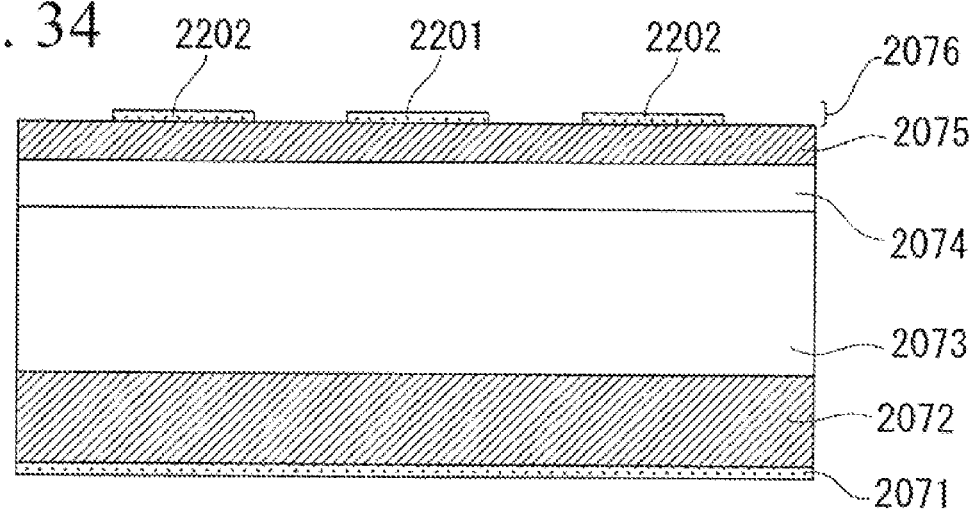
FIG. 34 is a partial sectional view of a wave absorber which is a fourth reference example relative to the embodiments of the present invention.

FIG. 34 is a partial sectional view showing the schematic configuration of a wave absorber, which is a fourth reference example relative to the present embodiments. The wave absorber of this reference example 4 has a structure where only the linear pattern resistance layer 2025 is removed from the structure of the sixth embodiment. Specifically, it is configured by sequential lamination of a conduct layer 2071, a BT substrate 2072 constituting a first dielectric layer A, a PC substrate 2073 constituting a first dielectric layer B, a PC substrate 2074 constituting a first dielectric layer C, a BT substrate 2075 constituting a second dielectric layer, and a pattern layer 2076.

The conduct layer 2071 is formed with copper foil of 12 μm thickness. The BT substrate 2072 is disposed on the conduct layer 2071, and has a thickness of 0.8 mm. The PC substrate 2073 is disposed on the BT substrate 2072, and has a thickness of 1.5 mm. The PC substrate 2074 is disposed on the PC substrate 2073, and has a thickness of 0.3 mm. The BT substrate 2075 is disposed on the PC substrate 2074, and has a thickness of 0.3 mm. The pattern layer 2076 is disposed on the BT substrate 2075. With respect to the pattern layer 2076, as with the pattern layer 2027 of the sixth embodiment, multiple loop patterns of differing form formed by copper foil of 12 μm thickness are cyclically disposed.

Figure 35:
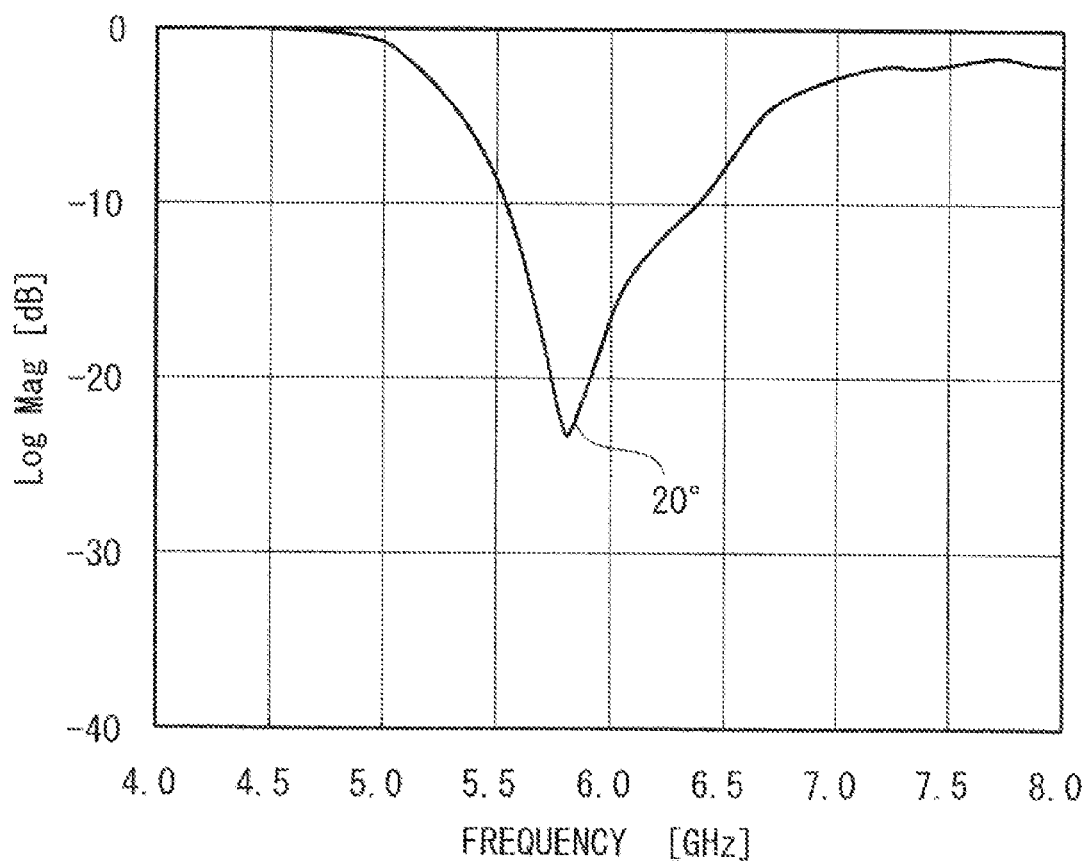
FIG. 35 is a figure showing the absorption properties in the wave absorber of a fourth reference example which is the same as the above.

With respect to the manufacturing method of the wave absorber of reference example 4 and the method of measuring its properties, the same technique as that of the fifth embodiment was used. The results of this measurement of reflection attenuation amounts are shown in FIG. 35. As shown by FIG. 35, it is clear that the wave absorber of reference example 4 has an attenuation amount of approximately 16 dB, exhibiting lower radio wave absorption performance than the sixth embodiment.

From the foregoing, it is clear that the wave absorbers of the fifth through the eighth embodiments of the present invention, which have the linear pattern resistance layers 2013, 2025, 2036 and 2043 (high-resistance conductor layers), exhibit better attenuation properties than the wave absorbers of reference examples 3 and 4 which do not have these. It is further clear that even better attenuation properties are obtained by providing a high-resistance conductor layer as an intermediate layer. Accordingly, by creating a structure where the center frequency of the attenuation properties conforms to 5.8 GHz, the wave absorbers of the fifth through the eighth embodiments of the present invention are able to exhibit adequate performance as wave absorbers for use in ETC systems and the like.

TABLE 2

| | Length of each part | | | | | | |
|---|---|---|---|---|---|---|---|
| | C1 [mm] | C2 [mm] | C3 [mm] | W1 [mm] | W2 [mm] | W3 [mm] | D1 [mm] | D2 [mm] |
| Fifth embodiment | 36.0 | 36.0 | 36.0 | 2.0 | 2.0 | 2.0 | 16.4 | 56.0 |
| Sixth embodiment | 31.7 | 27.5 | 23.3 | 4.76 | 4.76 | 4.76 | 16.4 | 57.5 |
| Seventh embodiment | 30.0 | 22.4 | 20.2 | 4.5 | 5.6 | 5.05 | 15.5 | 54.0 |
| Eighth embodiment | 30.0 | 26.0 | 22.0 | 4.5 | 4.5 | 4.5 | 15.5 | 56.0 |
| Reference example 3 | 36.0 | 36.0 | 36.0 | 2.0 | 2.0 | 2.0 | 16.4 | 56.0 |
| Reference example 4 | 31.7 | 27.5 | 23.3 | 4.76 | 4.76 | 4.76 | 16.4 | 57.5 |

Ninth Embodiment

Figure 36:
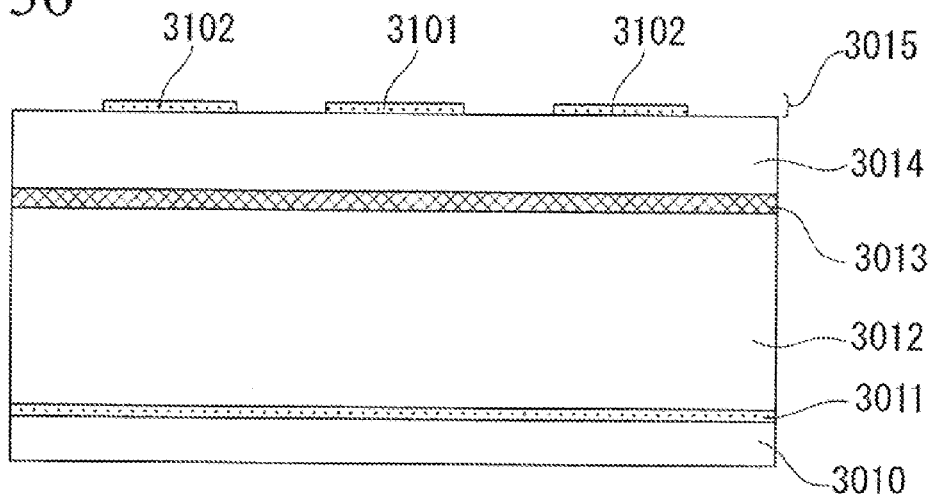
FIG. 36 is a partial sectional view of a wave absorber which is a ninth embodiment of the present invention.

FIG. 36 is a partial sectional view showing the schematic configuration of a wave absorber, which is a ninth embodiment of the present invention. In the wave absorber of the present embodiment, the planar resistance layer also serves as an adhesive layer. The wave absorber of the present embodiment is configured by sequential lamination of a GE (glass epoxy) substrate 3010 constituting a protective layer, a conduct layer 3011, a GE substrate 3012 constituting a first dielectric layer, a planar resistance layer 3013 composed of a carbon-dispersed GE substrate, a GE substrate 3014 constituting a second dielectric layer, and a pattern layer 3015.

The protective layer 3010 has, for example, a thickness of 0.3 mm. The conduct layer 3011 is disposed on the protective layer 3010, and is, for example, formed from copper foil of 18 μm thickness. The GE substrate 3012 is disposed on the conduct layer 3011, and has, for example, a thickness of 2.0 mm. The planar resistance layer 3013 is disposed on the GE substrate 3012, and has, for example, a thickness of 0.1 mm. The GE substrate 3014 is disposed on the planar resistance layer 3013, and has, for example, a thickness of 0.6 mm. With respect to the pattern layer 3015, multiple loop patterns of differing shape formed by copper foil of 18 μm thickness are cyclically disposed.

Here, the planar resistance layer 3013 composed of a carbon-dispersed GE substrate functions as a prepreg enabling bonding of the mated GE substrates by impregnating glass cloth with epoxy resin in which conductive carbon powder has been dispersed and mixed. That is, the GE substrate 3012 and GE substrate 3014 are bonded by the planar resistance layer 3013.

Figure 37:
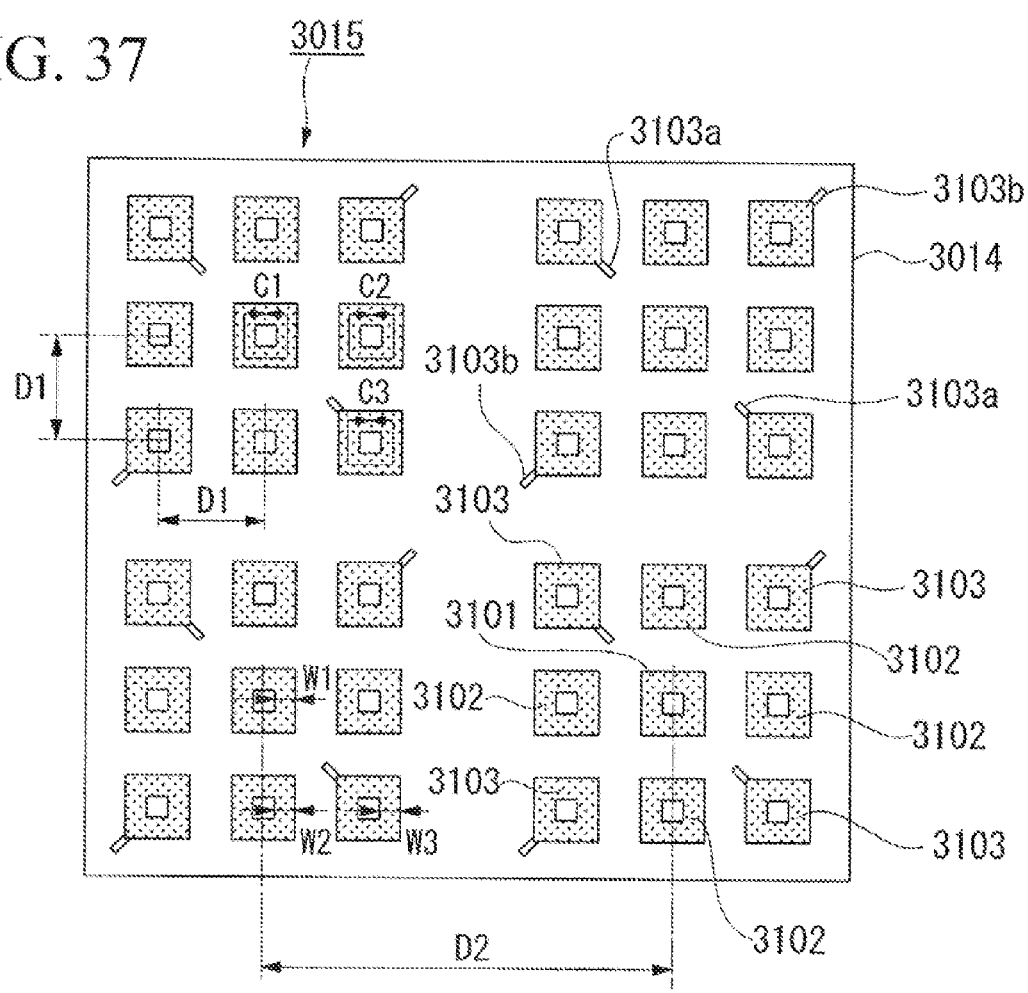
FIG. 37 is a partial plane view of the pattern layer in a wave absorber which is the same as the above.

FIG. 37 is a partial plan view of the pattern layer 3015 side of the wave absorber shown in FIG. 36. The pattern layer 3015 is composed of multiple loop patterns 3101, 3102, 3103 formed on the top face of the GE substrate 3014. The respective loop patterns 3101, 3102, 3103 are composed of copper foil with a thickness of 18 μm, and are regularly disposed at mutually fixed intervals on the top face of the GE substrate 3014. As shown in FIG. 37, loop patterns 3101, 3102, 3103 are square loops of respectively differing shape. The loop patterns 3101 have a center loop length C1 and line width W1. The loop patterns 3102 have a center loop length C2 and line width W2. The loop patterns 3103 have a center loop length C3 and line width W3. The mated center points of the adjacent loop patterns 3101, 3102, 3103 are disposed at positions separated to the extent of the center interval D1.

Furthermore, as shown in FIG. 37, the loop patterns 3103 are configured with affixation of projecting linear patterns (open stubs) 3103a and 3103b to the loop-shaped lines. These open stubs 3103a and 3103b are affixed to the apex of one part of the square loop. Open stub 3103a is a rectangle with a line width of 2.0 mm and a length of 2.1 mm, while open stub 3103b is a rectangle with a line width of 2.0 mm and a length of 4.1 mm, and the lengthwise direction of their rectangles is at a 45-degree angle relative to one side of the square loop. The dimensions of the respective parts of the loop patterns 3101, 3102, 3103 are shown in Table 3.

As the method of forming the pattern layer 3015 having these loop patterns 3101, 3102, 3103, one may apply, for example, the following technique. That is, the loop patterns 3101, 3102, 3103 are patterned and formed by conducting etching in the same manner as patterning of ordinary print circuit boards with respect to the GE substrate on the surface of which copper foil is formed. In the etching, one uses, for example, a photo resist mask and ferric chloride.

It is also acceptable to form loop patterns 3101, 3102, 3103 using the inkjet method. For example, an inkjet nozzle is used that has the same configuration as the one used in inkjet printers. Liquid material containing conductive material and the like is discharged as droplets from the inkjet nozzle onto the specified region. The discharged liquid material becomes the conductor of the prescribed pattern by drying or annealing, and the loop patterns 3101, 3102, 3103 are completed. When the loop patterns 3101, 3102, 3103 are formed by the ink jet method, etching or the like is rendered unnecessary. Accordingly, one can eliminate wastage of material due to etching or the like, and reduce manufacturing costs. Moreover, as design and manufacture of mask patterns and the like in forming the loop patterns 3101, 3102, 3103 are also rendered unnecessary, manufacturing costs can be further reduced.

With respect to loop patterns 3101, 3102, 3103, it is preferable that the respective line widths W1 be a value that is from 5 to 25 percent of the center loop length C1. Moreover, it is preferable that the line width W1 of the loop patterns 3101 have a length that is from 60 percent to 140 percent of the effective wavelength (λg, see the below Formula 3) of the EM waves that are the object of absorption of the substrate pattern face.

$$\lambda g = \lambda_0 \times \sqrt{(2/(\in_r + 1))}$$ Formula 3

($\lambda_0$: free space wavelength, $\in_r$: relative dielectric constant of substrate)

Figure 38:
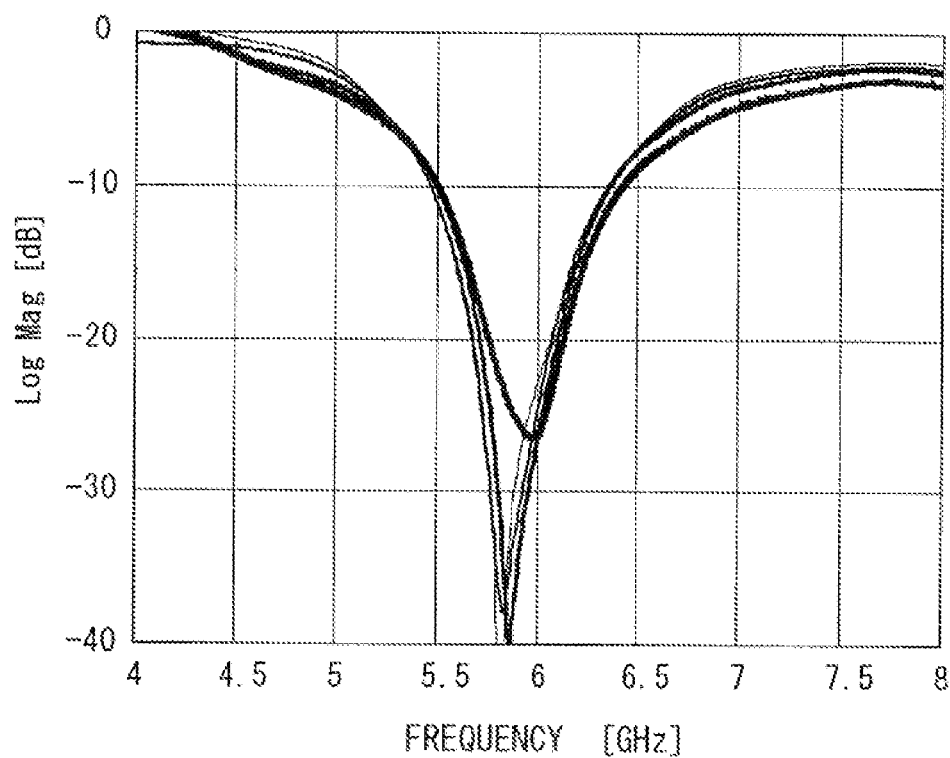
FIG. 38 is a figure showing the absorption properties in a wave absorber which is the same as the above.

Next, the wave absorber of the present embodiment configured in the aforementioned manner was measured by the measurement method for radio wave properties used in said first embodiment. The difference (power ratio) of the receiving level of the metal reflecting plate (Cu plate) and the receiving level of the wave absorber (measurement sample) measured in this manner was evaluated as the reflection attenuation amount. FIG. 38 shows the measurement results when the angle of incidence of the radio waves was set to 15 degrees, 20 degrees, 30 degrees and 40 degrees relative to the measurement sample. From FIG. 38, it is clear that the wave absorber of the present embodiment obtains an attenuation amount of approximately 40 dB as the maximum attenuation amount. Moreover, one finds that it has wide-band attenuation properties with an effective absorption band of approximately 300 MHz, in the case where the effective absorption band is defined as a frequency bandwidth having attenuation properties of 20 dB or more.

REFERENCE EXAMPLE 5

Next, a fifth reference example is cited and described in order to demonstrate the effects of the wave absorber of the present embodiments.

Figure 39:
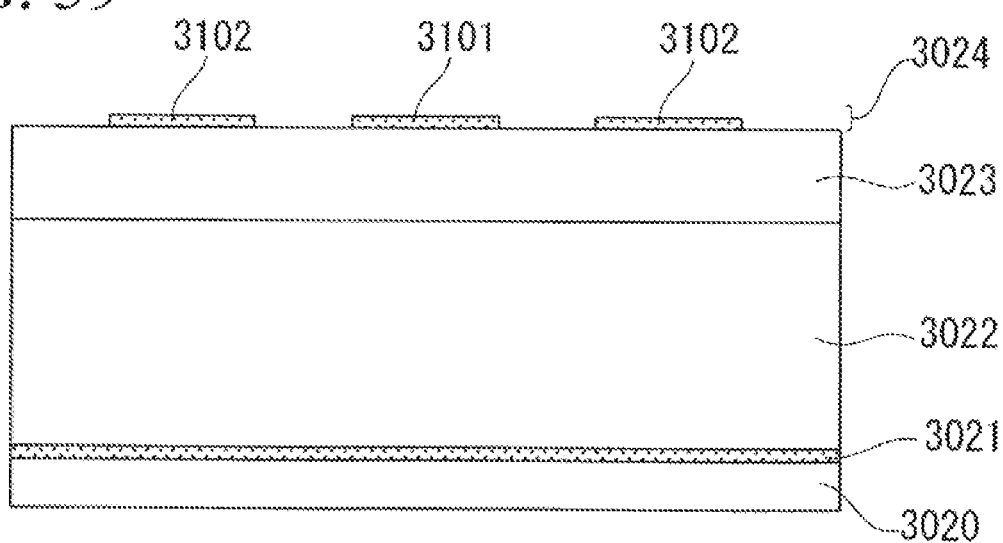
FIG. 39 is a partial sectional view of a wave absorber which is a fifth reference example relative to the embodiments of the present invention.

FIG. 39 is a partial sectional view showing the schematic configuration of a wave absorber, which is a fifth reference example relative to the present embodiments. The wave absorber of this reference example 5 has a structure where the planar resistance layer 13 is removed from the structure of the ninth embodiment of the present invention shown in FIG. 36, etc. Specifically, it is configured by sequential lamination of a GE substrate 3020 that functions as a protective layer, a conduct layer 3021, a GE substrate 3022 constituting a first dielectric layer, a GE substrate 3023 constituting a second dielectric layer, and a pattern layer 3024.

The GE substrate 3020 has a thickness of 0.3 mm. The conduct layer 3021 is disposed on the GE substrate 3020, and functions as a radio wave reflection layer. The conduct layer 3021 is configured from copper foil of 18 μm thickness. The GE substrate 3022 is disposed on the conduct layer 3021, and has a thickness of 2.0 mm. The GE substrate 3023 is disposed on the GE substrate 3022, and has a thickness of 0.6 mm. With respect to the pattern layer 3024, as with the pattern layer 3015 of the ninth embodiment, multiple loop patterns formed by copper foil of 18 μm thickness are cyclically disposed on the top face of the GE substrate.

Figure 40:
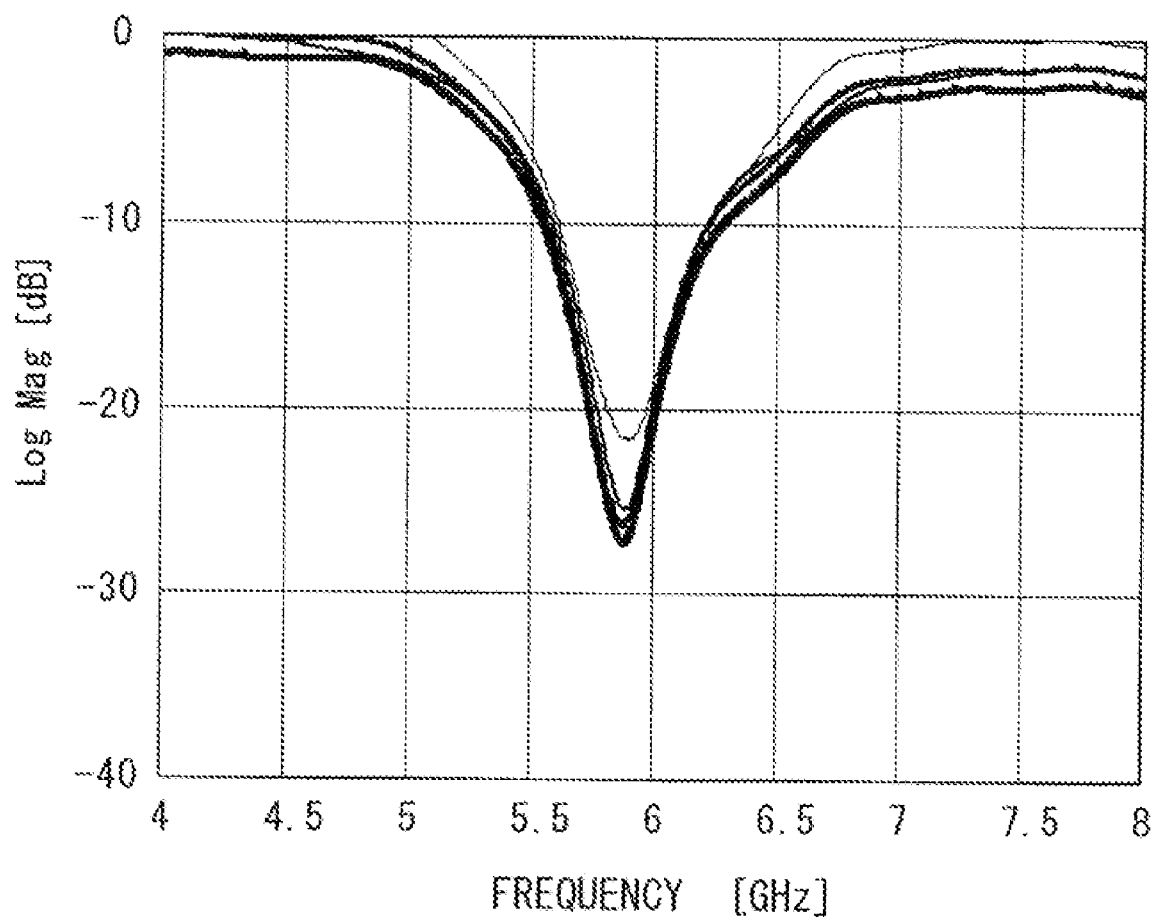
FIG. 40 is a figure showing the absorption properties in the wave absorber of a fifth reference example which is the same as the above.

With respect to the manufacturing method of the wave absorber of reference example 5 and the method of measuring its properties, the same technique as that of the ninth embodiment was used. The results of this measurement of reflection attenuation amounts are shown in FIG. 40. As shown by FIG. 40, it is clear that the wave absorber of reference example 5 has an attenuation amount of approximately 26 dB, and has an effective absorption band of approximately 150 MHz in the case where the effective absorption band is defined as a frequency bandwidth having attenuation properties of 20 dB or more, exhibiting lower radio wave absorption performance than the ninth embodiment.

From the foregoing, it is clear that the wave absorber of the ninth embodiment of the present invention exhibits better attenuation properties than the wave absorber of reference example 5 due to the existence of the planar resistance layer 3013. Accordingly, by creating a structure where the center frequency of the attenuation properties conforms to 5.8 GHz, the wave absorber of the ninth embodiment of the present invention is able to exhibit adequate performance as a wave absorber for use in ETC systems and the like.

TABLE 3

| | Length of each part | | | | | | | |
|---|---|---|---|---|---|---|---|---|
| | C1 [mm] | C2 [mm] | C3 [mm] | W1 [mm] | W2 [mm] | W3 [mm] | D1 [mm] | D2 [mm] |
| Ninth embodiment | 31.0 | 27.0 | 23.0 | 4.75 | 4.75 | 4.75 | 16.0 | 56.0 |
| Reference example 5 | 31.0 | 27.0 | 23.0 | 4.75 | 4.75 | 4.75 | 16.0 | 56.0 |

EXAMPLE 1

Figure 41:
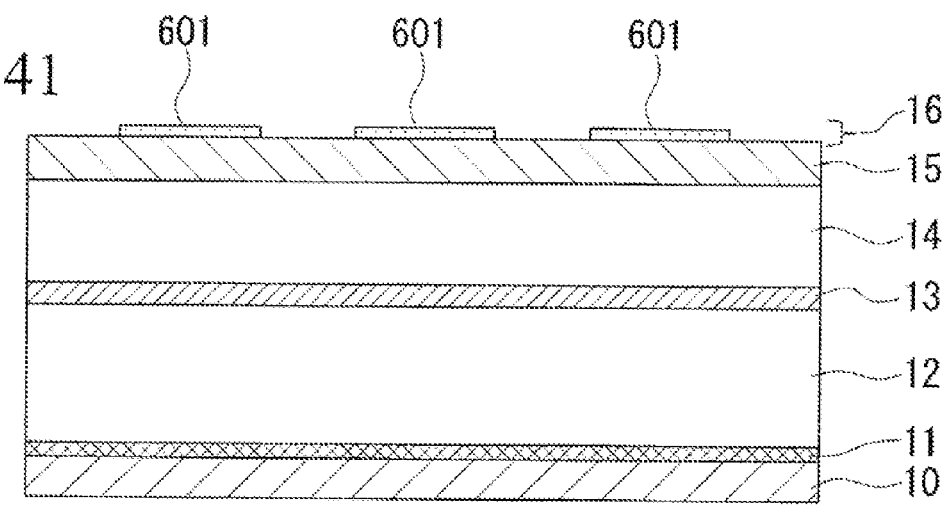
FIG. 41 is a sectional view of the wave absorber which is Example 1 of the present invention.

FIG. 41 is a sectional view showing the schematic configuration of a wave absorber, which is a first implementing example of the present invention. The wave absorber of the present implementing example is configured by sequential lamination atop a BT (bismaleimide-triazine) substrate 10 of a grid-like conductor layer 11, polycarbonate substrate 12, high-resistance conductor layer 13, laminate of polycarbonate substrate 14 and BT substrate 15, and pattern layer 16.

The BT substrate 10 functions as a protective layer, and has a thickness of 0.3 mm. The grid-like conductor layer 11 is formed with copper foil (i.e., an electric conductor) of 12 μm thickness. The polycarbonate substrate 12 constitutes the first dielectric layer, and has a thickness of 1.0 mm. The high resistance layer 13 is composed of a PET (polyethylene terephthalate) sheet of 175 μm thickness containing ITO (indium tin oxide), and has a surface resistance value (sheet resistance value) of 500 Ω/□. The polycarbonate substrate 14 constitutes a second dielectric layer A, and has a thickness of 0.8 mm. The BT substrate 15 constitutes a second dielectric layer B, and has a thickness of 0.3 mm. With respect to the pattern layer 16, multiple loop patterns of differing shape formed by copper foil of 12 μm thickness are cyclically disposed.

Here, the copper foil of the grid-like conductor layer 11 has a grid form with a line width of 50 μm and a line center interval of 1.4 mm, and serves the function of fully reflecting radio waves. It is sufficient if said line center interval is an interval that allows full reflection of radio waves, and it is preferable to set said line center interval at 1/16 or less of the wavelength of the EM waves that are the object of absorption. Or a conduct layer may be used instead of the grid-like conductor layer 11. In addition, it is preferable that the high-resistance conductor layer 13 have a surface resistivity (sheet resistance value) in a range from 100 Ω/□ to 100 kΩ/□.

Figure 42:
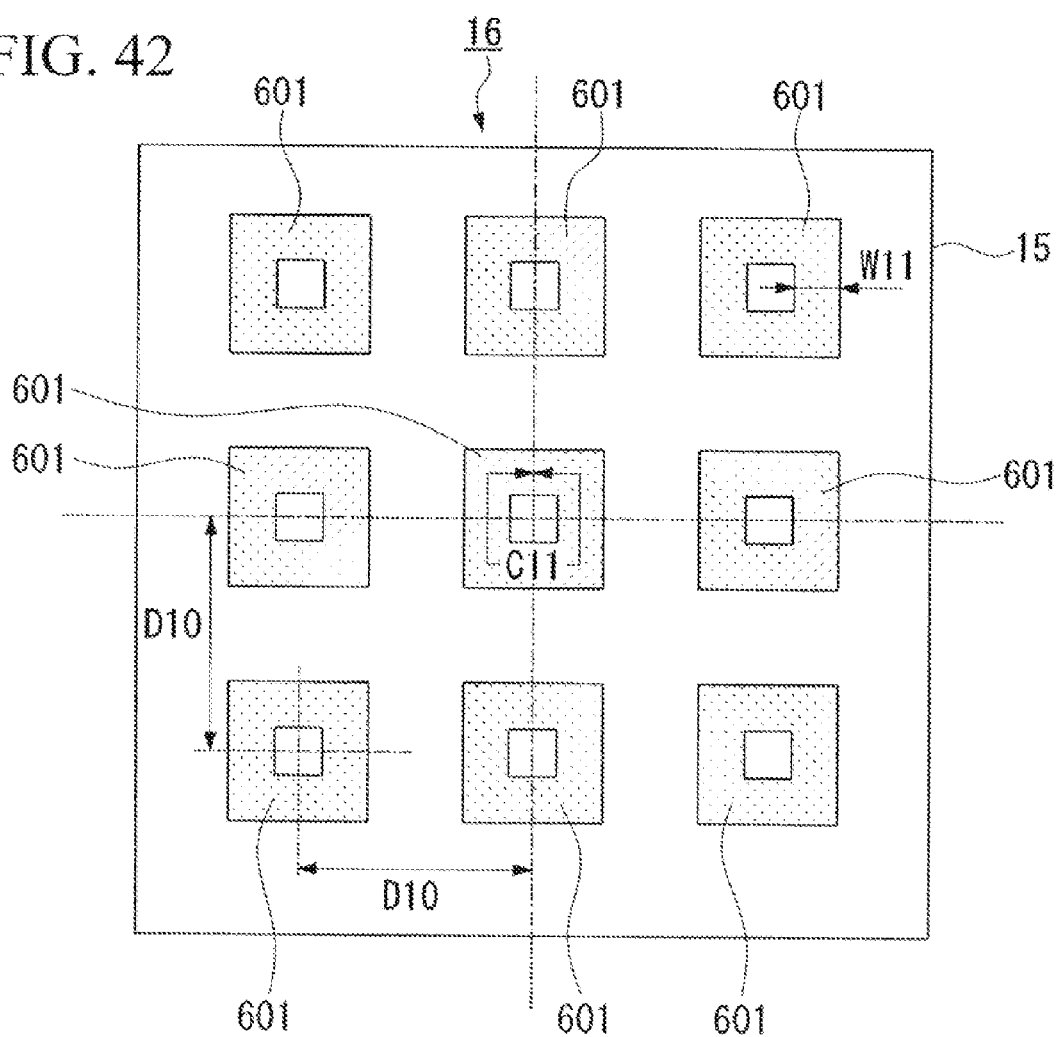
FIG. 42 is a plane view showing details of the pattern layer in a wave absorber which is the same as the above.

FIG. 42 is a plan view of the wave absorber shown in FIG. 41, and is a drawing that shows the detailed configuration of the pattern layer 16. The pattern layer 16 is composed of multiple loop patterns 601 formed on the top face of the BT substrate 15. The respective loop patterns 601 are composed of copper foil with a thickness of 12 μm, and are cyclically (i.e., regularly at mutually fixed intervals) disposed on the top face of the BT substrate 15. As shown in FIG. 42, the loop patterns 601 are square loop patterns of identical shape, and are square loops with a center loop length C11 and line width W11. Here, the center loop length signifies the length of the center axis in the lengthwise direction of the lines constituted by the loop patterns 601 (hereinafter the same). The mated center points of adjacent loop patterns 601 are disposed at positions separated to the extent of the center interval D10.

The pattern layer 16 having these loop patterns 601 may be formed in the same way as ordinary print wiring boards. That is, the pattern layer 16 is patterned and formed by conducting etching that uses a photo resist mask and ferric chloride with respect to the BT substrate on the surface of which copper foil is formed. The dimensions of the respective parts of the loop patterns 601 are shown in Table 2.

With respect to loop patterns 601, it is preferable that the respective line widths W11 be a value that is from 5 to 25 percent of the center loop length C11. Moreover, it is preferable that the line width W11 of the loop patterns 601 have a length that is from 60 percent to 140 percent of the effective wavelength ($\lambda$g, see Formula 4) of the EM waves that are the object of absorption of the substrate pattern face.

$$\lambda g = \lambda_0 \times \sqrt{(2/(\epsilon_r + 1))} \qquad \text{Formula 4}$$

($\lambda_0$ free space wavelength, $\epsilon_r$: relative dielectric constant of substrate)

Next, a description is given of the measurement method for radio wave properties of the wave absorber of the present implementing example configured in the aforementioned manner. First, pyramid-cone-shaped wave absorbers with a reflection amount of −40 dB or less relative to radio waves of the prescribed frequency that are the object of measurement (the object of absorption) are installed on the walls, floor and to the side of the measurement plane inside the measurement chamber. A transmitting horn antenna is then disposed so that the angle of incidence of radio waves relative to the measurement sample (this wave absorber) is at the prescribed angle (e.g., 20 degrees from the front face). A receiving horn antenna is installed in a direction facing the EM waves emitted from the transmitting horn antenna that have been reflected by the measurement sample (the direction of optical reflection). Here, the transmitting horn antenna uses a right-handed polarized wave horn antenna, and the receiving horn antenna uses a left-handed polarized wave horn antenna.

As a result of this configuration, the radio waves emitted from the transmitting horn antenna are fully reflected by the metal plate, changing their rotational direction, and are received by the receiving horn antenna. Subsequently, these transmitting and receiving horn antennae are connected to a vector network analyzer (Agilent 8722ES), and the S parameter (S21) is measured by isolating only the incoming radio waves reflected from the measurement sample (the wave absorber) using the free-space time domain method.

First, a metal reflecting plate (Cu plate) is installed at a position which is approximately 100 cm distant from the respective antennae, radio waves of the prescribed frequency and prescribed intensity are emitted from the transmitting horn antenna, and the receiving level of the receiving antenna is measured. Next, in place of the metal reflecting plate (Cu plate), a measurement sample (wave absorber) of identical size is installed at the same position as the aforementioned metal reflecting plate (Cu plate), radio waves identical to the radio waves emitted to said metal reflecting plate (Cu plate) are emitted from the transmitting horn antenna, and the receiving level of the receiving antenna at this time is measured.

Figure 43:
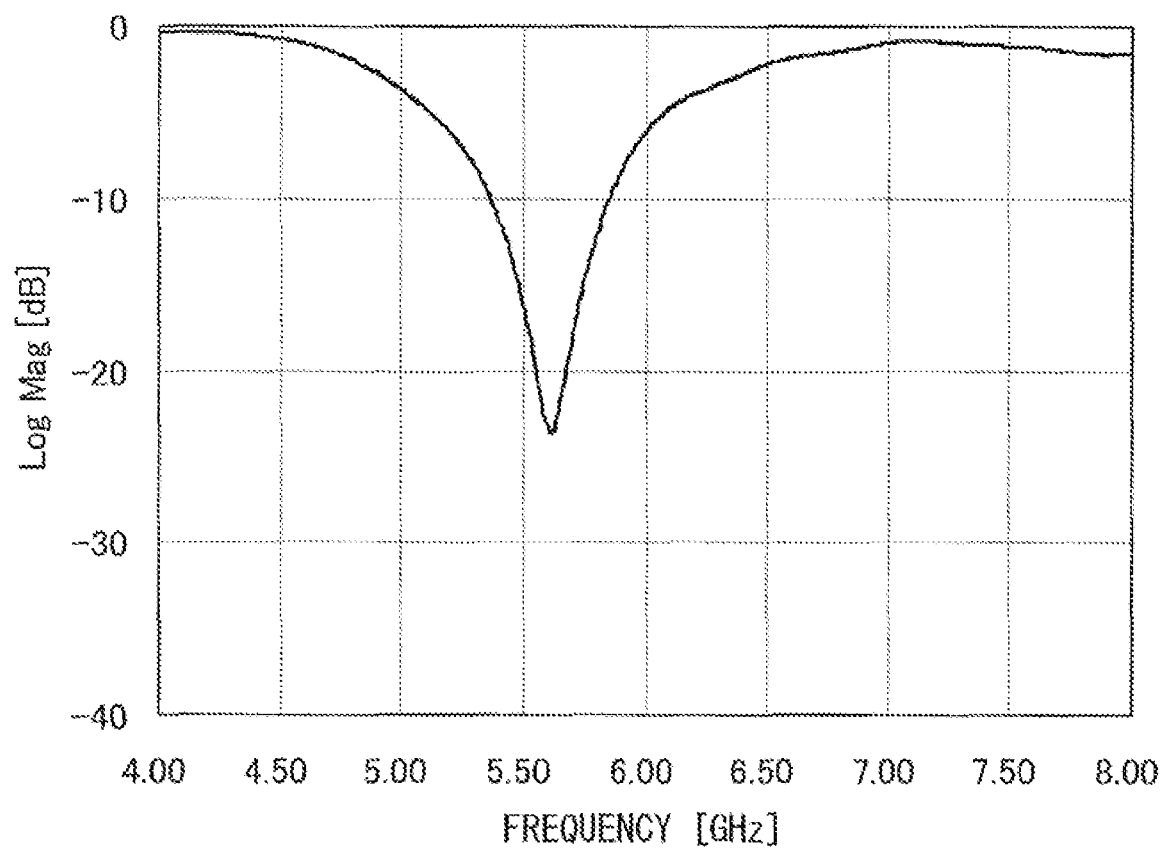
FIG. 43 is a figure showing the absorption properties in a wave absorber which is the same as the above.

The difference (power ratio) of the receiving level of the metal reflecting plate (Cu plate) and the receiving level of the wave absorber measured in this manner was evaluated as the reflection attenuation amount. An example of these results is shown in FIG. 43. From FIG. 43, it is clear that an attenuation amount of 24 dB is obtained as the maximum attenuation amount.

EXAMPLE 2

Figure 44:
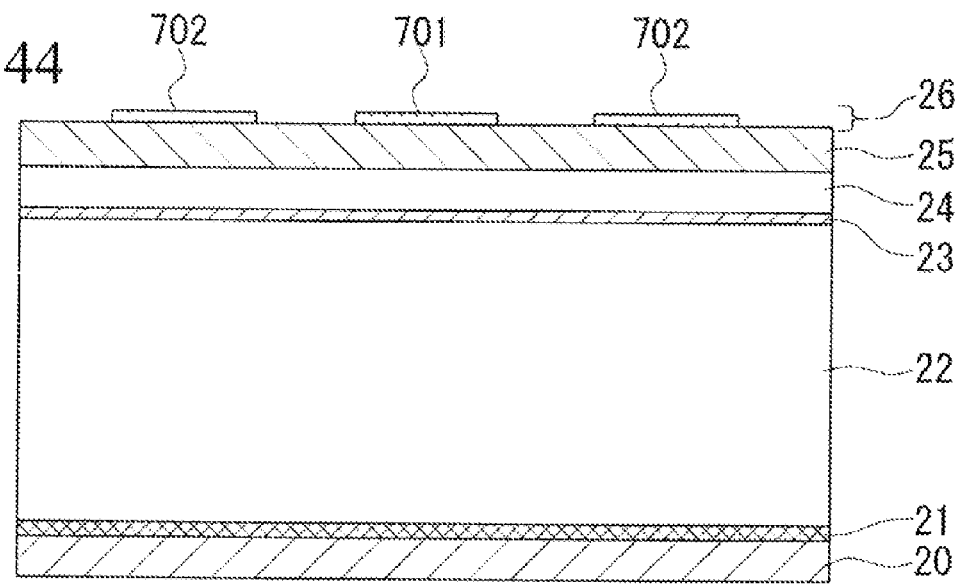
FIG. 44 is a sectional view of the wave absorber which is Example 2 of the present invention.

FIG. 44 is a sectional view showing the schematic configuration of a wave absorber, which is a second implementing example of the present invention. The wave absorber of the present implementing example is configured by sequential lamination atop a BT substrate 20 of a grid-like conductor layer 21, polycarbonate substrate 22, high-resistance conductor layer 23, laminate of polycarbonate substrate 24 and BT substrate 25, and pattern layer 26.

The BT substrate 20 functions as a protective layer, and has a thickness of 0.3 mm. The grid-like conductor layer 21 is formed with copper foil (i.e., an electric conductor) of 12 μm thickness. The polycarbonate substrate 22 constitutes the first dielectric layer, and has a thickness of 2.5 mm. The high resistance layer 23 is composed of a PET sheet of 50 μm thickness containing ITO (indium tin oxide), and has a surface resistance value (sheet resistance value) of 1 kΩ/□. The polycarbonate substrate 24 constitutes a second dielectric layer A, and has a thickness of 0.3 mm. The BT substrate 25 constitutes a second dielectric layer B, and has a thickness of 0.3 mm. With respect to the pattern layer 26, multiple loop patterns of differing shape formed by copper foil of 12 μm thickness are cyclically disposed.

Here, the copper foil of the grid-like conductor layer 21 has a grid form with a line width of 50 μm and a line center interval of 1.4 mm, and serves the function of fully reflecting radio waves. It is sufficient if said line center interval is an interval that allows full reflection of radio waves, and it is preferable to set said line center interval at ⅟16 or less of the wavelength of the EM waves that are the object of absorption. Or a conduct layer may be used instead of the grid-like conductor layer 21. In addition, it is preferable that the high-resistance conductor layer 23 have a surface resistivity (sheet resistance value) in a range from 100 Ω/□ to 100 kΩ/□.

Figure 45:
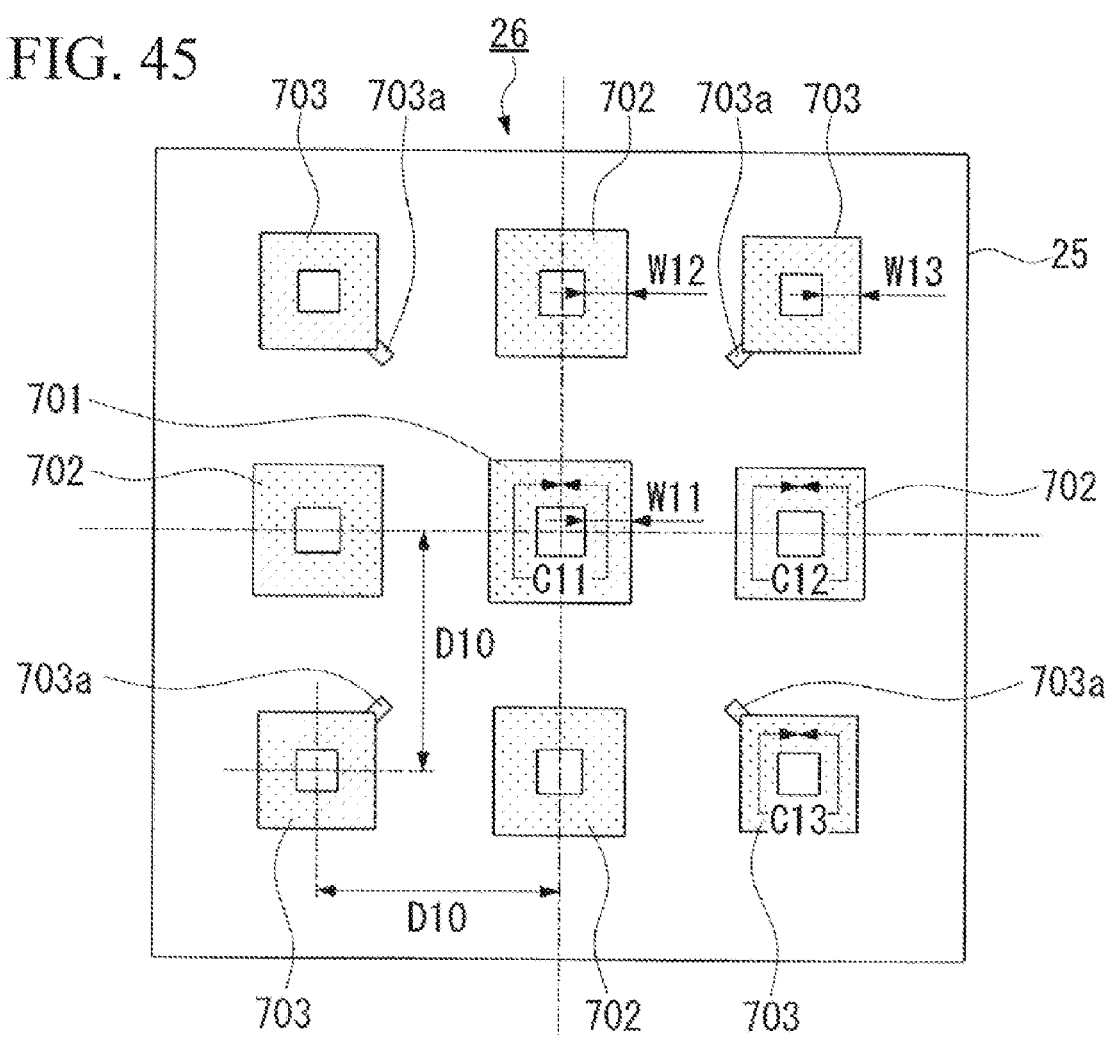
FIG. 45 is a plane view showing details of the pattern layer in a wave absorber which is the same as the above.

FIG. 45 is a plan view of the wave absorber shown in FIG. 44, and is a drawing that shows the detailed configuration of the pattern layer 26. The pattern layer 26 is composed of multiple loop patterns 701, 702, 703 formed on the top face of the BT substrate 25. The respective loop patterns 701, 702, 703 are composed of copper foil with a thickness of 12 μm, and are cyclically (i.e., regularly at mutually fixed intervals) disposed on the top face of the BT substrate 25. As shown in FIG. 45, the loop patterns 701, 702, 703 respectively differ in shape, and are square loops with a center loop lengths C11, C12, C13 and line widths W11, W12, W13. The mated center points of adjacent loop patterns 701, 702, 703 are disposed at positions separated to the extent of the center interval D10.

Furthermore, as shown in FIG. 45, the loop patterns 703 are configured with affixation of projecting linear patterns (open stubs) 703a to the loop-shaped lines. These open stubs 703a are affixed to the apex of one part of the square loop. Each open stub 703a is a rectangle with a line width of 2.0 mm and a length of 2.4 mm, and the lengthwise direction of its rectangle is at a 45-degree angle relative to one side of the square loop. The dimensions of the respective parts of the loop patterns 701, 702, 703 are shown in Table 2.

Figure 46:
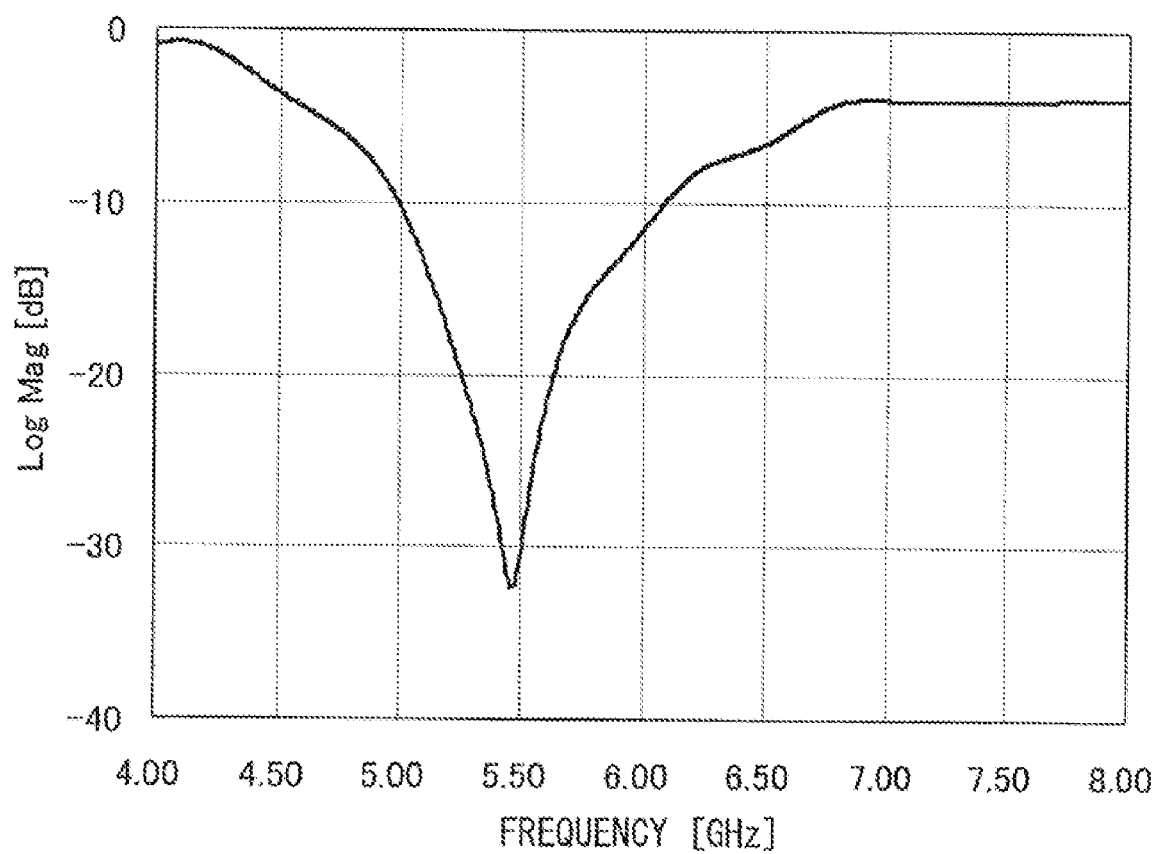
FIG. 46 is a figure showing the absorption properties in a wave absorber which is the same as the above.

With respect to the manufacturing method of the wave absorber of the present implementing example and the method of measuring its properties, the same technique as that of the first implementing example was used. The results of this measurement of reflection attenuation amounts are shown in FIG. 46. From FIG. 46, it is clear that the wave absorber of the present implementing example obtains an attenuation amount of 32 dB as its maximum attenuation amount. Moreover, it is clear that the wave absorber of the present implementing example exhibits wide-band attenuation properties, having an effective absorption band of 380 MHz in the case where the effective absorption band is defined as a frequency bandwidth having attenuation properties of 20 dB or more. From a comparison of this second implementing example with the first implementing example, it is clear that the optimal thickness values of the dielectric layers change due to the different forms of the patterns, and that wide-band attenuation properties are obtained by using forms such that each pattern differs in either or both of size and form relative to another adjacent pattern.

REFERENCE EXAMPLE 6

Next, a reference example is described with reference to FIG. 47 and FIG. 48 in order to demonstrate the effects of the high-resistance conductor layer of the wave absorber of the present invention.

Figure 47:
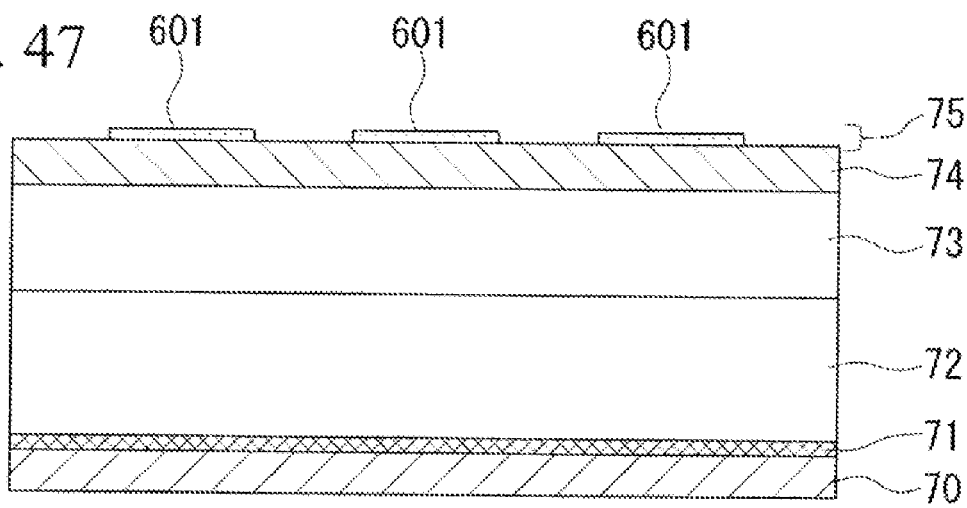
FIG. 47 is a sectional view showing of a wave absorber which is an eleventh reference example.

FIG. 47 is a sectional view showing the schematic configuration of a wave absorber, which is an eleventh reference example of the present invention. The wave absorber of this reference example 11 has a structure where only the high-resistance conductor layer 13 (an ITO/PET sheet of 500 Ω/□) is removed from the structure of implementing example 1 shown in FIG. 41.

Specifically, the wave absorber of reference example 11 is configured by sequential lamination atop a BT substrate 70 of a grid-like conductor layer 71, a laminate of a polycarbonate substrate 72, polycarbonate substrate 73 and BT substrate 74, and a pattern layer 75. The BT substrate 70 has a thickness of 0.3 mm. The grid-like conductor layer 71 is formed with copper foil (i.e., an electric conductor) of 12 µm thickness. The polycarbonate substrate 72 constitutes a first dielectric layer A, and has a thickness of 1.0 mm. The polycarbonate substrate 73 constitutes a first dielectric layer B, and has a thickness of 0.8 mm. The BT substrate 74 constitutes a first dielectric layer C, and has a thickness of 0.3 mm. With respect to the pattern layer 75, multiple loop patterns of differing shape formed by copper foil of 12 µm thickness are cyclically disposed. The pattern layer 75 has the same structure as the pattern layer 16 of implementing example 1. With respect to the manufacturing method of the wave absorber of this reference example 11 and the method of measuring its properties, the same technique as that of the first implementing example was used.

Figure 48:
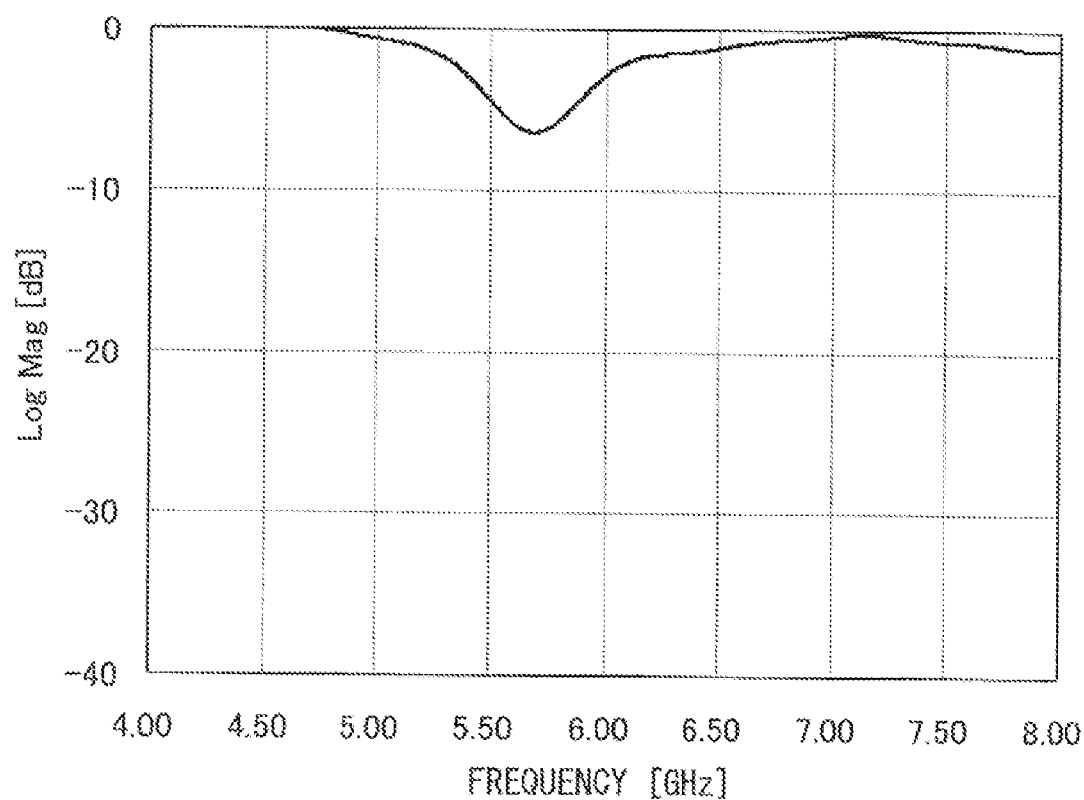
FIG. 48 is a figure showing the absorption properties in a wave absorber which is the same as the above.

The results of this measurement of reflection attenuation amounts are shown in FIG. 48. As shown in FIG. 48, it is clear that the wave absorber of this reference example only obtains an attenuation amount of approximately 7 dB as its maximum attenuation amount.

REFERENCE EXAMPLE 7

Next, a reference example is described with reference to FIG. 49 and FIG. 50 in order to demonstrate the effects of the high-resistance conductor layer of the wave absorber of the present invention.

Figure 49:
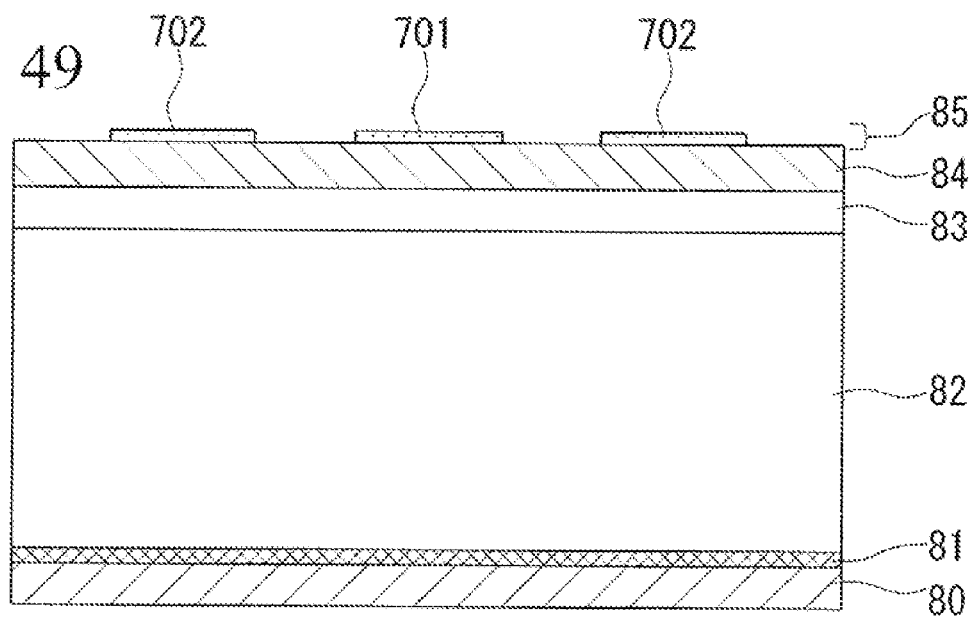
FIG. 49 is a sectional view showing of a wave absorber which is a twelfth reference example.

FIG. 49 is a sectional view showing the schematic configuration of a wave absorber, which is a twelfth reference example of the present invention. The wave absorber of this reference example 12 has a structure where only the high-resistance conductor layer 23 (an ITO/PET sheet of 1 kΩ/□) is removed from the structure of implementing example 2 shown in FIG. 44.

Specifically, the wave absorber of reference example 12 is configured by sequential lamination atop a BT substrate 80 of a grid-like conductor layer 81, a laminate of a polycarbonate substrate 82, polycarbonate substrate 83 and BT substrate 84, and a pattern layer 85. The BT substrate 80 has a thickness of 0.3 mm. The grid-like conductor layer 81 is formed with copper foil (i.e., an electric conductor) of 12 µm thickness. The polycarbonate substrate 82 constitutes a first dielectric layer A, and has a thickness of 2.5 mm. The polycarbonate substrate 83 constitutes a first dielectric layer B, and has a thickness of 0.3 mm. The BT substrate 84 constitutes a first dielectric layer C, and has a thickness of 0.3 mm. With respect to the pattern layer 85, multiple loop patterns of differing shape formed by copper foil of 12 µm thickness are cyclically disposed. The pattern layer 85 has the same structure as the pattern layer 26 of implementing example 2. With respect to the manufacturing method of the wave absorber of this reference example 12 and the method of measuring its properties, the same technique as that of the first implementing example was used.

Figure 50:
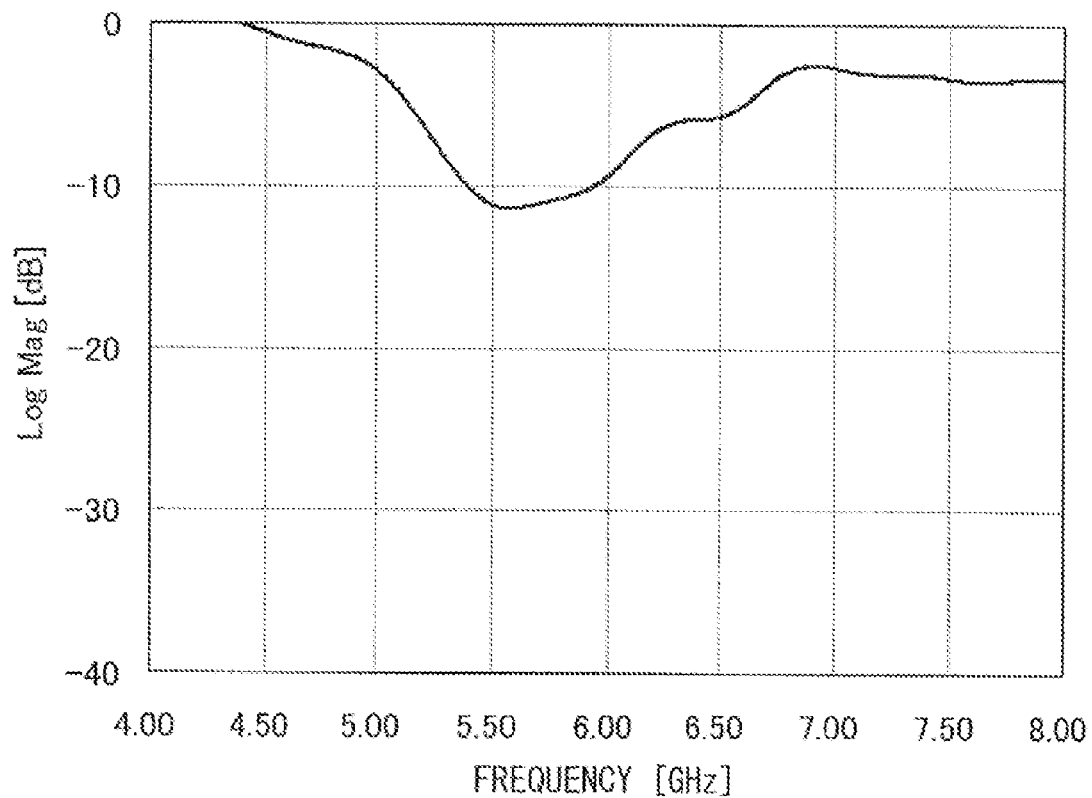
FIG. 50 is a figure showing the absorption properties in a wave absorber which is the same as the above.

The results of this measurement of reflection attenuation amounts are shown in FIG. 50. As shown in FIG. 50, it is clear that the wave absorber of this reference example 12 only obtains an attenuation amount of approximately 11 dB as its maximum attenuation amount.

From the foregoing, as a result of providing the high-resistance conductor layers 13 and 23 as an intermediate layer, it is clear that the wave absorbers of implementing examples 1 and 2 of the present invention exhibit better attenuation properties than the wave absorber of reference examples 11 and 12 which do not provide a high-resistance conductor layer. Accordingly, by conforming the center frequency to 5.8 GHz, the wave absorbers of implementing examples 1 and 2 of the present invention are able to exhibit adequate performance as wave absorbers for use in ETC systems and the like.

TABLE 4

| | Length of each part | | | | | | |
|---|---|---|---|---|---|---|---|
| | D10 [mm] | C11 [mm] | C12 [mm] | C13 [mm] | W11 [mm] | W12 [mm] | W13 [mm] |
| Example 1 | 16.4 | 36.0 | — | — | 2.0 | — | — |
| Example 2 | 16.4 | 36.0 | 32.0 | 28.0 | 3.7 | 3.7 | 3.7 |
| Reference example 6 | 16.4 | 36.0 | — | — | 2.0 | — | — |
| Reference example 7 | 16.4 | 36.0 | 32.0 | 28.0 | 3.7 | 3.7 | 3.7 |

While preferred embodiments of the invention have been described and illustrated above, it should be understood that these are exemplary of the invention, and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims. For example, the loop patterns of the pattern layer of the wave absorbers of the foregoing embodiments were square-shaped loop patterns, but loop patterns of other shapes such as circular loop patterns or elliptical loop patterns are also acceptable. In addition, these loop patterns may be closed loops, or they may be open loops with an excised part.

Additionally, in the wave absorbers of the first and second embodiments, it is also acceptable to configure the entirety of said dielectric layers and said protective layer from optically transparent dielectric material, and to configure the conductors used in the high-resistance conductor layer and pattern layer from optically transparent conductive material (such as conductive oxides or conductive organic compounds). Moreover, instead of a grid-like conductor layer, it is also acceptable to use a conduct layer composed of optically transparent material (such as conductive oxides or conductive organic compounds), and to form the patterns of said pattern layer with a grid-like conductor. If this is done, it is possible to configure wave absorbers that are entirely transparent, and to offer wave absorbers and the like that have an attractive appearance.

In addition, in the wave absorber of the eighth embodiment of the present invention, the overall configuration has a structure that is transparent at a distance. Accordingly, with respect to the wave absorber of the present invention, it is possible to configure a wave absorber that is entirely transparent, and to avoid having it become an object of optical blockage.

Additionally, in the wave absorbers of the foregoing embodiments and implementing examples, said high-resistance conductor layer may also be composed of conductive material containing carbon powder. By using such material, it is possible to offer a low-cost wave absorber.

INDUSTRIAL APPLICABILITY

In the foregoing embodiments, the wave absorber of the present invention was described with respect to the case of application to ETC systems, but the present invention is not limited thereto. That is, the frequency and band of the EM waves that are the object of absorption may be changed by adjusting the form, size and arrangement of the loop patterns, or by adjusting the thickness, surface resistance value, constituent material and the like of the respective layers.

What is claimed is:

1. A wave absorber comprising a structure which sequentially laminates a conduct layer which is composed of an electric conductor and reflects EM waves, a first dielectric layer composed of dielectric material in one layer or multiple layers, a high-resistance conductor layer which has a surface resistivity within a prescribed range and converts EM waves to heat, a second dielectric layer composed of dielectric material in one layer or multiple layers, and a pattern layer having multiple patterns composed of an electric conductor; wherein
   each pattern in said pattern layer differs in either or both of size and form relative to another adjacent pattern,
   the conduct layer reflects EM waves passed through the pattern layer, the second dielectric layer, the high-resistance conductor layer and the first dielectric layer, a resistivity of the high-resistance conductor layer is larger than a resistivity of the conduct layer, and
   a surface resistivity of the high-resistance conductor layer is in a range from 100 $\Omega/\square$ to 100 k$\Omega/\square$.

2. The wave absorber according to claim 1, wherein the patterns in said pattern layer comprise loop patterns given a loop form; said loop patterns comprise conductors with a shape having a line width value that is 5 percent to 25 percent relative to the center line length which is the length of the center line of the pertinent loop pattern; the center line lengths of said loop patterns are lengths that are from 60 percent to 140 percent of the wavelength of the EM waves that are the object of absorption; and any one loop pattern in said pattern layer and another loop pattern adjacent to the pertinent loop pattern differ in said center line lengths.

3. The wave absorber according to claim 1, wherein the center line lengths of said loop patterns are lengths that are from 60 percent to 140 percent of the wavelength of the EM waves that are the object of absorption; and any one loop pattern in said pattern layer and another loop pattern adjacent to the pertinent loop pattern differ in form.

4. The wave absorber according to claim 1, wherein at least one of said loop patterns in said pattern layer has a form where a projecting form is provided on a portion of the lines in loop form.

5. The wave absorber according to claim 1, wherein the loop patterns in said pattern layer are such that an aggregate of multiple loop patterns of differing form or size constitutes one unit, and the space between the pertinent units is disposed at a prescribed interval.

6. The wave absorber according to claim 1, comprising a configuration where a protective layer is laminated onto at least one of the surface sides of said conduct layer and pattern layer.

7. The wave absorber according to claim 1, wherein the ratio of the thicknesses of said first dielectric layer and second dielectric layer is in a range from 0.1 to 10.

8. The wave absorber according to claim 1, wherein said conduct layer is a low-resistance conductor layer with a surface resistivity of 10 $\Omega/\square$ or less.

9. The wave absorber according to claim 1, wherein said conduct layer is a grid-like conductor layer configured from a grid-like pattern.

10. The wave absorber according to claim 9, wherein said grid-like conductor layer has a line width of 100 μm or less, and a line center interval that is $\frac{1}{16}$ or less of the wavelength of the EM waves that are the object of absorption.

11. The wave absorber according to claim 1, wherein the conductors used in said conduct layer, high-resistance conductor layer and pattern layer are composed of optically transparent conductive material, and said first and second dielectric layer and protective layer are composed of optically transparent dielectric material.

12. The wave absorber according to claim 1, wherein at least one layer among said high-resistance conductor layer, first dielectric layer and second dielectric layer is composed of dielectric material containing conductive oxide.

13. The wave absorber according to claim 12, wherein said conductive oxide is dielectric material containing ATO (antimony tin oxide).

14. The wave absorber according to claim 1, wherein at least one layer among said high-resistance conductor layer, first dielectric layer and second dielectric layer is composed of dielectric material containing conductive carbon powder.

15. The wave absorber according to claim 14, wherein at least one layer among said high-resistance conductor layer, first dielectric layer and second dielectric layer is composed of dielectric foam material containing conductive carbon powder.

16. The wave absorber according to claim 14, wherein only said high-resistance conductor layer is composed of dielectric material containing conductive carbon powder.

17. The wave absorber according to claim 14, wherein at least one layer among said high-resistance conductor layer, first dielectric layer and second dielectric layer is composed of dielectric material containing conductive carbon powder where carbon powder content differs among the pertinent high-resistance conductor layer, first dielectric layer and second dielectric layer.

18. The wave absorber according to claim 1, wherein the conduct layer and the high-resistance conductor layer are made of different materials from each other.

19. A wave absorber comprising at least a conduct layer which is composed of a conductor and reflects EM waves, a first dielectric layer composed of dielectric material in one layer or multiple layers, a linear pattern resistance layer which converts EM waves to heat and has linear patterns composed of a high-resistance conductor which is a conductor having a higher resistivity than said conduct layer, a second dielectric layer composed of dielectric material in one layer or multiple layers, and a pattern layer having multiple patterns composed of a conductor, wherein the conduct layer reflects EM waves passed through the pattern layer, the second dielectric layer, the linear pattern resistance layer and the first dielectric layer, a resistivity of the linear pattern resistance layer is larger than a resistivity of the conduct layer, and the high-resistance conductor of the linear pattern resistance layer has a volume resistivity of 1.0 E-4 Ωcm or more and 1.0 E-1 Ωcm or less.

20. The wave absorber according to claim 19, wherein said conduct layer, said first dielectric layer, said linear pattern resistance layer, said second dielectric layer, and said pattern layer are laminated in the pertinent order.

21. The wave absorber according to claim 19, wherein said conduct layer, said first dielectric layer, said pattern layer, said second dielectric layer, and said linear pattern resistance layer are laminated in the pertinent order.

22. The wave absorber according to claim 19, wherein the conduct layer and the linear pattern resistance layer are made of different materials from each other.

23. A wave absorber comprising a structure where at least a grid-like conductor layer which is formed into a grid by patterns composed of a conductor and reflects EM waves, a first dielectric layer composed of dielectric material in one layer or multiple layers, a linear pattern resistance layer which converts EM waves to heat and has linear patterns composed of a high-resistance conductor which is a conductor with a higher resistivity than the conductor that forms said grid-like conductor layer, a second dielectric layer composed of dielectric material in one layer or multiple layers, and a pattern layer having multiple patterns composed of a conductor are laminated in the pertinent order, wherein the grid-like conductor layer reflects EM waves passed through the pattern layer, the second dielectric layer, the linear pattern resistance layer and the first dielectric layer, a resistivity of the linear pattern resistance layer is larger than a resistivity of the grid-like conductor layer, and the high-resistance conductor of the linear pattern resistance layer has a volume resistivity of 1.0 E-4 Ωcm or more and 1.0 E-1 Ωcm or less.

24. The wave absorber according to claim 19 or 23, wherein said linear pattern resistance layer is configured either by having linear patterns composed of a high-resistance conductor intersect, or by forming said linear patterns into a hexagonal honeycomb shape.

25. The wave absorber according to claim 19 or 23, wherein at least one among said conduct layer, pattern layer, linear pattern resistance layer and grid-like conductor layer has multiple linear patterns, where the line center interval which is the center interval of said linear patterns that are adjacent is ¹/₁₆ or less of the wavelength of the EM waves that are the object of absorption.

26. The wave absorber according to claim 25, wherein the line width which is the width of said linear pattern resistance layer is 100 μm or less.

27. The wave absorber according to claim 19 or 23, wherein each pattern of said pattern layer differs in at least one or the other of size and form relative to another adjacent pattern.

28. The wave absorber according to claim 19 or 23, wherein each pattern of said pattern layer is configured to have at least one or the other of a form that is any one of circular, rectangular, polygonal or a loop form having these forms as its external form, and a form that adds a projecting form to the pertinent one of these forms.

29. The wave absorber according to claim 19 or 23, which has a protective layer laminated onto at least one or the other of the front face and rear face of the laminate structure.

30. The wave absorber according to claim 19 or 23, wherein all of said component layers are made transparent or semi-transparent.

31. The wave absorber according to claim 23, wherein the grid-like conductor layer and the linear pattern resistance layer are made of different materials from each other.

32. A wave absorber manufacturing method comprising a process of laminating a radio wave reflection layer composed of a conductor that reflects EM waves, a first dielectric layer composed of dielectric material in one layer or multiple layers, a linear pattern resistance layer which converts EM waves to heat and has linear patterns composed of a high resistance conductor which is a conductor with a higher resistivity than said radio wave reflection layer, a second dielectric layer composed of dielectric material in one layer or multiple layers, and a pattern layer having multiple patterns composed of a conductor wherein the radio wave reflection layer reflects EM waves passed through the pattern layer, the second dielectric layer, the linear pattern resistance layer and the first dielectric layer, and the high-resistance conductor of the linear pattern resistance layer has a volume resistivity of 1.0 E-4 Ωcm or more and 1.0 E-1 Ωcm or less, and a process of forming the linear patterns of said linear pattern resistance layer using the screen printing method.

33. The wave absorber manufacturing method according to claim 32, wherein the radio wave reflection layer and the linear pattern resistance layer are made of different materials from each other.

34. A wave absorber manufacturing method comprising a process of laminating a radio wave reflection layer composed of a conductor that reflects EM waves, a first dielectric layer composed of dielectric material in one layer or multiple layers, a linear pattern resistance layer which converts EM waves to heat and has linear patterns composed of a high-resistance conductor which is a conductor with a higher resistivity than said radio wave reflection layer, a second dielectric layer composed of dielectric material in one layer or multiple layers, and a pattern layer having multiple patterns composed of a conductor wherein the radio wave reflection layer reflects EM waves passed through the pattern layer, the second dielectric layer, the linear pattern resistance layer and the first dielectric layer, and the high-resistance conductor of the linear pattern resistance layer has a volume resistivity of 1.0 E-4 Ωcm or more and 1.0 E-1 Ωcm or less, and a process of forming the linear patterns of said linear pattern resistance layer using the ink jet method.

35. The wave absorber manufacturing method according to claim 34, wherein the radio wave reflection layer and the linear pattern resistance layer are made of different materials from each other.

36. A wave absorber comprising at least: a conduct layer which is composed of a conductor and reflects EM waves, a first dielectric layer composed of dielectric material in one layer or multiple layers, a planar resistance layer which is composed of dielectric material containing conductive powder and converts EM waves to heat, a second dielectric layer composed of dielectric material in one layer or multiple layers, and a pattern layer having multiple patterns composed of a conductor, wherein the conduct layer reflects EM waves passed through the pattern layer, the second dielectric layer, the planar resistance layer and the first dielectric layer, a resistivity of the planar resistance layer is larger than a resistivity of the conduct layer, and a surface resistivity of the planar resistance layer is in a range from 100 Ω/☐ to 100 kΩ/☐.

37. The wave absorber according to claim 36, wherein said conduct layer, said first dielectric layer, said planar resistance layer, said second dielectric layer, and said pattern layer are laminated in the pertinent order.

38. The wave absorber according to claim 36, wherein said planar resistance layer is composed of material where glass cloth is impregnated with epoxy resin in which conductive powder such as carbon, silver, nickel or the like has been dispersed.

39. The wave absorber according to claim 36, wherein each pattern of said pattern layer differs at least in one or the other of size and form relative to another adjacent pattern.

40. The wave absorber according to claim 36, wherein each pattern of said pattern layer is configured to have at least one or the other of a form that is any one of circular, rectangular, polygonal or a loop form having these forms as its external form, and a form that adds a projecting form to the pertinent one of these forms.

41. The wave absorber according to claim 36, which has a protective layer laminated onto at least one or the other of the front face and rear face of the laminate structure.

42. A wave absorber manufacturing method comprising a process of laminating a conduct layer which is composed of a conductor and reflects EM waves, a first dielectric layer composed of dielectric material in one layer or multiple layers, a planar resistance layer which is composed of dielectric material containing conductive powder and converts EM waves to heat, a second dielectric layer composed of dielectric material in one layer or multiple layers, and a pattern layer having multiple patterns composed of a conductor, wherein the conduct layer reflects EM waves passed through the pattern layer, the second dielectric layer, the planar resistance layer and the first dielectric layer, a resistivity of the planar resistance layer is larger than a resistivity of the conduct layer; and a surface resistivity of the planar resistance layer is in a range from 100 Ω/☐ to 100 kΩ/☐, and a process of forming a prepreg wherein, with respect to said planar resistance layer, said first dielectric layer and said second dielectric layer are bonded with interposition of the pertinent planar resistance layer.

43. The wave absorber manufacturing method according to claim 42, wherein said planar resistance layer is formed by using at least a process where glass cloth is impregnated with epoxy resin in which conductive powder such as carbon, silver and nickel has been dispersed.

44. A wave absorber comprising a structure wherein there is sequential lamination of at least a conduct layer which is composed of an electric conductor and reflects EM waves, a first dielectric layer composed of dielectric material in one layer or multiple layers, a high-resistance conductor layer which has a surface resistivity within a prescribed range and converts EM waves to heat, a second dielectric layer composed of dielectric material in one layer or multiple layers, and a pattern layer having multiple patterns composed of an electric conductor, and comprising a configuration wherein a protective layer which may be interposed as necessary is laminated onto at least one surface side of said conduct layer and pattern layer wherein the conduct layer reflects EM waves passed through the pattern layer, the second dielectric layer, the high-resistance conductor layer and the first dielectric layer, a resistivity of the high-resistance conductor layer is larger than a resistivity of the conduct layer, and a surface resistivity of the high-resistance conductor layer is in a range from 100 Ω/☐ to 100 kΩ/☐.

45. A wave absorber comprising a structure wherein there is sequential lamination of a conduct layer which is composed of an electric conductor and reflects EM waves, a first dielectric layer composed of dielectric material in one layer or multiple layers, a high-resistance conductor layer which has a surface resistivity within a prescribed range and converts EM waves to heat, a second dielectric layer composed of dielectric material in one layer or multiple layers, and a pattern layer having multiple patterns composed of an electric conductor, and comprising a configuration wherein a protective layer which may be interposed as necessary is laminated onto at least one surface side of said conduct layer and pattern layer, wherein each pattern of said pattern layer differs in either or both of size and shape relative to another adjacent pattern, and the conduct layer reflects EM waves passed through the pattern layer, the second dielectric layer, the high-resistance conductor layer and the first dielectric layer, a resistivity of high-resistence conductor layer is larger than a resistivity of the conduct layer, and a surface resistivity of the high-resistance conductor layer is in a range from 100 Ω/☐ to 100 kΩ/☐.

46. The wave absorber according to claim 44 or 45, wherein said high-resistance conductor layer is composed of conductive oxide material.

47. The wave absorber according to claim 46, wherein said high resistance conductor layer is composed of ITO (indium tin oxide), which is a conductive oxide material.

48. The wave absorber according to claim 44 or 45, wherein said high resistance conductor layer is composed of carbon material having conductivity.

* * * * *